(12) United States Patent
    Wang et al.

(10) Patent No.: US 9,209,117 B2
(45) Date of Patent: **\*Dec. 8, 2015**

(54) NO-EXPOSED-PAD QUAD FLAT NO-LEAD (QFN) PACKAGING STRUCTURE AND METHOD FOR MANUFACTURING THE SAME

(71) Applicant: Jiangsu Changjiang Electronics Technology Co., Ltd., Wuxi (CN)

(72) Inventors: Xinchao Wang, Wuxi (CN); Zhizhong Liang, Wuxi (CN)

(73) Assignee: Jiangsu Changjiang Electronics Technology Co., Ltd., Wuxi (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/288,415

(22) Filed: May 28, 2014

(65) Prior Publication Data

US 2014/0264795 A1    Sep. 18, 2014

Related U.S. Application Data

(63) Continuation-in-part of application No. PCT/CN2012/000021, filed on Jan. 6, 2012.

(30) Foreign Application Priority Data

Nov. 28, 2011    (CN) .......................... 2011 1 0383889

(51) Int. Cl.
    *H01L 21/00*    (2006.01)
    *H01L 23/495*    (2006.01)
    (Continued)

(52) U.S. Cl.
    CPC ........ *H01L 23/4952* (2013.01); *H01L 21/4832* (2013.01); *H01L 23/49513* (2013.01); *H01L 23/49541* (2013.01); *H01L 23/49575* (2013.01); *H01L 23/49582* (2013.01); *H01L 23/49589* (2013.01); *H01L 24/96* (2013.01); *H01L 24/97* (2013.01); *H01L 21/561* (2013.01); *H01L 23/3107* (2013.01); *H01L 24/29* (2013.01); *H01L 24/32* (2013.01); *H01L 24/48* (2013.01); *H01L 24/49* (2013.01); *H01L 24/73* (2013.01); *H01L 2224/2919* (2013.01); *H01L 2224/32245* (2013.01); *H01L 2224/451* (2013.01);
    (Continued)

(58) Field of Classification Search
    CPC ................... H01L 23/49582; H01L 23/49589; H01L 23/49541; H01L 23/49513; H01L 23/4952; H01L 21/4832; H01L 24/97; H01L 24/96; H01L 24/48; H01L 24/49
    See application file for complete search history.

(56) References Cited

U.S. PATENT DOCUMENTS

2004/0195664 A1\* 10/2004 Chiu .............................. 257/676
2005/0200007 A1\* 9/2005 Liu ................................ 257/724
(Continued)

*Primary Examiner* — Khiem D Nguyen
(74) *Attorney, Agent, or Firm* — Matthias Scholl, PC; Matthias Scholl

(57) ABSTRACT

A quad flat no-lead (QFN) packaging structure. The QFN packaging structure includes a metal substrate, a first die coupled to a top surface of the metal substrate, and a plurality of I/O pads formed on the metal substrate, and extending to the proximity of the die. The no-exposed-pad QFN packaging structure also includes a first metal layer containing a plurality of inner leads corresponding to the plurality of I/O pads and extending to proximity of the die and is formed on the metal substrate by a multi-layer electrical plating process. Further, the no-exposed-pad QFN packaging structure includes metal wires connecting the die and the plurality of inner leads, and a second metal layer formed on a back surface of the plurality of I/O pads.

16 Claims, 36 Drawing Sheets

(51) Int. Cl.
  H01L 21/48   (2006.01)
  H01L 23/00   (2006.01)
  H01L 23/31      (2006.01)
  H01L 21/56      (2006.01)

(52) U.S. Cl.
  CPC .......... *H01L2224/48091* (2013.01); *H01L 2224/48137* (2013.01); *H01L 2224/48163* (2013.01); *H01L 2224/48247* (2013.01); *H01L 2224/49171* (2013.01); *H01L 2224/73265* (2013.01); *H01L 2224/85444* (2013.01); *H01L 2224/92247* (2013.01); *H01L 2224/97* (2013.01); *H01L 2924/00014* (2013.01); *H01L 2924/01322* (2013.01); *H01L 2924/07802* (2013.01); *H01L 2924/19105* (2013.01); *H01L 2924/30107* (2013.01)

(56) References Cited

U.S. PATENT DOCUMENTS

2010/0052146 A1\* 3/2010 Jiang et al. .......... 257/690
2010/0258921 A1\* 10/2010 Chang Chien et al. ....... 257/676

\* cited by examiner

NO-EXPOSED-PAD QUAD FLAT NO-LEAD (QFN) PACKAGING STRUCTURE AND METHOD FOR MANUFACTURING THE SAME

CROSS-REFERENCES TO RELATED APPLICATIONS

This application is a continuation-in-part of International Patent Application No. PCT/CN2012/000021 with an international filing date of Jan. 6, 2012, designating the United States, now pending, and further claims priority benefits to Chinese Patent Application No. 201110383889.2 filed Nov. 28, 2011. The contents of all of the aforementioned applications, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 14781 Memorial Drive, Suite 1319, Houston, Tex. 77079.

BACKGROUND OF THE INVENTION

1. Field of the Invention

The present invention relates to the field of semiconductor assembly or packaging, and more particularly to a quad flat no-lead (QFN) packaging structure and method for manufacturing the same.

2. Description of the Related Art

Conventionally, two types of lead frame structures are used in semiconductor packaging processes. For the first type, as shown in FIG. 48, after performing chemical etching and electrical plating (or simply plating) on the metal substrate, a layer of high-temperature resistant film is affixed on the back surface of the metal substrate to form the lead frame carrier to be used in the packaging process.

For the second type, as shown in FIG. 50, chemical half etching is first performed on the back surface of the metal substrate, and the chemically half etched areas are sealed with encapsulation material. Further, chemical half etching for inner leads is performed on the top surface of the metal substrate and followed by plating on the surface of inner leads of the lead frame so as to complete the lead frame.

However, both of these two types of lead frames have certain disadvantages in the packaging process. For example, for the first type, the disadvantages include:

1) Because an expensive high-temperature film must be affixed on the back surface of the metal substrate, the manufacturing cost is directly increased;

2) In the die attaching process of the packaging process, also because a high-temperature resistant film must be affixed on the back surface of the metal substrate, only epoxy is used in the die attaching process, and certain techniques such as the eutectic process or soft solder technique cannot be used, which greatly limits choices of available products;

3) In the wire bonding process of the packaging process, also because a high-temperature resistant film must be affixed on the back surface of the metal substrate and the high-temperature resistant film is a kind of soft material, the wire bonding parameters become unstable, which seriously impacts on the quality of wire bonding and the reliability and stability of the product; and 4) In the molding process, also because a high-temperature resistant film must be affixed on the back surface of the metal substrate, the molding pressure during the molding process causes certain mold bleeding between the lead frame and the high-temperature resistant film, which changes a conductive metal lead into an insulated lead, as shown in FIG. 49 (certain metal leads on the left side of the drawing are insulated by bleeding material).

For the second type conventional lead frame structure, the disadvantages include:

Because the etching process was carried out twice, manufacturing cost is increased;

1) Because the composition of the lead frame is metal material and compound, when operated in a high and low temperature environment, the lead frame is warping due to the different expansion and shrinkage stress of the different materials;

2) The warpage of the lead frame impacts the accuracy of die attaching process and affects the production yield due to the impact on the smooth transferring of the warping lead frames in the die attaching process;

3) The warpage of the lead frame also impacts the alignment accuracy of the wire bonding and also affects the production yield due to the impact on the smooth transferring of the warping lead frames in the wire bonding process; and 4) Because the inner leads on the top surface of the lead frame are formed using etching technique, the width of the inner leads might have to be greater than 100 w and the distance between two adjacent inner leads also must have to be greater than 100 μm. Thus, it is difficult to achieve high density for the inner leads.

SUMMARY OF THE INVENTION

In view of the above-described problems, it is one objective of the invention to provide a quad flat no-lead (QFN) packaging structure. The no-exposed-pad QFN packaging structure comprises a metal substrate, a first die coupled to a top surface of the metal substrate, and a first outer die pad. The QFN packaging structure also comprises a plurality of I/O pads formed on the metal substrate a first metal layer containing a plurality of inner leads corresponding to the plurality of I/O pads and extending to proximity of the die and is formed on the metal substrate by a multi-layer electrical plating process such that a lead pitch of the plurality of inner leads is significantly reduced. Further, the no-exposed-pad QFN packaging structure comprises metal wires connecting the die and the plurality of inner leads, and a second metal layer formed on a back surface of the plurality of I/O pads. The die, the plurality of inner leads, and metal wires are sealed with a molding compound.

It is another objective of the invention to provide a method for manufacturing a no-exposed-pad quad flat no-lead QFN packaging structure. The method comprises providing a metal substrate, forming a first photoresist film on a top surface of the metal substrate, and forming a plating pattern in the first photoresist film using photolithography. The method also comprises forming a first metal layer containing a plurality of inner leads by a multi-layer electrical plating process using the plating pattern in the first photoresist film as a mask, such that a lead pitch of the plurality of inner leads is significantly reduced. Further, the method comprises attaching a die in a predetermined region on the top surface of the metal substrate and connecting the die and the plurality of inner leads using metal wires by a wire bonding process. The method also comprises sealing the die, the plurality of inner leads, and metal wires with a molding compound, and etching the metal substrate from a back surface of the metal substrate to form a plurality of I/O pads corresponding to the plurality of inner leads. In addition, the method comprises forming a second metal layer on a back surface of the plurality of I/O pads.

DETAILED DESCRIPTION OF THE EMBODIMENTS

For further illustrating the invention, experiments detailing a quad flat no-lead (QFN) packaging structure and method for manufacturing the same are described below. It should be noted that the following examples are intended to describe and not to limit the invention.

Figure 16A:
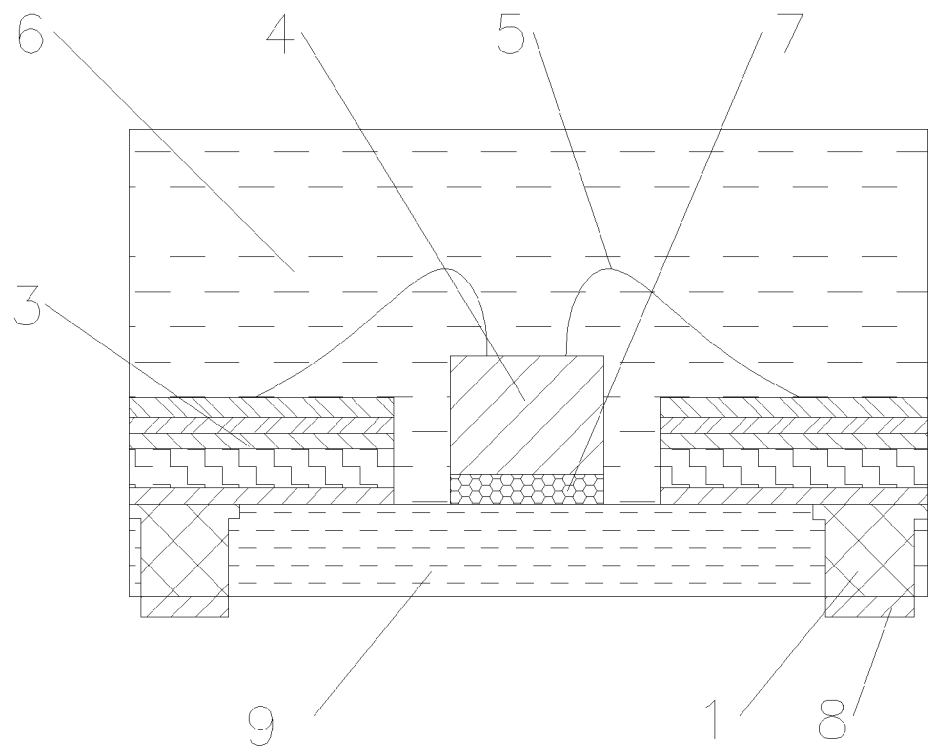
FIGS. 16A-16B illustrate an exemplary no-exposed-pad QFN packaging structure of an embodiment of the invention in accordance with one embodiment of the invention.
Figure 16B:
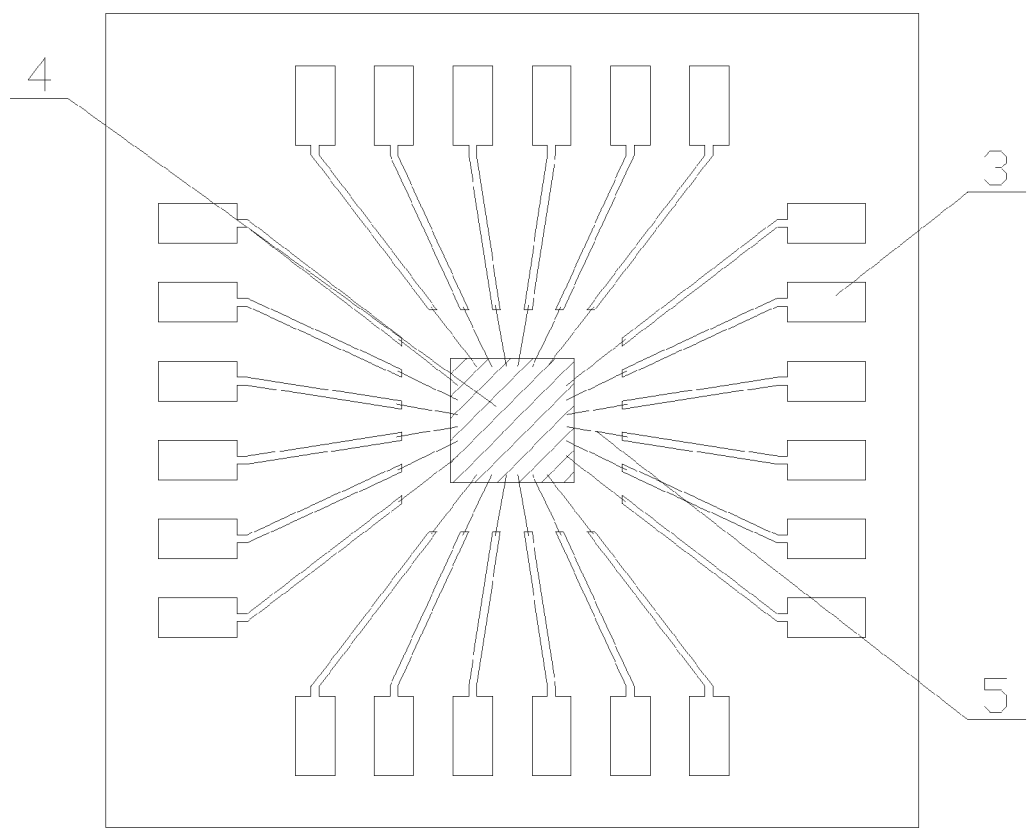

FIG. 16A and FIG. 16B illustrate an exemplary no-exposed-pad quad flat no-lead (QFN) packaging structure of an embodiment of the invention. FIG. 16A is a cross-section view of FIG. 16B. A no-exposed-pad QFN packaging structure, as used herein, may refer to a QFN packaging structure that does not have an outer die pad on the back surface of the QFN packaging structure.

As shown in FIG. 16A and FIG. 16B, the no-exposed-pad QFN packaging structure comprises a plurality of input/output (I/O) pads 1, a plurality of inner leads 3, die 4, metal wire(s) 5, and encapsulation material 6, such as EMC compound. Certain components can be omitted and other components can be added.

The die 4 comprises any pre-made semiconductor chip to be assembled or packaged. Further, I/O pads 1 comprise a plurality of metal pads or traces to provide external connections to the die 4 or any other components inside the no-exposed-pad QFN packaging structure through inner leads 3. The I/O pads 1 can in any appropriate shape, such as a rectangle shape. The plurality of pads of the I/O pads 1 can arranged in an array configuration or any other appropriate configuration. For example, in certain embodiments, as shown in FIG. 16B, the I/O pads 1 are arranged in a single ring configuration.

The die 4 is mounted on the top surface of a substrate or other planar supporting structure through a conductive or non-conductive adhesive material 7, such as epoxy, soft solder, or other conductive or non-conductive material. Further, from the top surface of the I/O pads 1, an electrical plating (or simply plating) process such as multi-plating is used to form inner leads 3. More specifically, multiple layers are formed by plating such that the distance between adjacent inner leads (i.e., inner lead pitch) is substantially reduced. The top surface of the inner leads 3 and the top surface of die 4 is connected by the metal wires 5. Further, the inner leads 3 is formed significantly close to the die 4 via lead traces, such that the length of metal wires 5 connecting the die 4 to the inner leads 3 can also be substantially reduced.

All inner leads 3 is referred as the first metal layer 13. That is, the first metal layer 13 comprises all leads of inner leads 3 or the inner leads 3 are formed as part of the first metal layer 13. The inner leads 3, the die 4, and the metal wires 5 are covered with encapsulation material 6, such as EMC compound. Further, at the backside of the substrate, sealant 9 is filled in the peripheral areas of the I/O pads 1 and in the area between adjacent I/O pads 1. The back surface of the I/O pads 1 are exposed from the sealant 9 and a second metal layer 8 is formed on the back surface of the I/O pads 1. The sealant 9 comprises any appropriate type of sealant, such as a no-filler compound or a small-filler compound.

The process for manufacturing the above described QFN packaging structure is explained below in detail with corresponding drawings 1-15. The process is used to make a plurality of components (packaged ICs). Because each component or packaged IC is made in a same way, only a single packaged IC or QFN packaging structure is described for illustrative purposes.

Figure 1:
FIGS. 1-15 illustrate an exemplary process for manufacturing an exemplary no-exposed-pad QFN packaging structure of an embodiment of the invention in accordance with one embodiment of the invention.

As shown in FIG. 1, at the beginning, a metal substrate 10 is provided for the lead frame manufacturing and packaging process. The metal substrate 10 has a desired thickness and be made from various metal materials depending on particular types of die 4. For example, metal substrate 10 is made from one of copper, aluminum, iron, copper alloy, stainless steel or nickel-iron alloy. Other materials may also be used.

Figure 2:
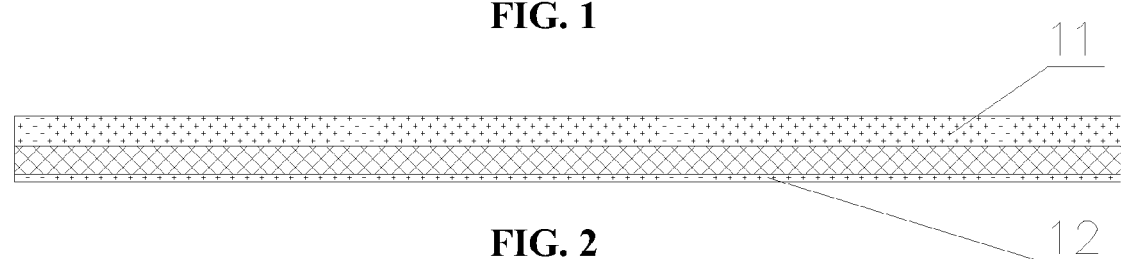

Further, as shown in FIG. 2, a layer of photoresist film 11 and a layer of photoresist film 12 is formed (pasted or coated) on the top surface and the back surface of the metal substrate 10, respectively. The photoresist film 11 and/or photoresist film 12 is formed using various ways. For example, photoresist film 11 and/or photoresist film 12 is coated on the surface or is pasted on the surface. The photoresist films 11 and 12 are used to protect the metal substrate 10 in subsequent plating processes, and the photoresist films 11 or 12 comprise a dry photoresist film or a wet photoresist film. Other types of photoresist films may also be used.

Figure 3:
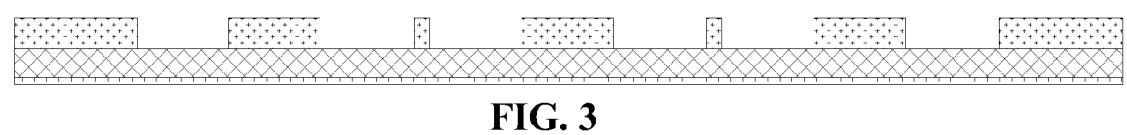

Further, as shown in FIG. 3, portions of the photoresist film 11 on the top surface of the metal substrate 10 is removed to form a pattern by photolithography. As shown in FIG. 3, photolithography equipment is used to perform exposure, development, and etching on the photoresist film 11 using a corresponding mask to form a plating pattern in the photoresist film 11. The plating pattern may expose the predetermined areas of the metal substrate 10 for subsequent plating process to form the first metal layer 13, i.e., a first metal layer pattern.

Figure 4:
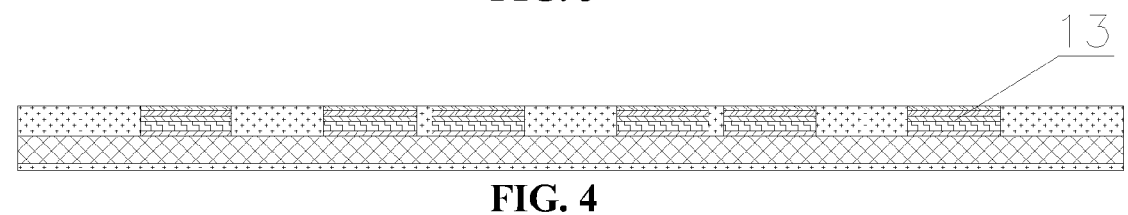

After forming the plating pattern or the first metal layer pattern, as shown in FIG. 4, a multi-layer plating process is performed to form the first metal layer 13 in the areas of the metal substrate 10 exposed by the plating pattern in the photoresist film 11. In other words, the multi-layer plating process is performed on the top surface of the metal substrate 10 using the pattern in the photoresist film 11 as a mask to form inner leads 3 (the first metal layer 13). The inner leads 3 is formed corresponding to the I/O pads 1 and may also be arranged in a corresponding shape (e.g., a rectangle shape) and configuration (e.g., a single ring configuration). Other shapes and configurations may also be used.

Because the inner leads 3 are formed by the plating process, the lead pitch of the inner leads 3 and the distance between the inner leads 3 and the die 4 is substantially reduced. For example, the inner leads 3 is formed by a thin-line plating method on the top surface of the metal substrate 10. The width of the inner leads 3 is approximately 25 µm, and the lead pitch of the inner leads 3 may also be approximately 25 µm. Comparing the lead pitch of about 100 µm in conventional lead frames, the width of the inner leads 3 and the lead pitch of the inner leads 3 are significantly reduced, which achieves a high density for inner leads 3. Further, the inner leads 3 may extend to the proximity of the die 4 via lead traces. Using the plating process, the distance between the die and the inner leads 3 can also be significantly reduced such that the inner leads 3 can extend substantially close to the die 4, which can substantially reduce the package size.

The first metal layer 13 (e.g., the inner leads 3) may comprise any appropriate number of layers of metal materials and/or metal layer structure. For example, the first metal layer 13 may comprise, from bottom to the top, a total of five layers of nickel, copper, nickel, palladium, and gold, respectively, or a total of three layers of nickel, copper, and silver. Other materials and number of layers and/or layer structures may also be used.

Different metal layers in the first metal layer 13 may provide different functionalities. For example, in a five-layer structure (nickel, copper, nickel, palladium, and gold), the bottom layer of nickel is used as an erosion resistant and barrier layer, the middle layers of copper, nickel and palladium is used to increase the thickness of the first metal layer 13, and the top layer of gold is used for wire bonding. Other functionalities may also be provided and other metal layer structures may also be used.

Figure 5:
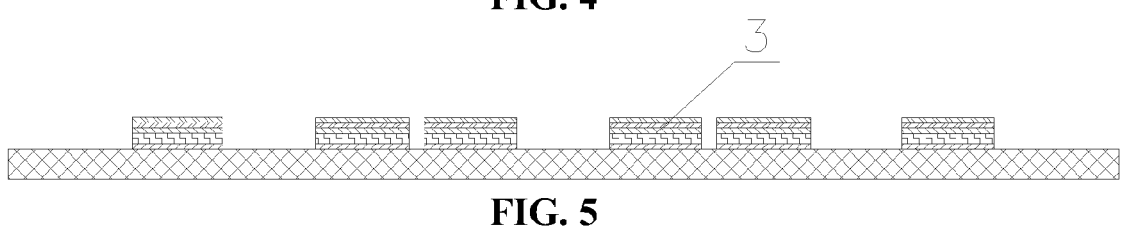

Further, as shown in FIG. 5, the remaining top surface photoresist film 11 is removed and inner leads 3 are formed on the metal substrate 10. The back surface photoresist film 12 is also removed.

Figure 6:
Figure 7:
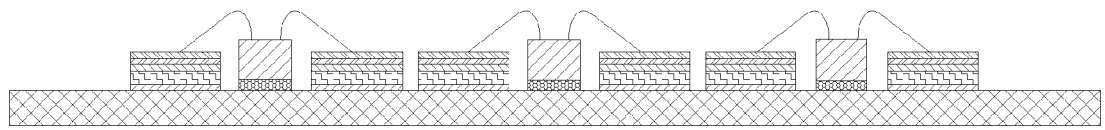

After removing the photoresist films, the die 4 is mounted on a predetermined die area of the metal substrate 10 using the conductive or non-conductive adhesive material 7, as shown in FIG. 6, in a die attaching process. The predetermined die area of the metal substrate 10 may correspond to the area for attaching the die 4. More particularly, the die 4 is mounted or attached to an area among the inner leads 3 or surrounded by the inner leads 3. The top surface of die 4 and the top surface of the inner leads 3 are connected with metal wires 5 in a wire bonding process, as shown in FIG. 7.

Figure 8:
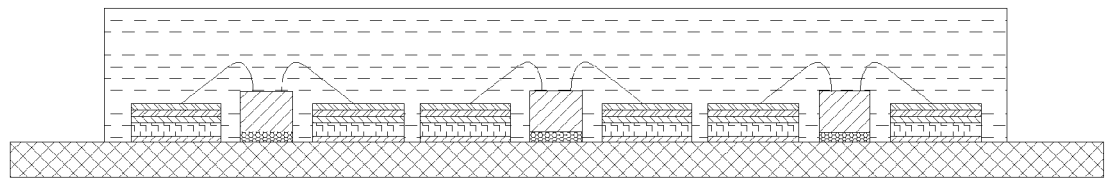

The inner leads 3, the die 4, and the metal wires 5 are then encapsulated using encapsulation material 6, as shown in FIG. 8. For example, molding equipment is used to seal or encapsulate the metal substrate 10 to complete die attaching and wire bonding by a molding compound. Post-molding curing may also be performed such that the molding compound or other encapsulation materials may also be cured before the next manufacturing process.

Figure 9:
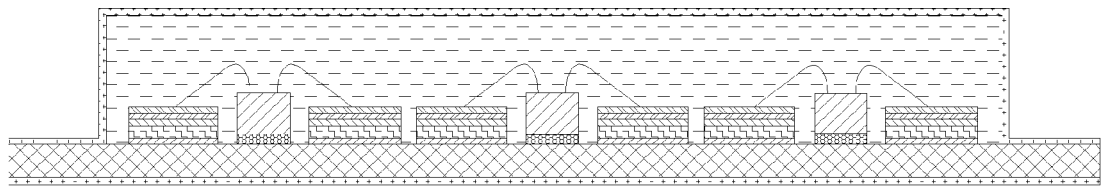

As shown in FIG. 9, after the encapsulation process (e.g., molding and post-molding curing), a layer of photoresist film 12 is formed on the top surface of the metal substrate 10 and another layer of photoresist film 12 is formed on the back surface of the metal substrate 10. The photoresist films are used to protect the metal substrate 10 in subsequent etching processes, and the photoresist films may comprise a dry photoresist film or a wet photoresist film. Other types of photoresist films may also be used.

Figure 10:
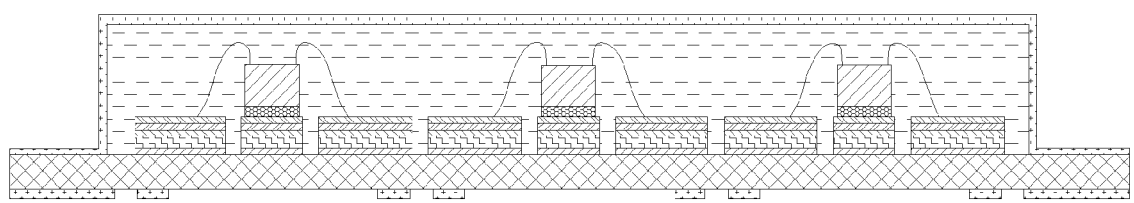

Further, portion of the photoresist film 12 on the back surface of the metal substrate 10 is removed to form a pattern using photolithography. As shown in FIG. 10, photolithography equipment is used to perform exposure, development, and etching on the photoresist film 12 on the back surface of the metal substrate 10 using a corresponding mask to form an etching pattern in the photoresist film 12. The etching pattern may expose the predetermined areas on the back surface of the metal substrate 10 for subsequent etching process to form I/O pads 1, i.e., the I/O pad pattern.

Figure 11:
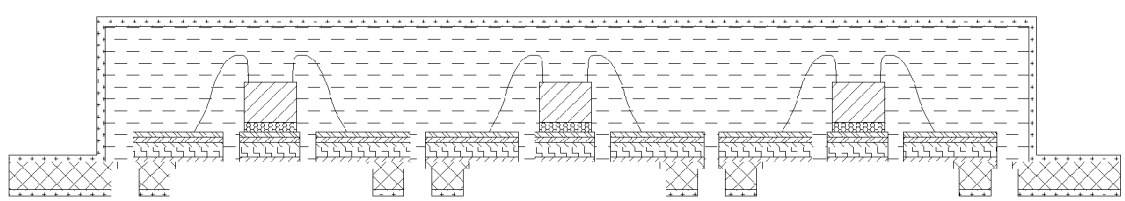

After forming the etching pattern, as shown in FIG. 11, an etching process is performed on the areas of the metal substrate 10 exposed by the etching pattern in the photoresist film 12. In other words, the etching process is performed on the metal substrate 10 using the pattern in the photoresist film 12 as a mask. The etching process is full etching or half etching. Etched areas are thus formed at the back surface of the metal substrate 10, and the I/O pads 1 are also formed after the etching process.

Figure 12:
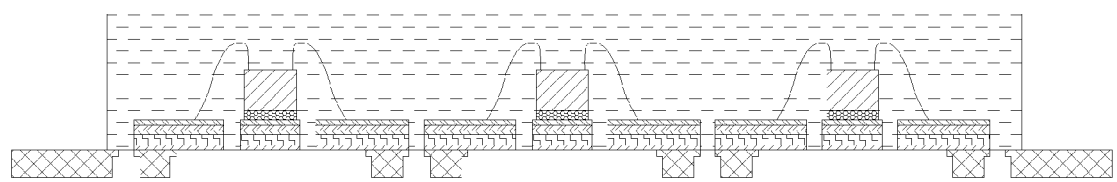

Further, as shown in FIG. 12, after the etching process, the remaining photoresist film 12 on the back surface of the metal substrate 10 is removed to expose the etched areas on the back surface of the metal substrate 10 comprising the peripheral areas of the I/O pads 1 and the areas between leads of the I/O pads 1. The photoresist film 12 on the top surface of the metal substrate 10 is also removed.

Figure 13:
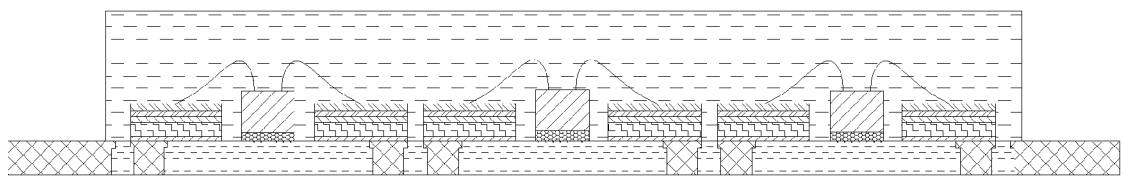

Afterwards, as shown in FIG. 13, the etched areas on the back surface of the metal substrate 10 are filled with sealant 9 using filling equipment. Post-molding curing is performed on the sealant 9. The sealant 9 may include any appropriate sealant, such as a filler sealant or a no-filler sealant, and may also be filled at a certain height. Thus, the I/O pads 1 is supported by both the molding compound 6 and the sealant 9. The sealant 9 comprises any appropriate sealant, such a no-filler compound or a small-filler compound.

Figure 14:
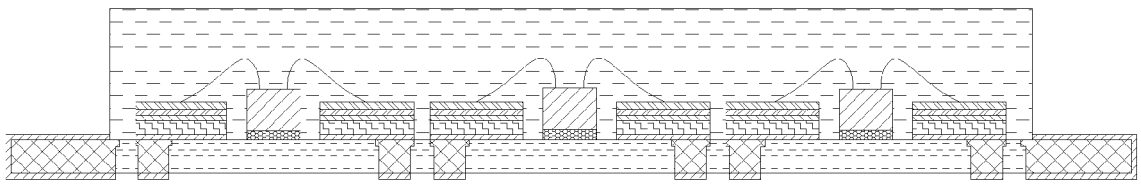

Further, as shown in FIG. 14, a plating process is performed on the back surface of the I/O pads 1 to form a second metal layer 8. The second metal layer 8 is made from various materials, such as gold, nickel, copper, palladium, silver or tin, etc.

Figure 15:
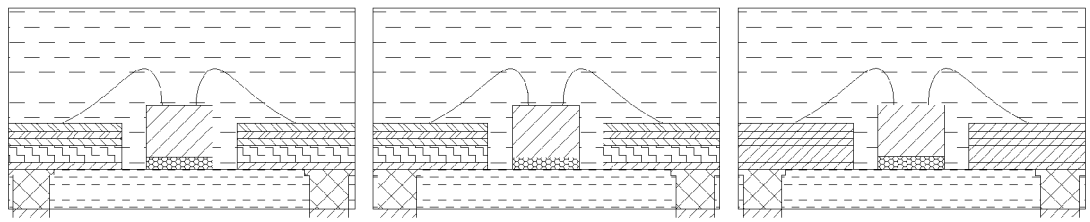

Thus, a no-exposed-pad QFN packaging structure with single lead ring may be formed. Afterwards, as shown in FIG. 15, the plurality of encapsulated components formed on the metal substrate 10 is individually cut to obtain individual packaged ICs or individual no-exposed-pad QFN packaging structures in a package sawing process. Other cutting methods may also be used.

Figure 17A:
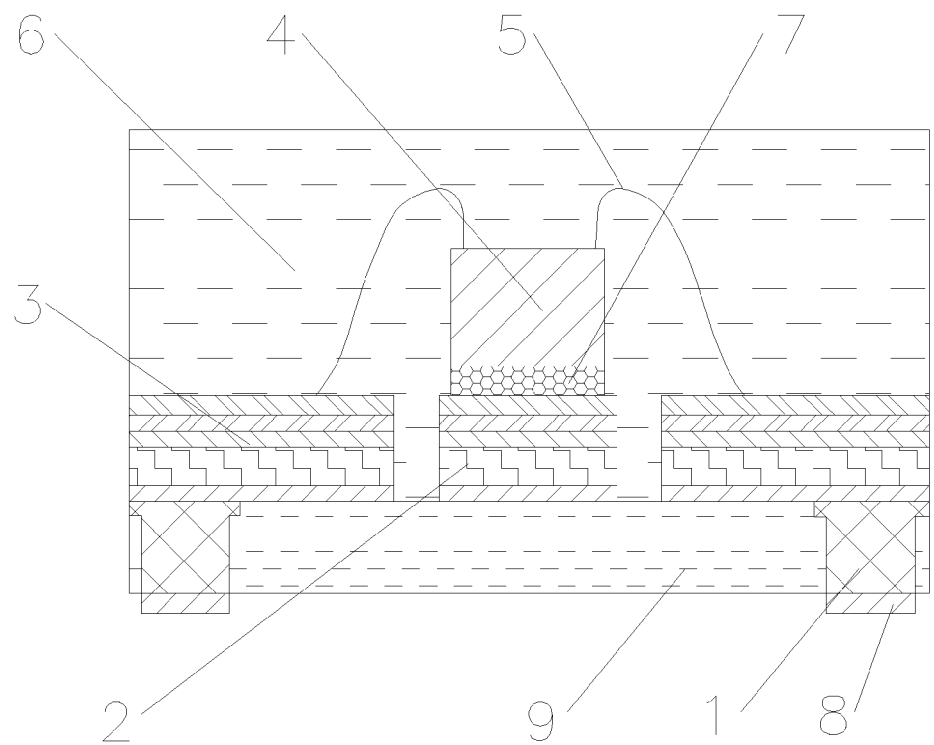
FIGS. 17A-17B illustrate another exemplary no-exposed-pad QFN packaging structure of an embodiment of the invention in accordance with one embodiment of the invention.
Figure 17B:
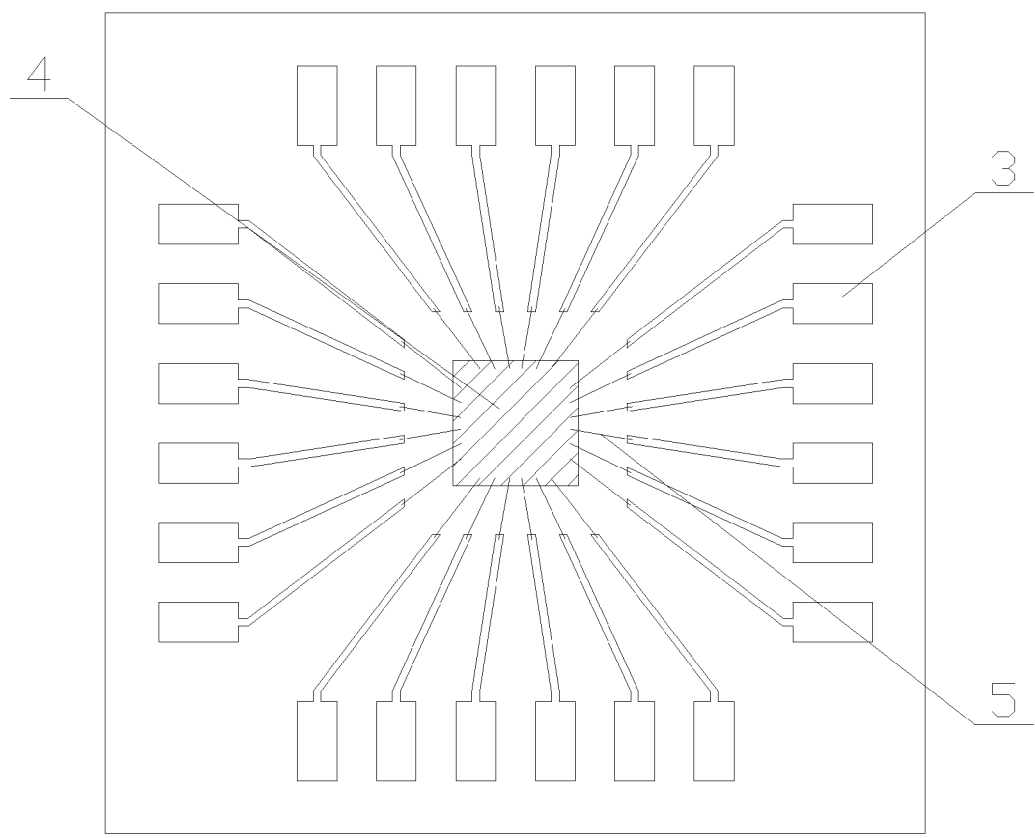

Further, the no-exposed-pad QFN packaging structure may also comprise various different structures and/or configurations. For example, FIG. 17A and FIG. 17B illustrate another exemplary no-exposed-pad QFN packaging structure. FIG. 17A is a cross-section view of FIG. 17B.

As shown in FIG. 17A and FIG. 17B, the no-exposed-pad QFN packaging structure in FIG. 17A and FIG. 17B is similar to the no-exposed-pad QFN packaging structure in FIG. 16A and FIG. 16B. However, the no-exposed-pad QFN packaging structure in FIG. 17A also comprises an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be comprised in the first metal layer 13. Further, the die 4 is attached at the top surface of the inner die pad 2 via the conductive or non-conductive adhesive material 7. Thus, a no-exposed-pad QFN packaging structure with an inner die pad and a single lead ring is formed.

Figure 18A:
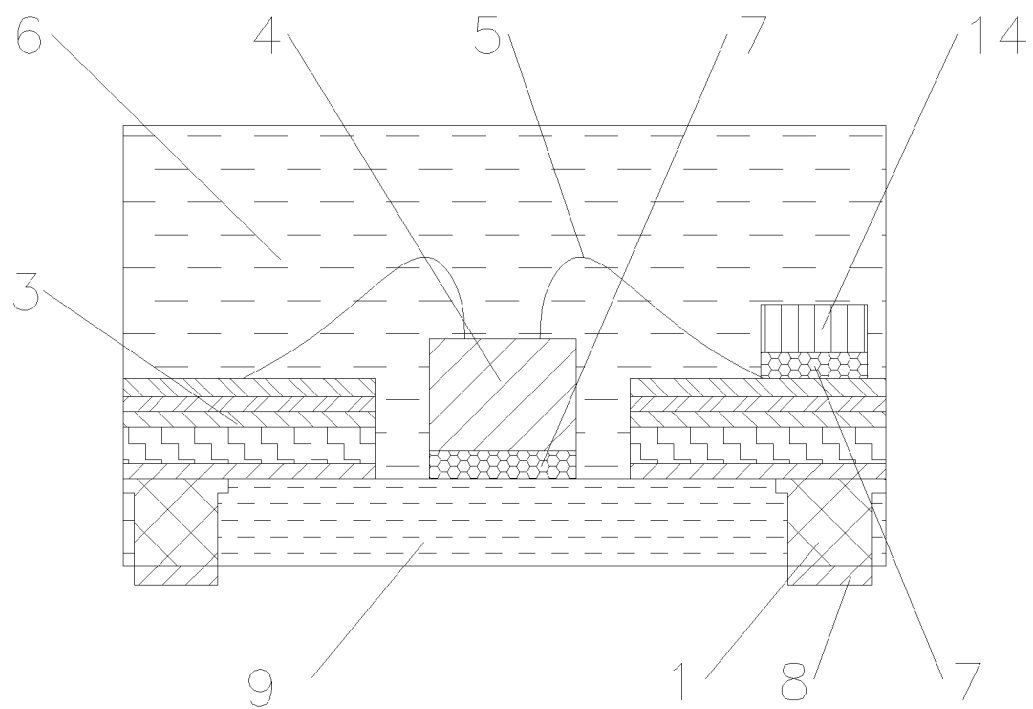
FIGS. 18A-18B illustrate another exemplary no-exposed-pad QFN packaging structure of an embodiment of the invention in accordance with one embodiment of the invention.
Figure 18B:
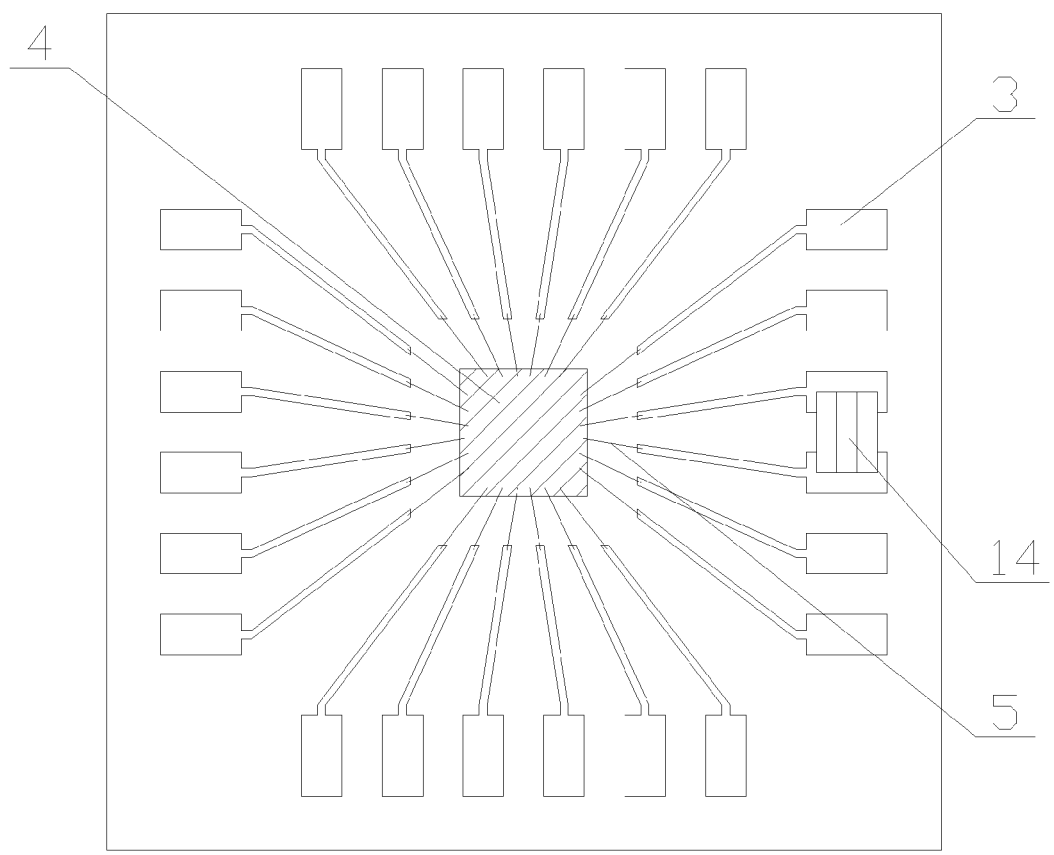

FIG. 18A and FIG. 18B illustrate another exemplary no-exposed-pad QFN packaging structure. FIG. 18A is a cross-section view of FIG. 18B.

As shown in FIG. 18A and FIG. 18B, the no-exposed-pad QFN packaging structure in FIG. 18A and FIG. 18B is similar to the no-exposed-pad QFN packaging structure in FIG. 16A and FIG. 16B. However, the no-exposed-pad QFN packaging structure in FIG. 18A also includes one or more passive device 14 coupled between the inner leads 3 using the conductive or non-conductive adhesive material 7. The passive device 14 is coupled between the inner leads 3 before the die 4 is attached or during the die attaching process. Thus, a no-exposed-pad QFN packaging structure with a single lead ring coupled with a passive device is formed.

Figure 19A:
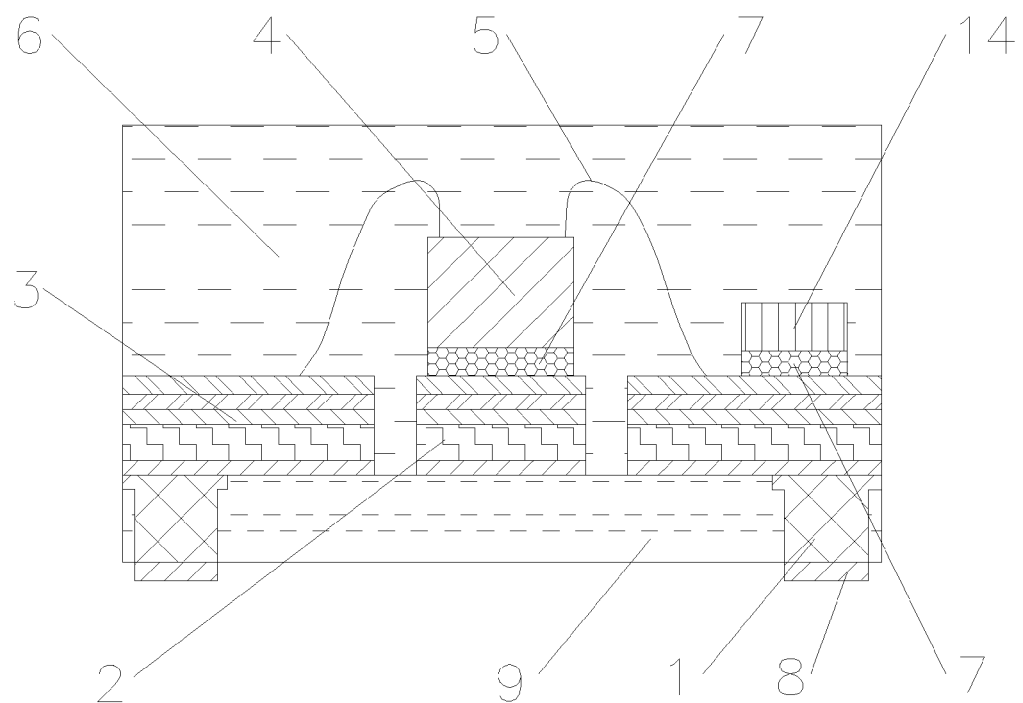
FIGS. 19A-19B illustrate another exemplary no-exposed-pad QFN packaging structure of an embodiment of the invention in accordance with one embodiment of the invention.
Figure 19B:
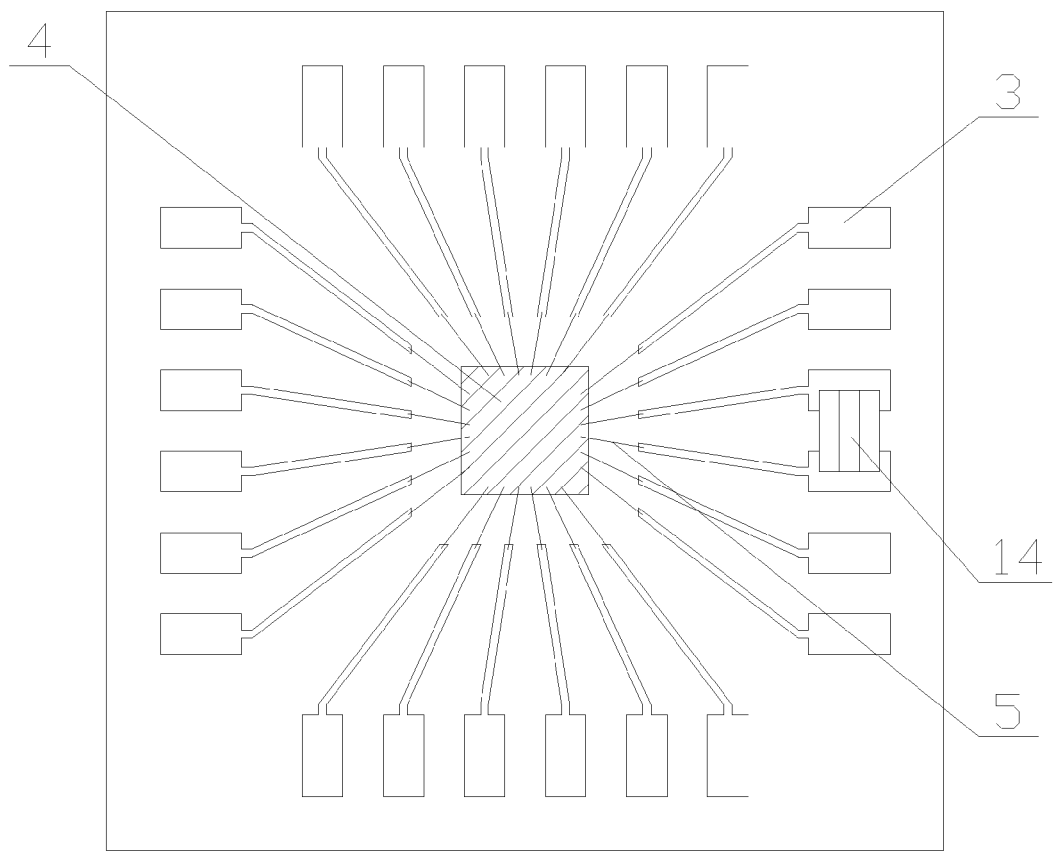

FIG. 19A and FIG. 19B illustrate another exemplary no-exposed-pad QFN packaging structure. FIG. 19A is a cross-section view of FIG. 19B.

As shown in FIG. 19A and FIG. 19B, the no-exposed-pad QFN packaging structure in FIG. 19A and FIG. 19B is similar to the no-exposed-pad QFN packaging structure in FIG. 18A and FIG. 18B. However, the no-exposed-pad QFN packaging structure in FIG. 19A also comprises inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad and a single lead ring coupled with a passive device is formed.

Figure 20A:
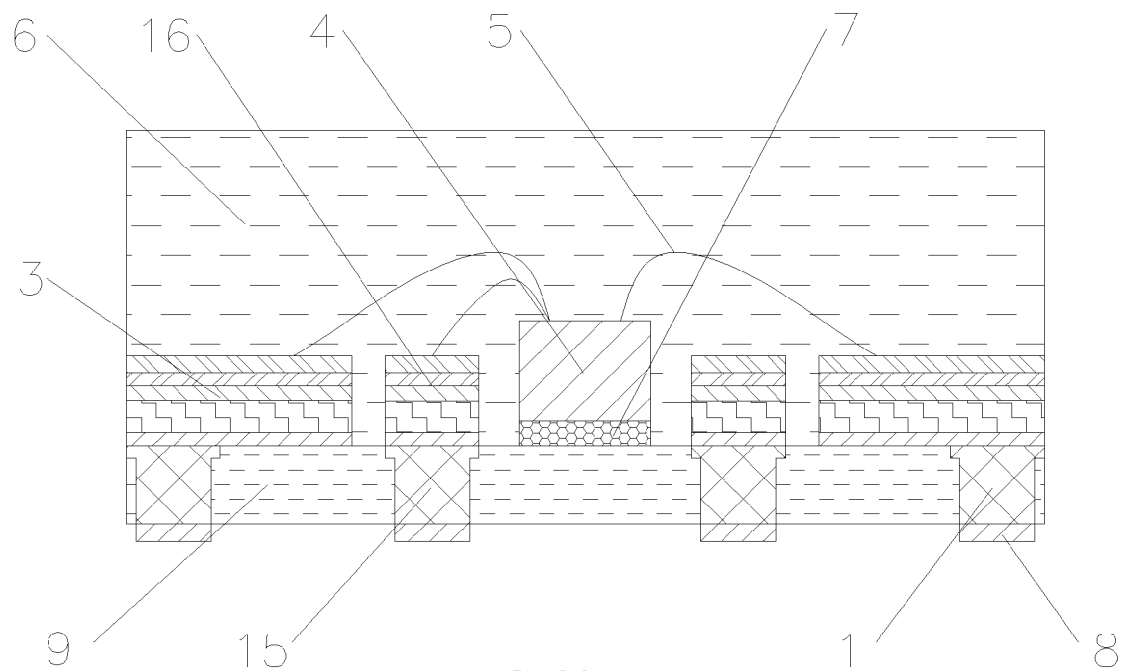
FIGS. 20A-20B illustrate another exemplary no-exposed-pad QFN packaging structure of an embodiment of the invention in accordance with one embodiment of the invention.
Figure 20B:
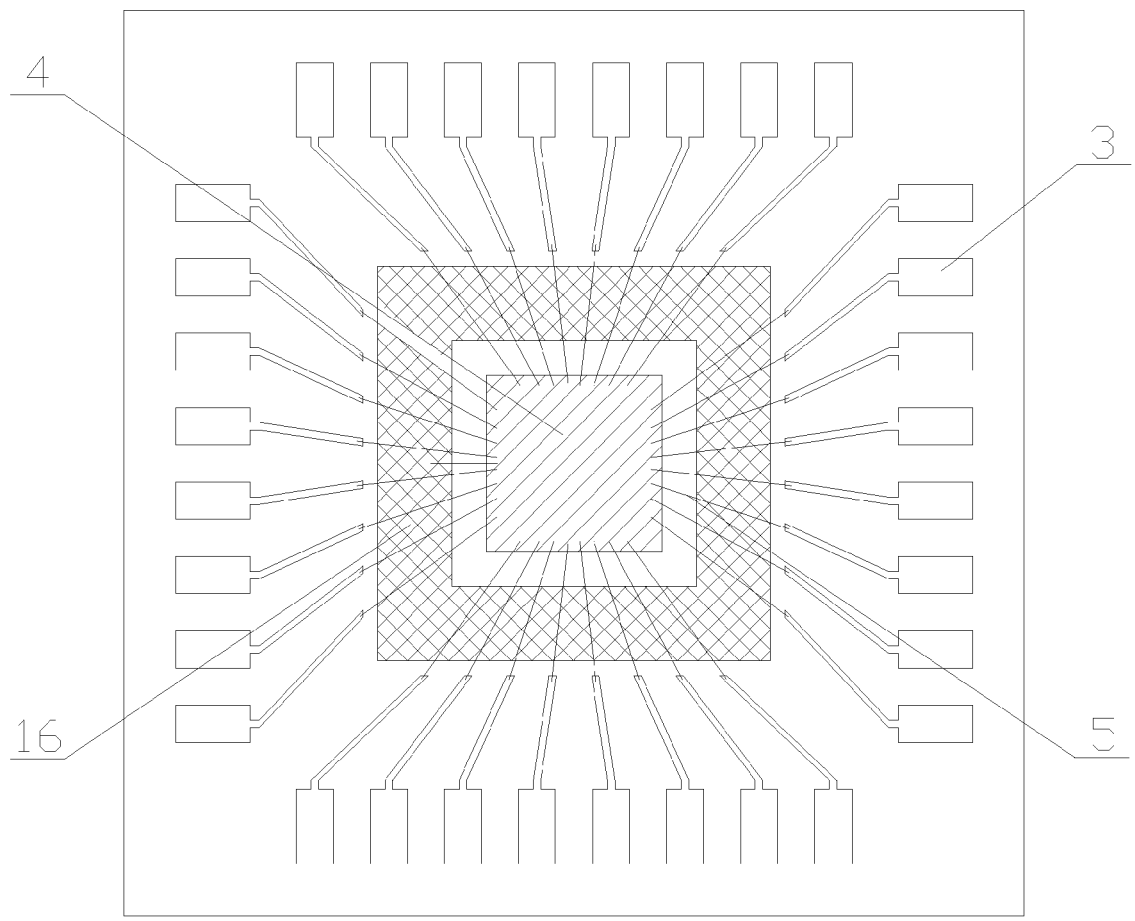

FIG. 20A and FIG. 20B illustrate another exemplary no-exposed-pad QFN packaging structure. FIG. 20A is a cross-section view of FIG. 20B.

As shown in FIG. 20A and FIG. 20B, the no-exposed-pad QFN packaging structure in FIG. 20A and FIG. 20B is similar to the no-exposed-pad QFN packaging structure in FIG. 16A and FIG. 16B. However, the no-exposed-pad QFN packaging structure in FIG. 20A and FIG. 20B also includes an outer electrostatic discharge ring 15, and an inner electrostatic discharge ring 16 is formed on the top surface of the outer electrostatic discharge ring 15 within the I/O pad ring. That is, the inner electrostatic discharge ring 16 may also be formed by the multi-layer plating process for forming the first metal layer 13. More particularly, the inner electrostatic discharge ring 16 is arranged between the die 4 and inner leads 3 and in any appropriate shape, such as a rectangle shape or a square shape. Further, the top surface of the die 4 is connected to the top surface of the inner electrostatic discharge ring 16 by the metal wire 5 such that the die 4 is protected from the static by the internal and outer electrostatic discharge rings 15 and 16. Both the outer electrostatic discharge ring 15 and the inner electrostatic discharge ring 16 are in any appropriate shape, such as a rectangle ring shape. Thus, a no-exposed-pad QFN packaging structure with an inner die pad, a single lead ring, and an electrostatic discharge ring is formed.

Figure 21A:
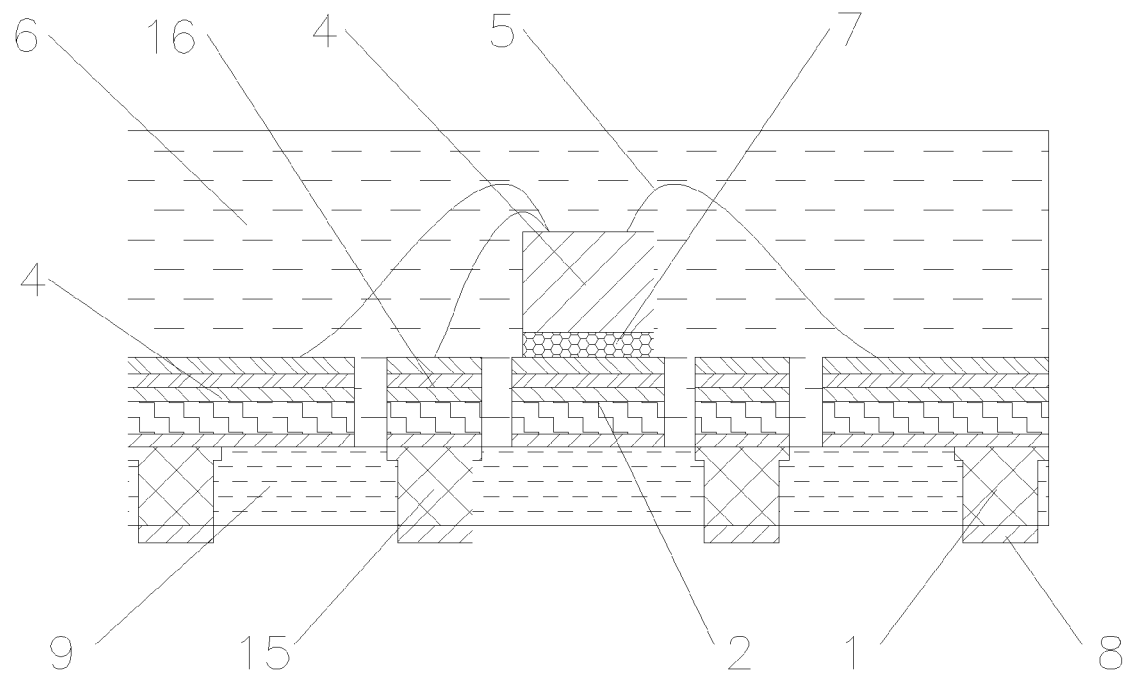
FIGS. 21A-21B illustrate another exemplary no-exposed-pad QFN packaging structure of an embodiment of the invention in accordance with one embodiment of the invention.
Figure 21B:
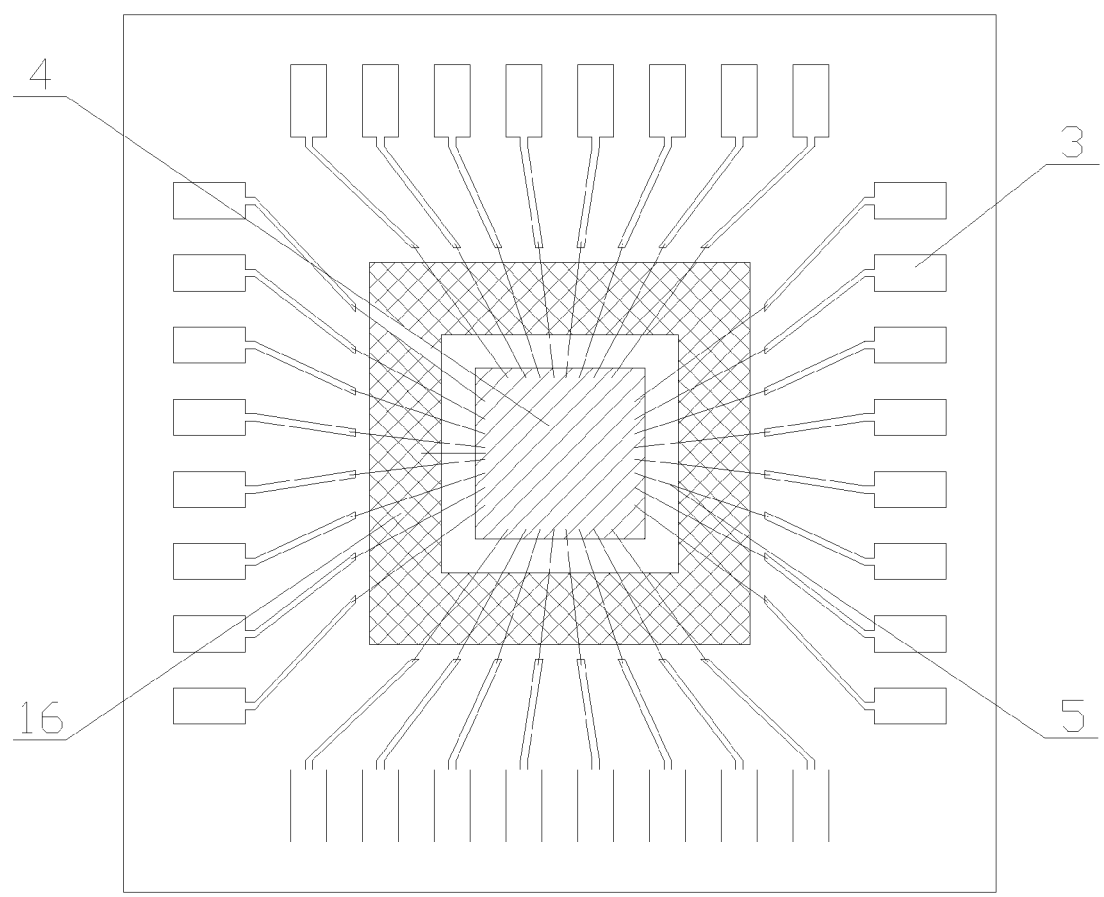

FIG. 21A and FIG. 21B illustrate another exemplary no-exposed-pad QFN packaging structure. FIG. 21A is a cross-section view of FIG. 21B.

As shown in FIG. 21A and FIG. 21B, the no-exposed-pad QFN packaging structure in FIG. 21A and FIG. 21B is similar to the no-exposed-pad QFN packaging structure in FIG. 20A and FIG. 20B. However, the no-exposed-pad QFN packaging structure in FIG. 21A also includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad, a single lead ring, and an electrostatic discharge ring is formed.

Figure 22A:
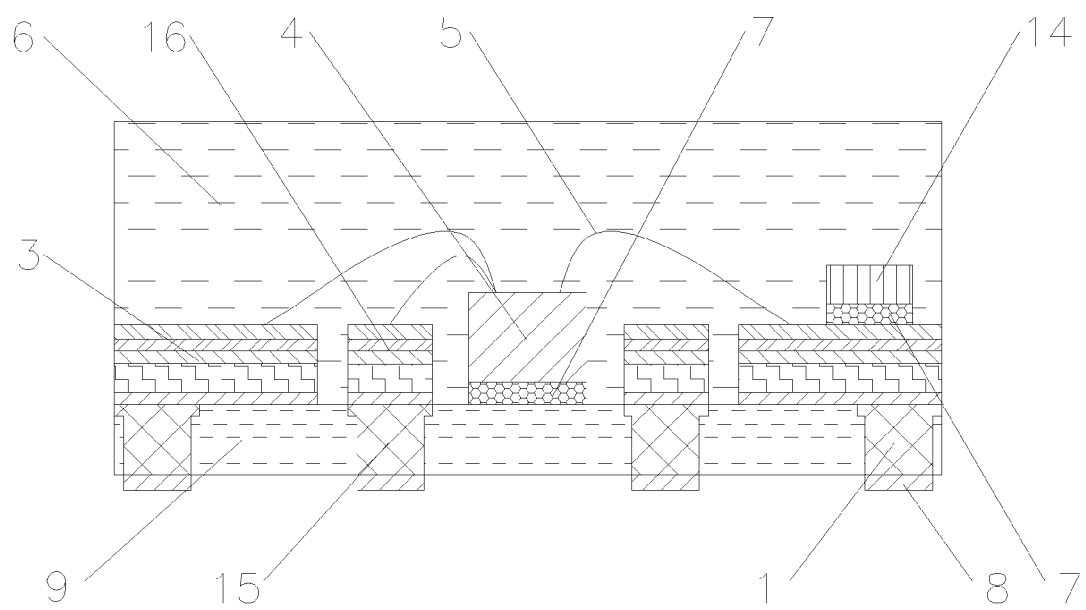
FIGS. 22A-22B illustrate another exemplary no-exposed-pad QFN packaging structure of an embodiment of the invention in accordance with one embodiment of the invention.
Figure 22B:
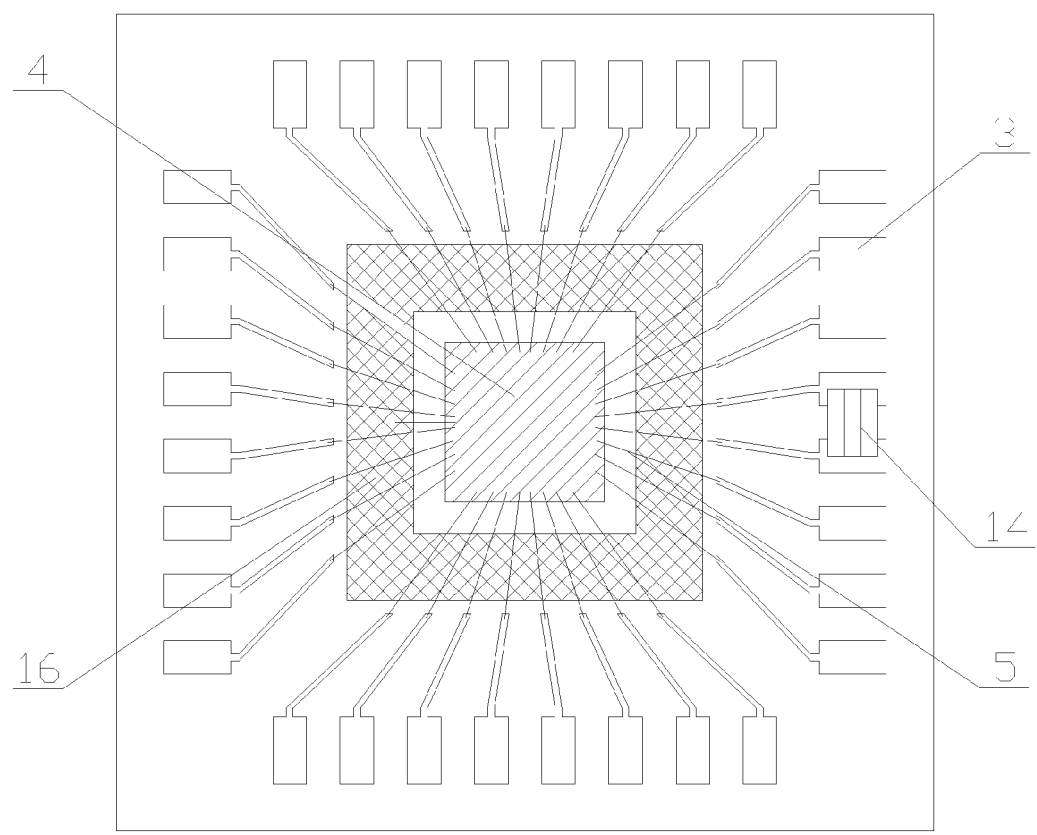

FIG. 22A and FIG. 22B illustrate another exemplary no-exposed-pad QFN packaging structure. FIG. 22A is a cross-section view of FIG. 22B.

As shown in FIG. 22A and FIG. 22B, the no-exposed-pad QFN packaging structure in FIG. 22A and FIG. 22B is similar to the no-exposed-pad QFN packaging structure in FIG. 20A and FIG. 20B. However, the no-exposed-pad QFN packaging structure in FIG. 22A also includes one or more passive devices 14 coupled between the inner leads 3 using the conductive or non-conductive adhesive material 7. Thus, a no-exposed-pad QFN packaging structure with a single lead ring coupled with a passive device and an electrostatic discharge ring is formed.

Figure 23A:
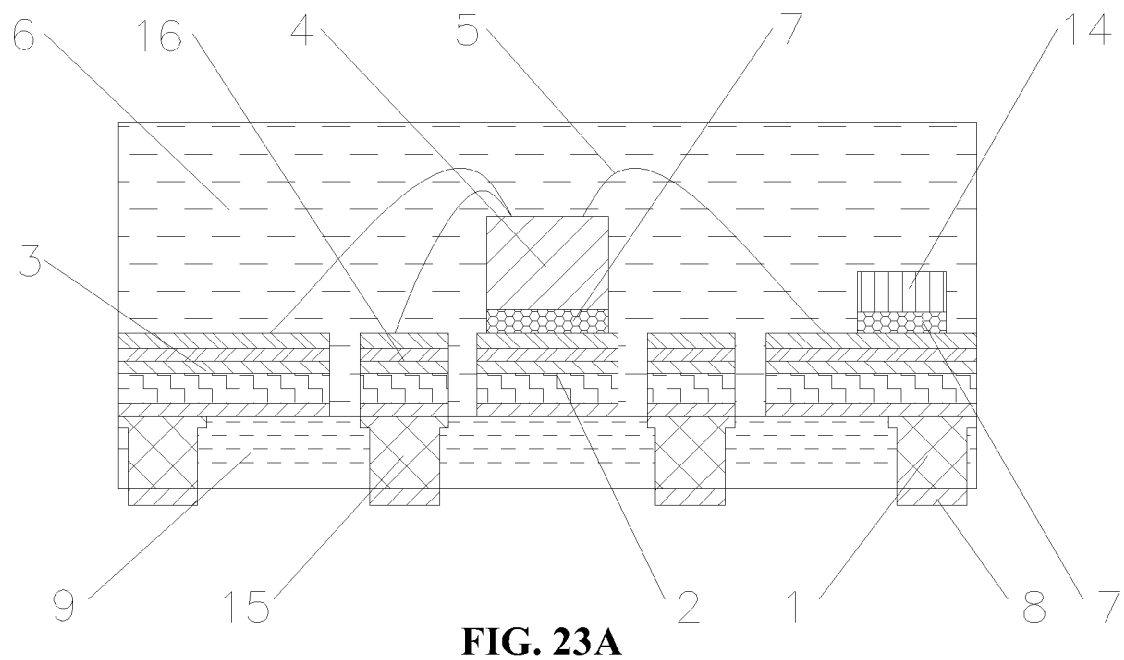
FIGS. 23A-23B illustrate another exemplary no-exposed-pad QFN packaging structure in accordance with one embodiment of the invention.
Figure 23B:
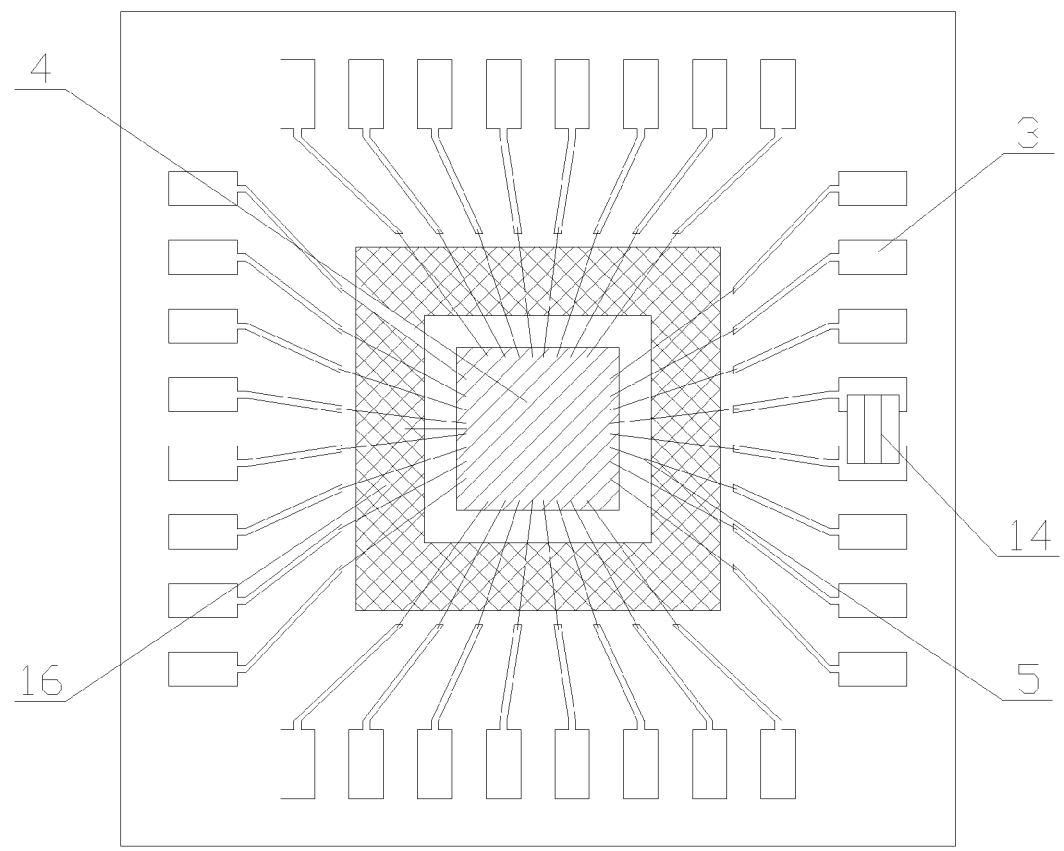

FIG. 23A and FIG. 23B illustrate another exemplary no-exposed-pad QFN packaging structure. FIG. 23A is a cross-section view of FIG. 23B.

As shown in FIG. 23A and FIG. 23B, the no-exposed-pad QFN packaging structure in FIG. 23A and FIG. 23B is similar to the no-exposed-pad QFN packaging structure in FIG. 22A and FIG. 22B. However, the no-exposed-pad QFN packaging structure in FIG. 23A also includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad, a single lead ring coupled with a passive device, and an electrostatic discharge ring is formed.

Figure 24A:
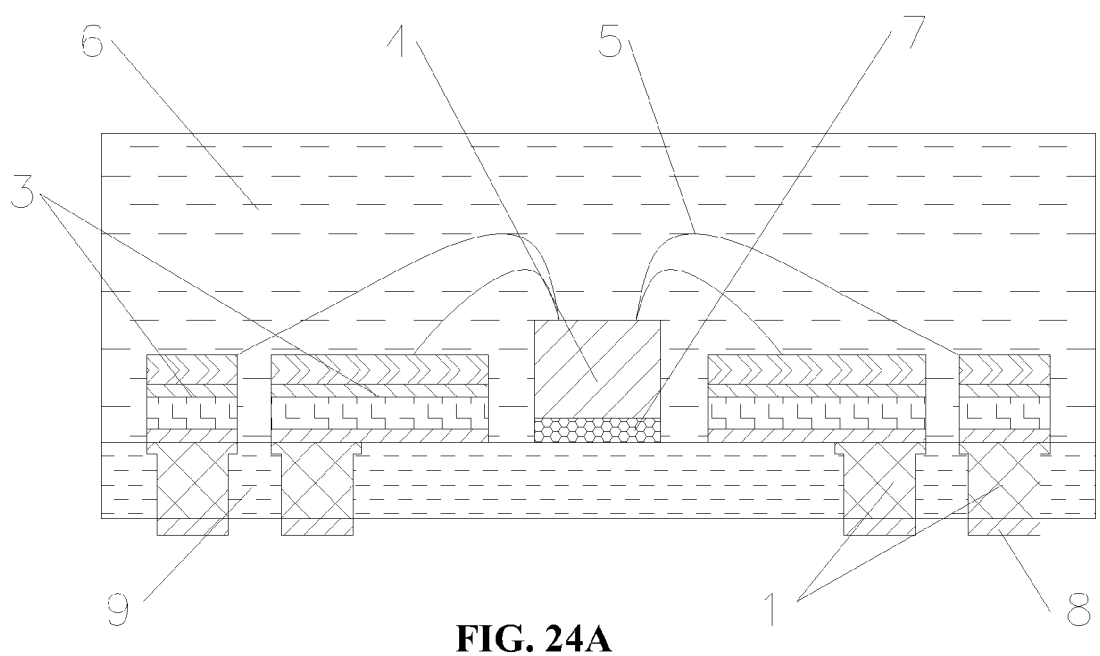
FIGS. 24A-24B illustrate another exemplary no-exposed-pad QFN packaging structure in accordance with one embodiment of the invention.
Figure 24B:
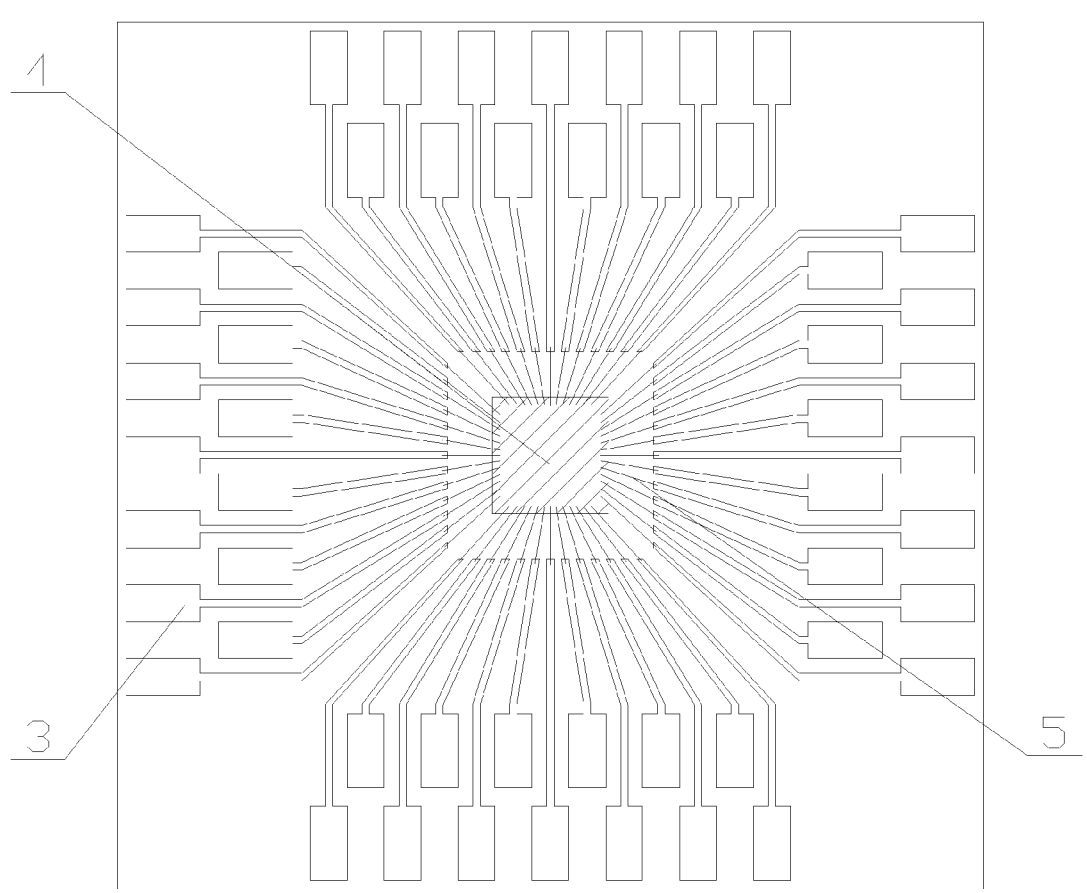

FIG. 24A and FIG. 24B illustrate another exemplary no-exposed-pad QFN packaging structure. FIG. 24A is a cross-section view of FIG. 24B.

As shown in FIG. 24A and FIG. 24B, the no-exposed-pad QFN packaging structure in FIG. 24A and FIG. 24B is similar to the no-exposed-pad QFN packaging structure in FIG. 16A and FIG. 16B. However, the no-exposed-pad QFN packaging structure in FIGS. 24A and 24B includes multiple rings of I/O pads 1. In other words, the I/O pads 1 are arranged in a multiple-ring configuration, and the leads in the multiple rings is arranged in a staggered or zigzag way such that the leads and lead traces can be closely placed to the die 4. Further, multiple rings of inner leads 3 is formed on the top surface of the I/O pads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings is significantly reduced. Thus, a no-exposed-pad QFN packaging structure with multiple lead rings is formed.

Figure 25A:
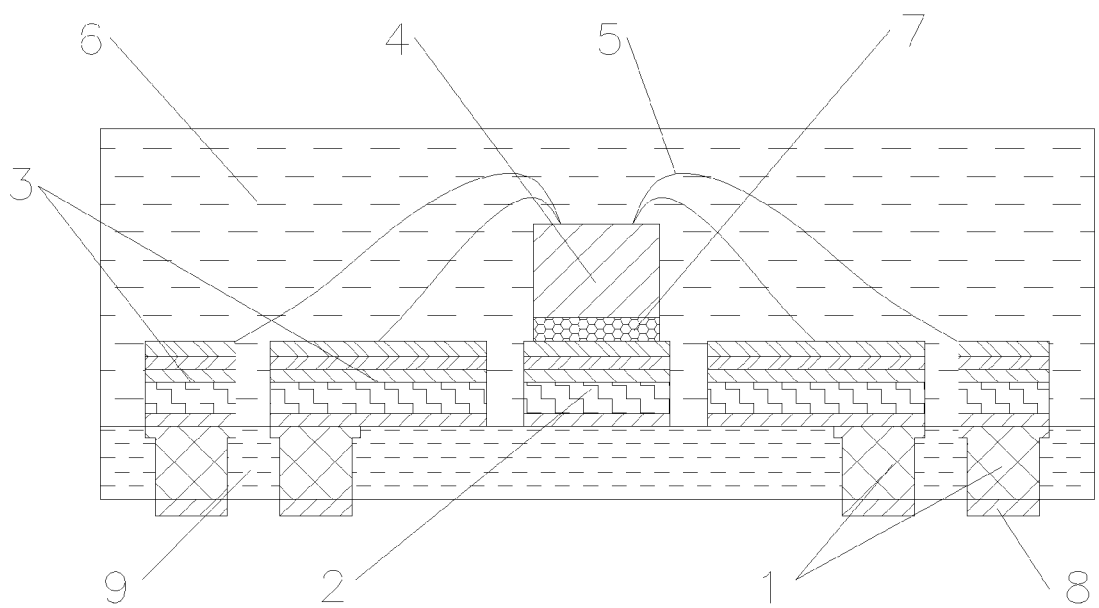
FIGS. 25A-25B illustrate another exemplary no-exposed-pad QFN packaging structure in accordance with one embodiment of the invention.
Figure 25B:
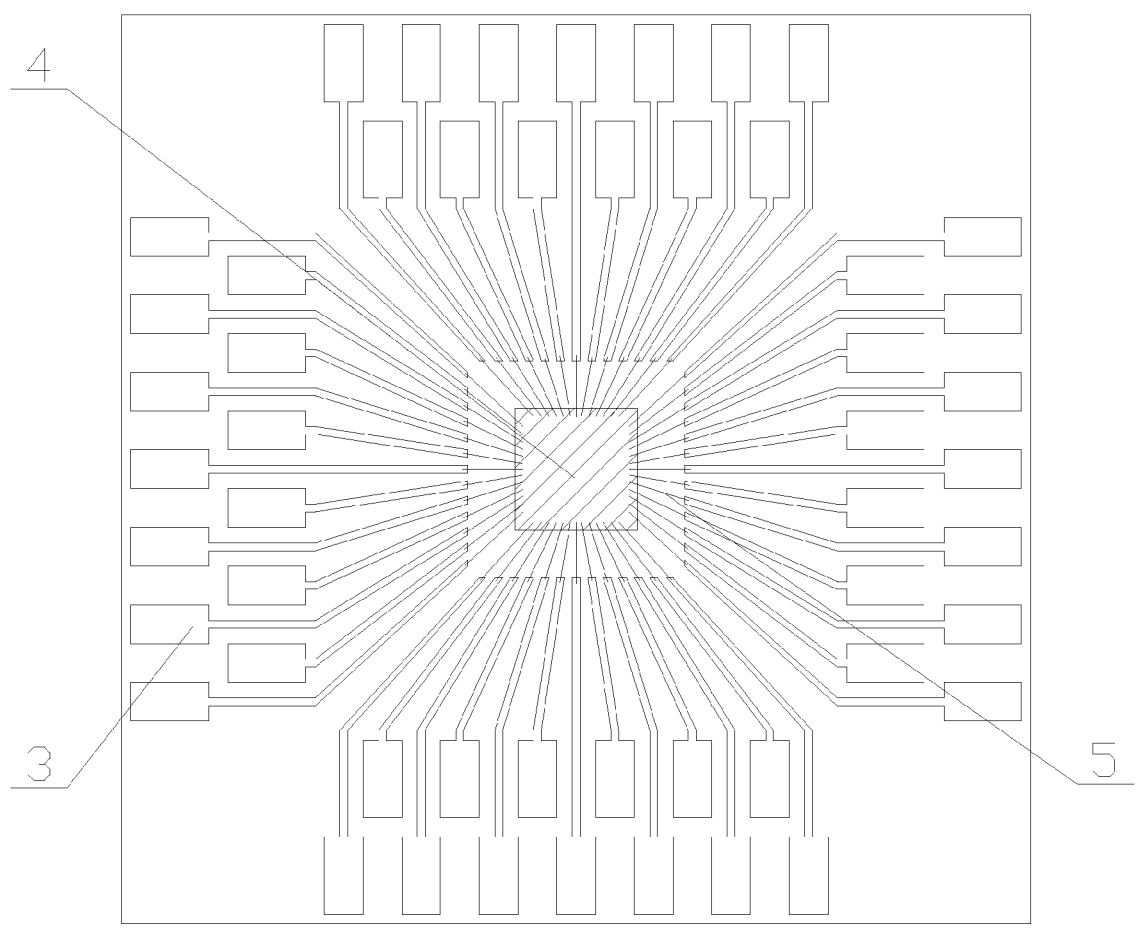

FIG. 25A and FIG. 25B illustrate another exemplary no-exposed-pad QFN packaging structure. FIG. 25A is a cross-section view of FIG. 25B.

As shown in FIG. 25A and FIG. 25B, the no-exposed-pad QFN packaging structure in FIG. 25A and FIG. 25B is similar to the no-exposed-pad QFN packaging structure in FIG. 24A and FIG. 24B. However, the no-exposed-pad QFN packaging structure in FIGS. 25A and 25B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad and multiple lead rings is formed.

Figure 26A:
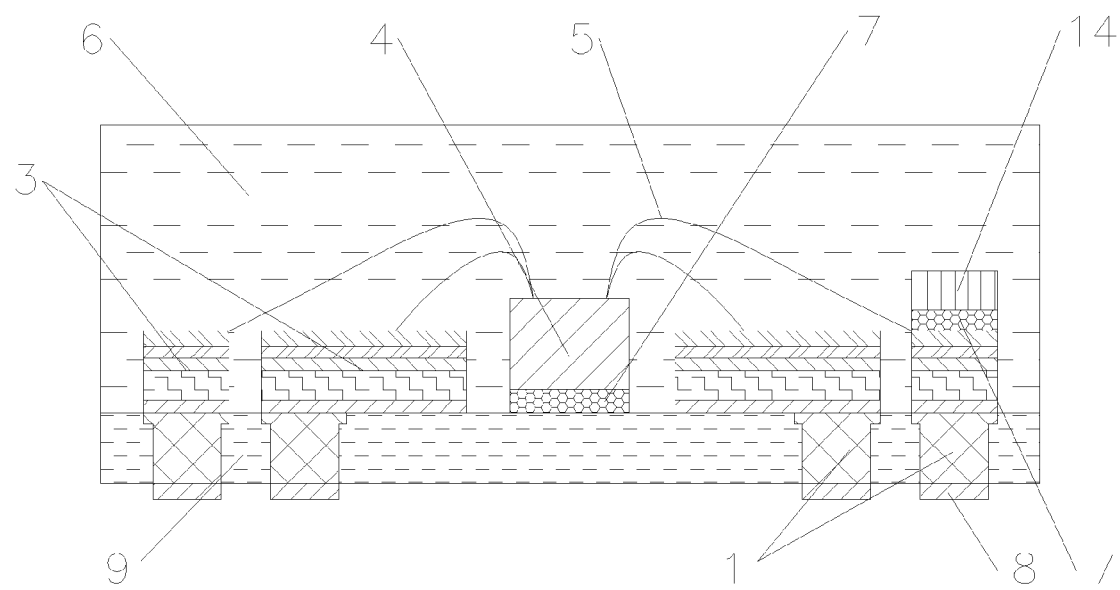
FIGS. 26A-26B illustrate another exemplary no-exposed-pad QFN packaging structure in accordance with one embodiment of the invention.
Figure 26B:
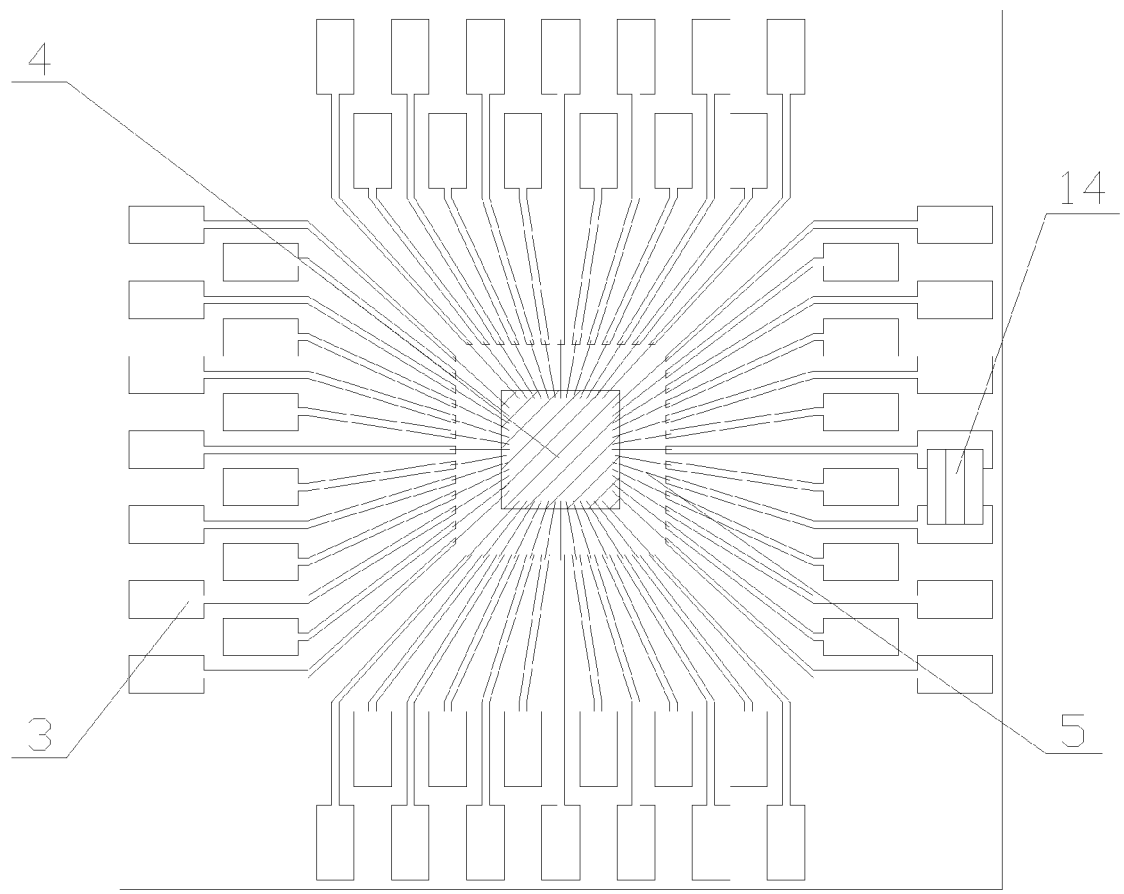

FIG. 26A and FIG. 26B illustrate another exemplary no-exposed-pad QFN packaging structure. FIG. 26A is a cross-section view of FIG. 26B.

Figure 27A:
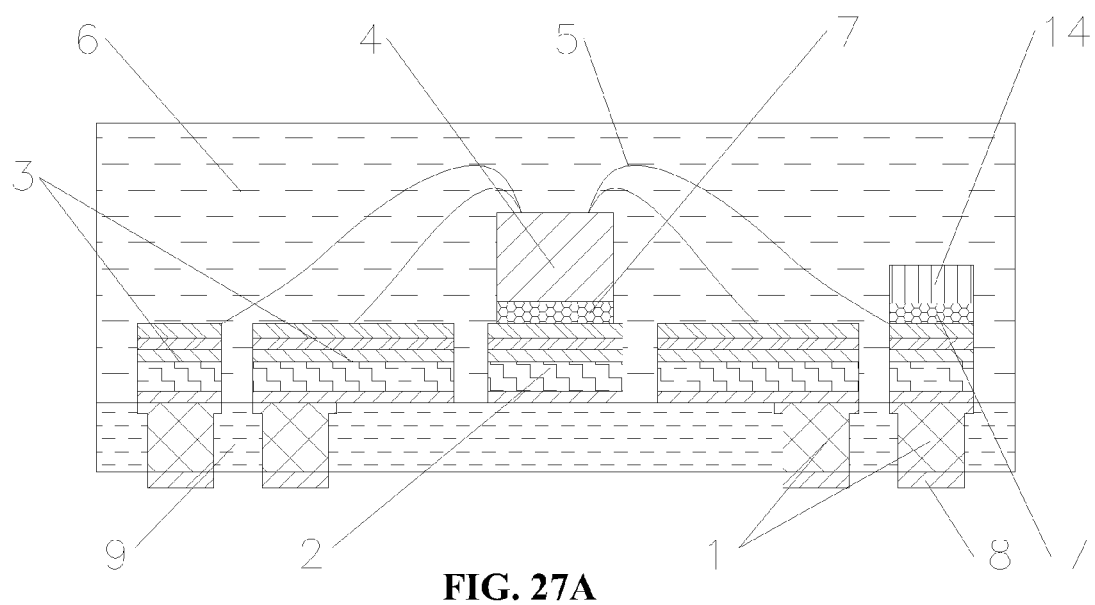
FIGS. 27A-27B illustrate another exemplary no-exposed-pad QFN packaging structure in accordance with one embodiment of the invention.
Figure 27B:
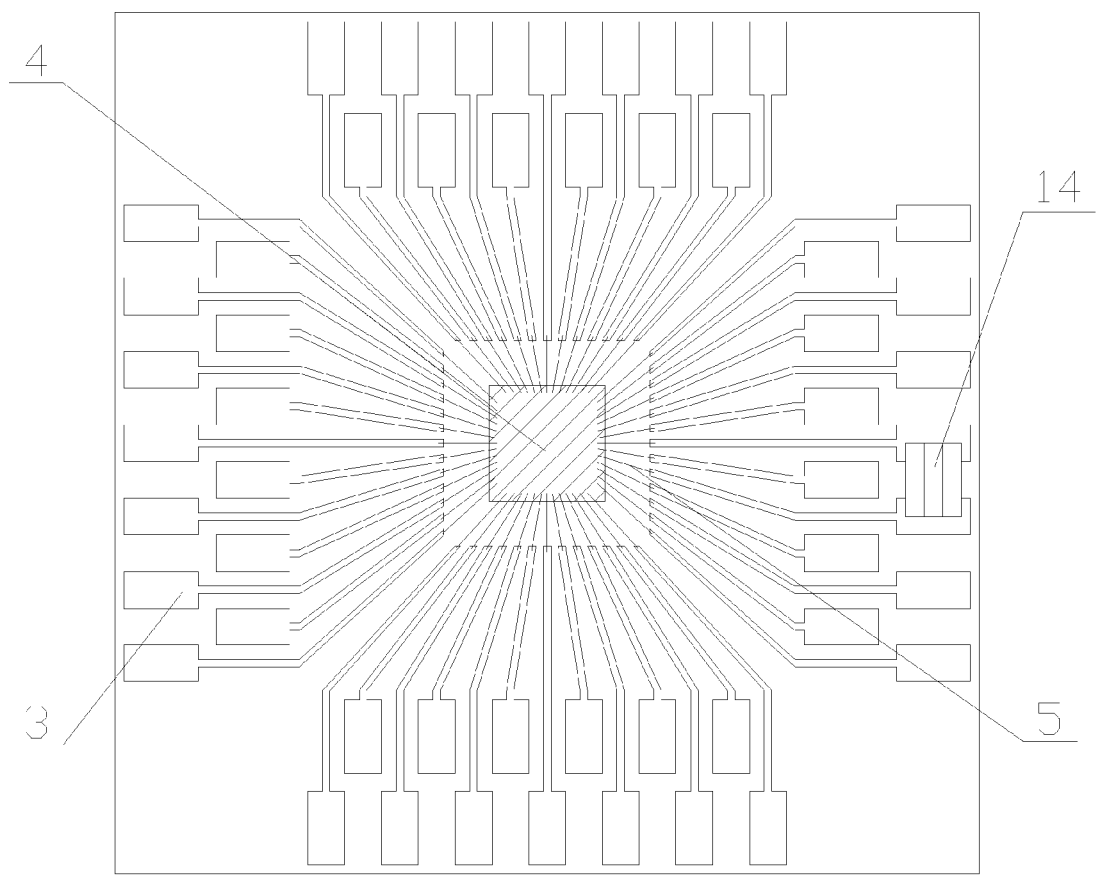

As shown in FIG. 26A and FIG. 26B, the no-exposed-pad QFN packaging structure in FIG. 26A and FIG. 26B is similar to the no-exposed-pad QFN packaging structure in FIG. 24A and FIG. 24B. However, the no-exposed-pad QFN packaging structure in FIGS. 26A and 26B include one or more passive devices 14 coupled between inner leads 3 using the conductive or non-conductive adhesive material 7. Thus, a no-exposed-pad QFN packaging structure with multiple lead rings coupled with a passive device is formed. FIG. 27A and FIG. 27B illustrate another exemplary no-exposed-pad QFN packaging structure. FIG. 27A is a cross-section view of FIG. 27B.

As shown in FIG. 27A and FIG. 27B, the no-exposed-pad QFN packaging structure in FIG. 27A and FIG. 27B is similar to the no-exposed-pad QFN packaging structure in FIG. 26A and FIG. 26B. However, the no-exposed-pad QFN packaging structure in FIGS. 27A and 27B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad and multiple lead rings coupled with a passive device is formed.

Figure 28A:
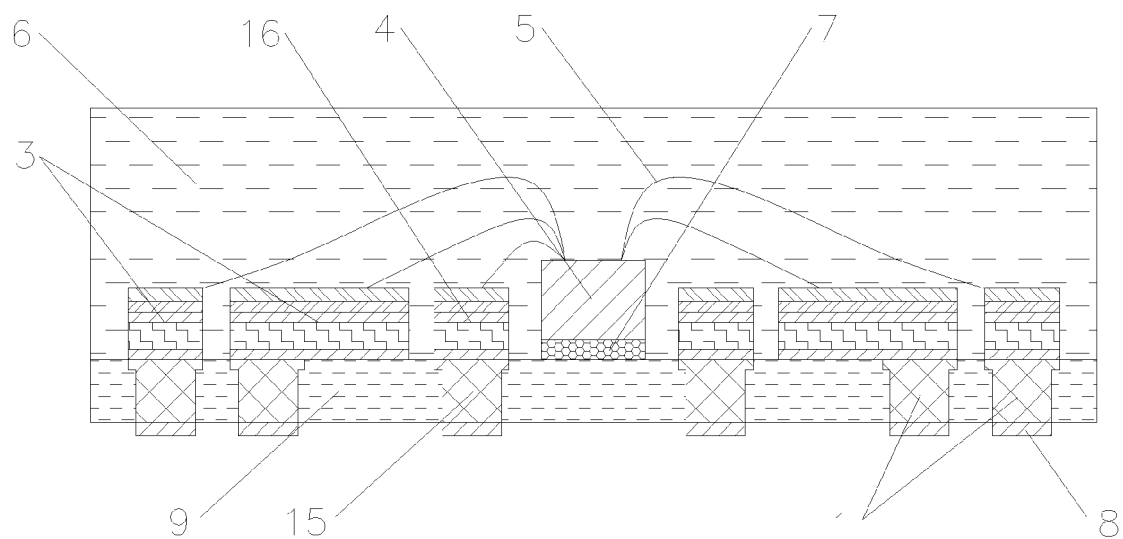
FIGS. 28A-28B illustrate another exemplary no-exposed-pad QFN packaging structure in accordance with one embodiment of the invention.
Figure 28B:
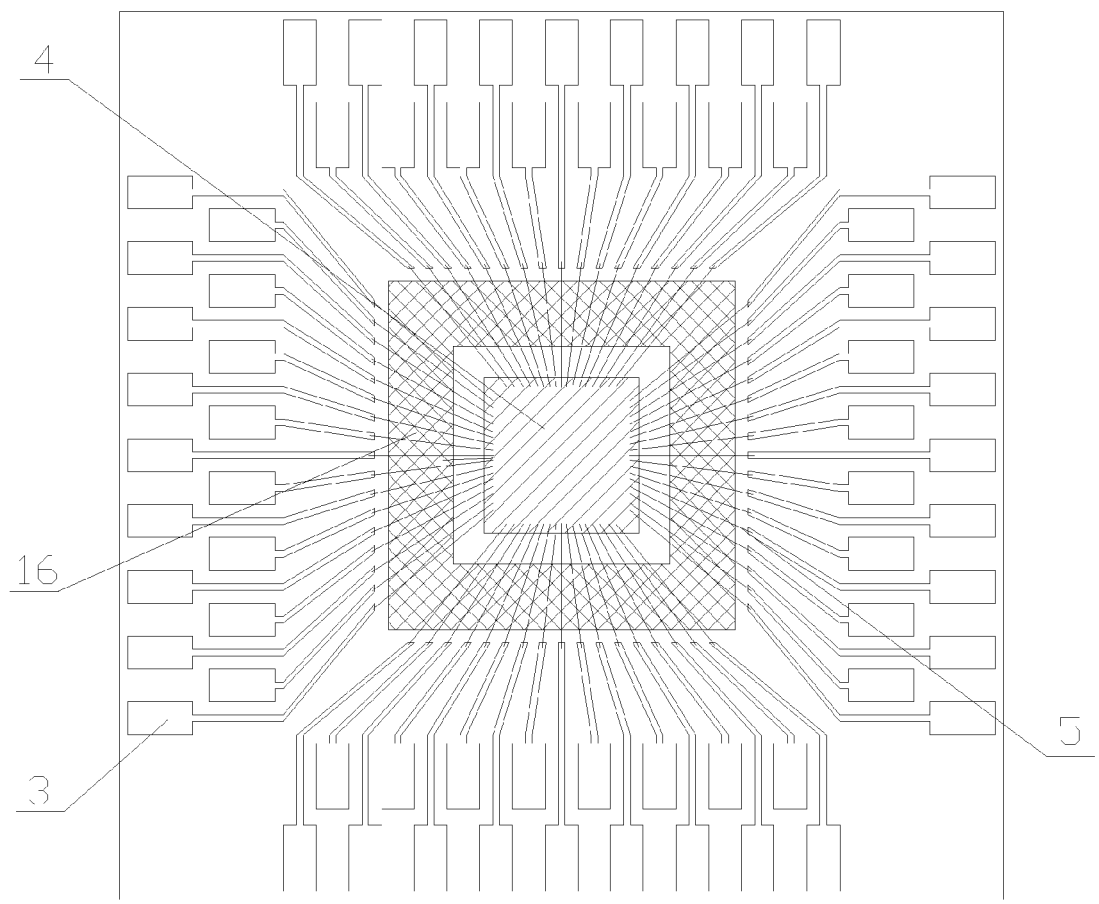

FIG. 28A and FIG. 28B illustrate another exemplary no-exposed-pad QFN packaging structure. FIG. 28A is a cross-section view of FIG. 28B.

As shown in FIG. 28A and FIG. 28B, the no-exposed-pad QFN packaging structure in FIG. 28A and FIG. 28B is similar to the no-exposed-pad QFN packaging structure in FIG. 24A and FIG. 24B. However, the no-exposed-pad QFN packaging structure in FIGS. 28A and 28B includes an outer electrostatic discharge ring 15, and an inner electrostatic discharge ring 16 is formed on the top surface of the outer electrostatic discharge ring 15 within the I/O pad ring. That is, the inner electrostatic discharge ring 16 may also be formed by the multi-layer plating process for forming the first metal layer 13. More particularly, the inner electrostatic discharge ring 16 is arranged between the die 4 and the inner leads 3. Further, the top surface of the die 4 is connected to the top surface of the inner electrostatic discharge ring 16 by the metal wire 5 such that the die 4 is protected from the static by the internal and outer electrostatic discharge rings 16 and 17. Second metal layer 8 may also be formed on the back surface of the outer electrostatic discharge ring 16. Thus, a no-exposed-pad QFN packaging structure with multiple lead rings and an electrostatic discharge ring is formed.

Figure 29A:
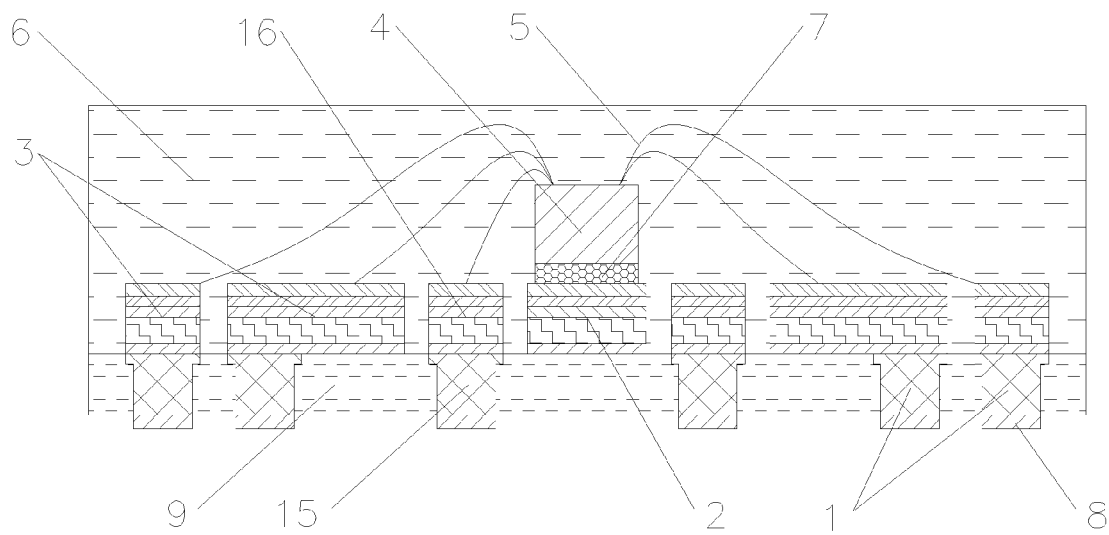
FIGS. 29A-29B illustrate another exemplary no-exposed-pad QFN packaging structure in accordance with one embodiment of the invention.
Figure 29B:
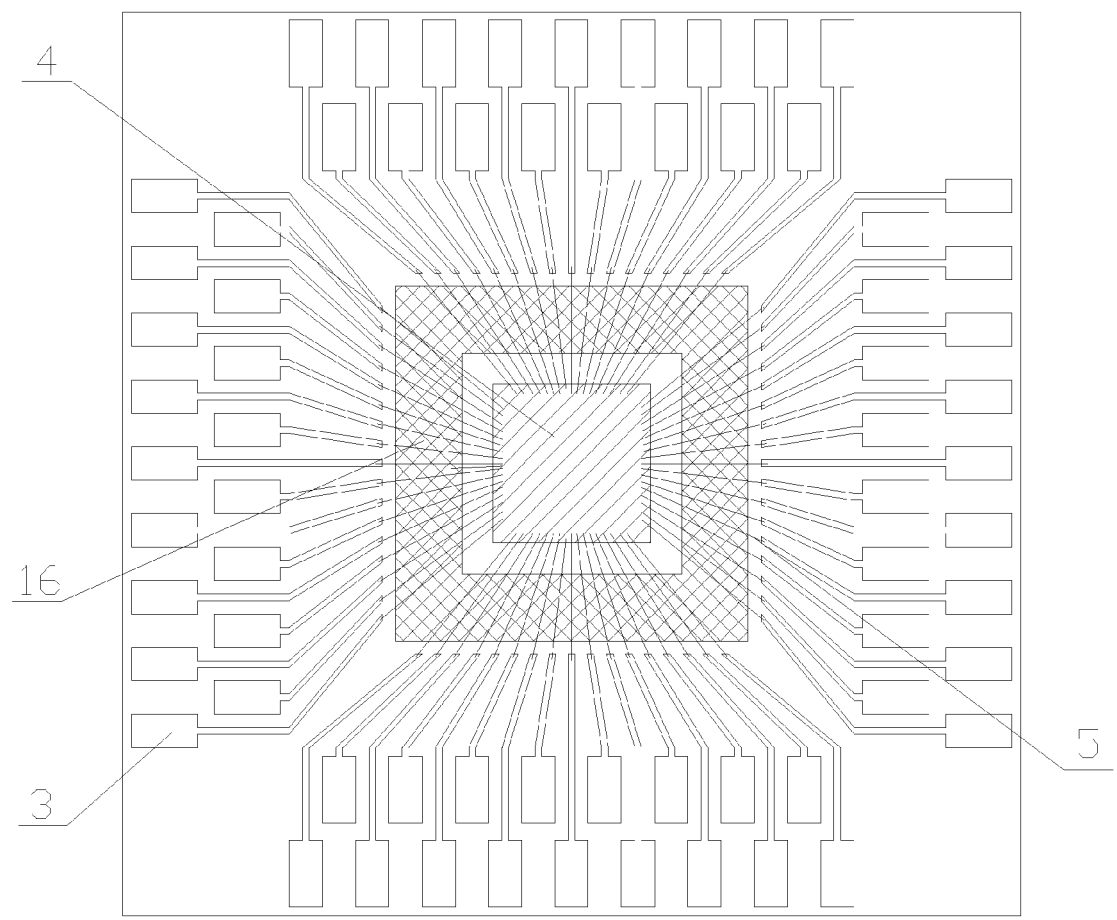

FIG. 29A and FIG. 29B illustrate another exemplary no-exposed-pad QFN packaging structure. FIG. 29A is a cross-section view of FIG. 29B.

As shown in FIG. 29A and FIG. 29B, the no-exposed-pad QFN packaging structure in FIG. 29A and FIG. 29B is similar to the no-exposed-pad QFN packaging structure in FIG. 28A and FIG. 28B. However, the no-exposed-pad QFN packaging structure in FIGS. 29A and 29B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad, multiple lead rings, and an electrostatic discharge ring is formed.

Figure 30A:
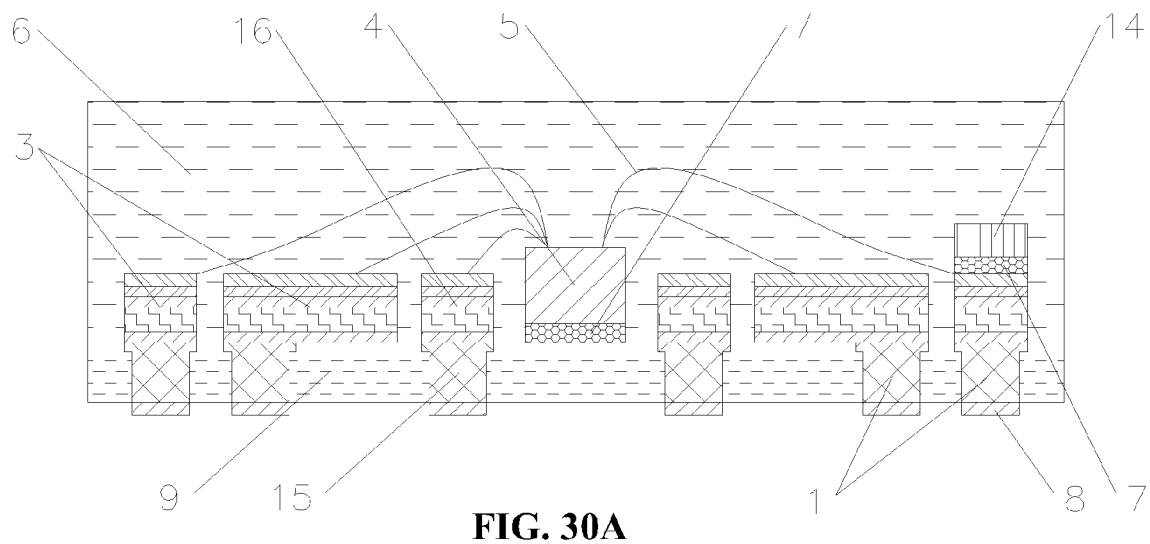
FIGS. 30A-30B illustrate another exemplary no-exposed-pad QFN packaging structure in accordance with one embodiment of the invention.
Figure 30B:
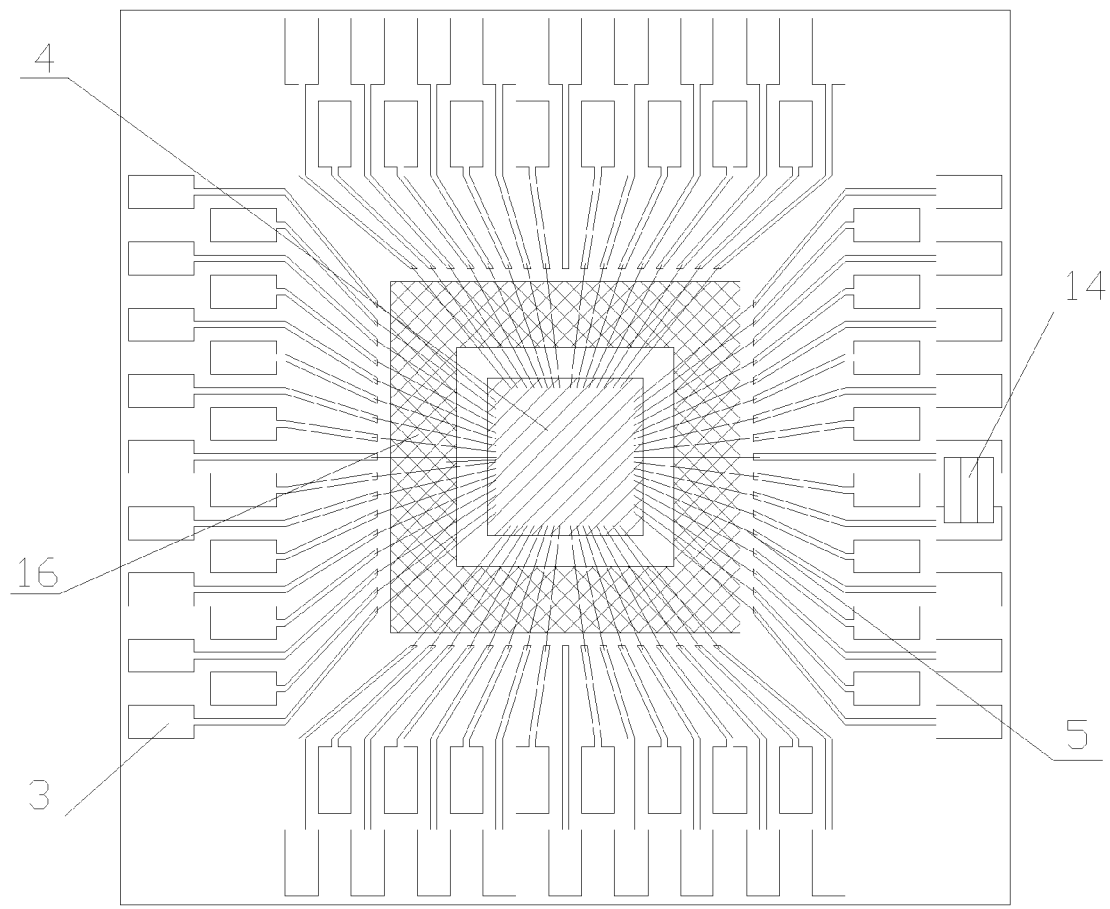

FIG. 30A and FIG. 30B illustrate another exemplary no-exposed-pad QFN packaging structure. FIG. 30A is a cross-section view of FIG. 30B.

As shown in FIG. 30A and FIG. 30B, the no-exposed-pad QFN packaging structure in FIG. 30A and FIG. 30B is similar to the no-exposed-pad QFN packaging structure in FIG. 28A and FIG. 28B. However, the no-exposed-pad QFN packaging structure in FIGS. 30A and 30B includes one or more passive devices 14 coupled between the inner leads 3 using the conductive or non-conductive adhesive material 7. Thus, a no-exposed-pad QFN packaging structure with multiple lead rings coupled with a passive device, and an electrostatic discharge ring is formed.

Figure 31A:
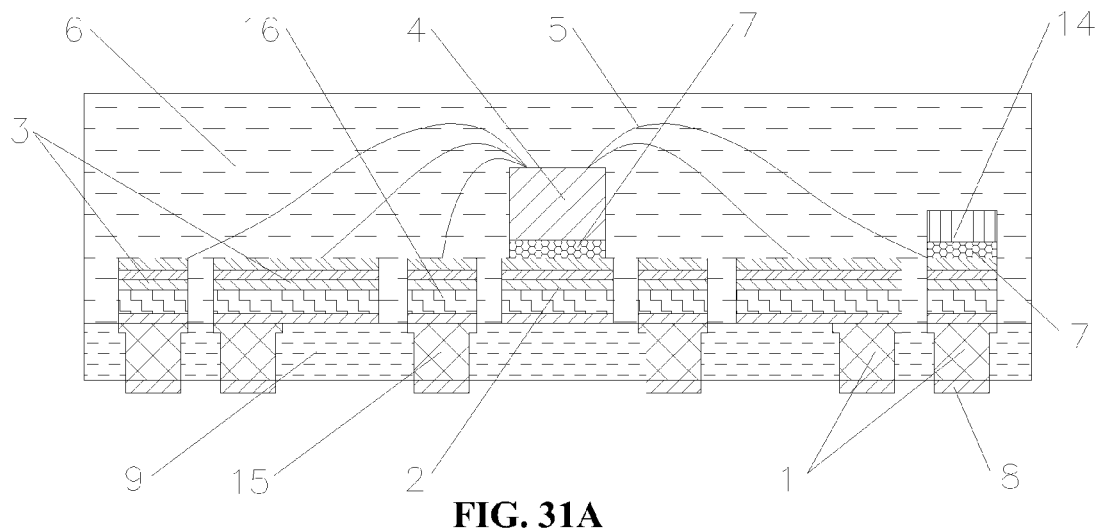
FIGS. 31A-31B illustrate another exemplary no-exposed-pad QFN packaging structure in accordance with one embodiment of the invention.
Figure 31B:
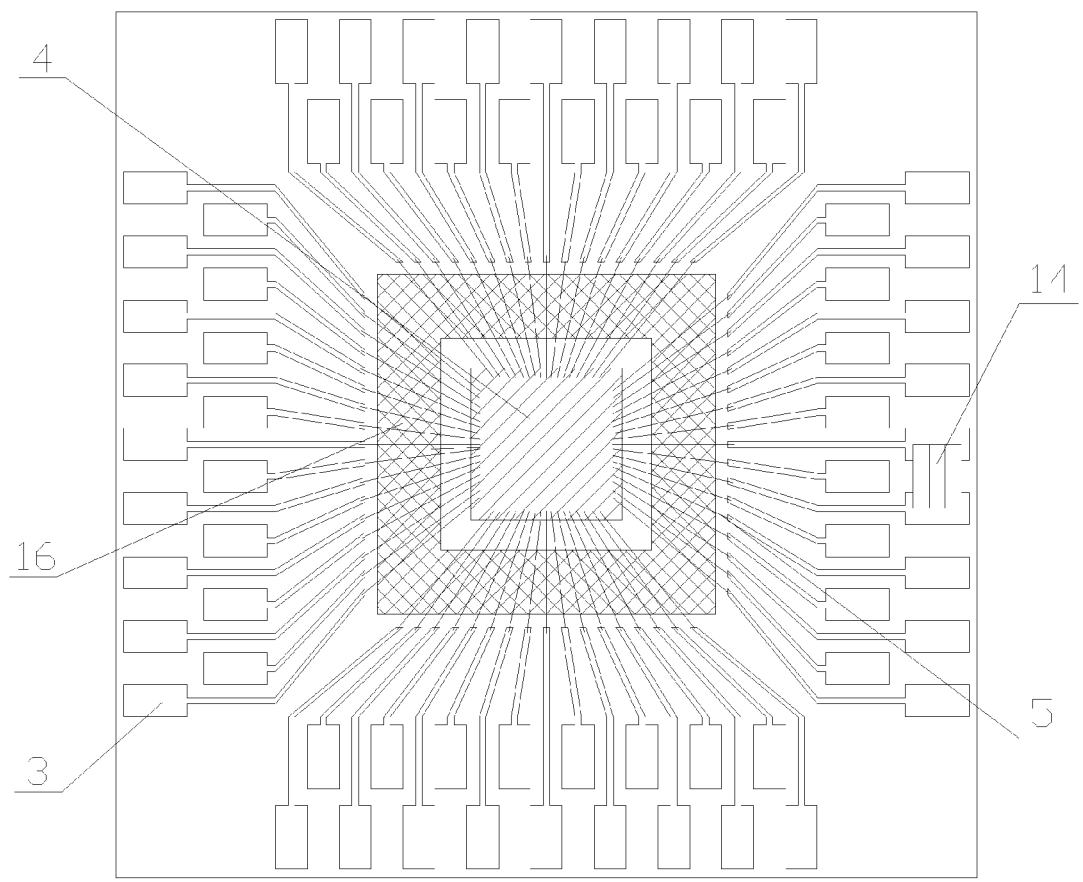

FIG. 31A and FIG. 31B illustrate another exemplary no-exposed-pad QFN packaging structure. FIG. 31A is a cross-section view of FIG. 31B.

As shown in FIG. 31A and FIG. 31B, the no-exposed-pad QFN packaging structure in FIG. 31A and FIG. 31B is similar to the no-exposed-pad QFN packaging structure in FIG. 30A and FIG. 30B. However, the no-exposed-pad QFN packaging structure in FIGS. 31A and 31B includes an inner die pad 2 formed on the predetermined area for attaching the die 4 or within a ring or rings of inner leads 3. The inner die pad 2 may also be formed by the multi-layer plating process for forming the inner leads 3. Thus, the inner die pad 2 may also be included in the first metal layer 13. Further, the die 4 is attached at the top surface of the inner die pad 2 via the conductive or non-conductive adhesive material 7. Thus, a no-exposed-pad QFN packaging structure with an inner die pad, multiple lead rings coupled with a passive device, and an electrostatic discharge ring is formed.

Figure 32A:
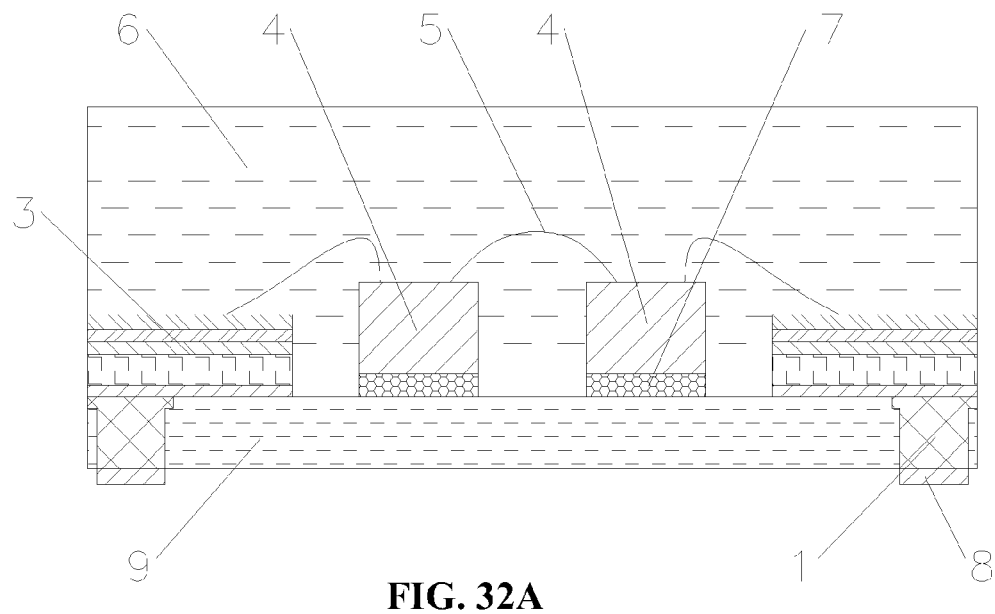
FIGS. 32A-32B illustrate another exemplary no-exposed-pad QFN packaging structure in accordance with one embodiment of the invention.
Figure 32B:
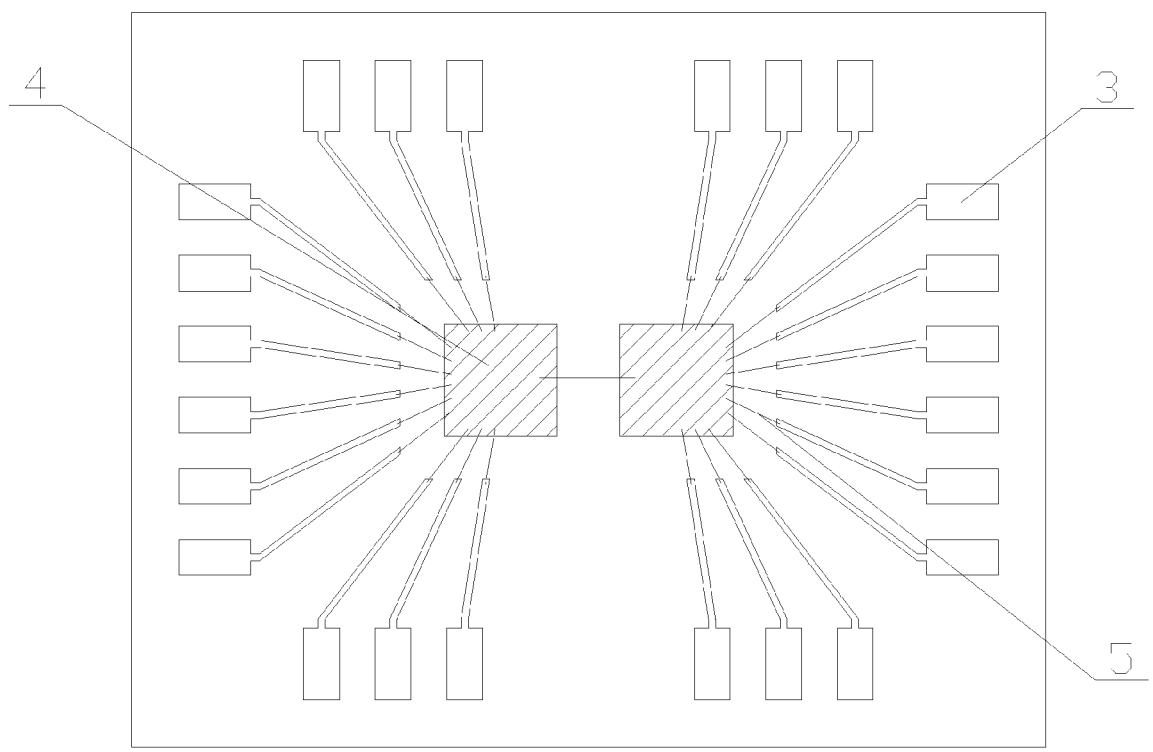

FIG. 32A and FIG. 32B illustrate another exemplary no-exposed-pad QFN packaging structure. FIG. 32A is a cross-section view of FIG. 32B.

As shown in FIG. 32A and FIG. 32B, the no-exposed-pad QFN packaging structure in FIG. 32A and FIG. 32B is similar to the no-exposed-pad QFN packaging structure in FIG. 16A and FIG. 16B. However, the no-exposed-pad QFN packaging structure in FIGS. 32A and 32B includes a plurality of dies 4. Each of the plurality of dies 4 is attached on predetermined areas on the substrate or other planar supporting structure or within the ring or rings of inner leads 3 by the conductive or non-conductive adhesive material 7. For example, a second die 4 is arranged in a side-by-side configuration with respect to the first die 4, and both dies 4 are arranged within the ring or rings of inner leads 3. Further, the top surface of each die 4 is connected by metal wires 5. Thus, a no-exposed-pad QFN packaging structure with multiple dies and a single lead ring is formed.

Figure 33A:
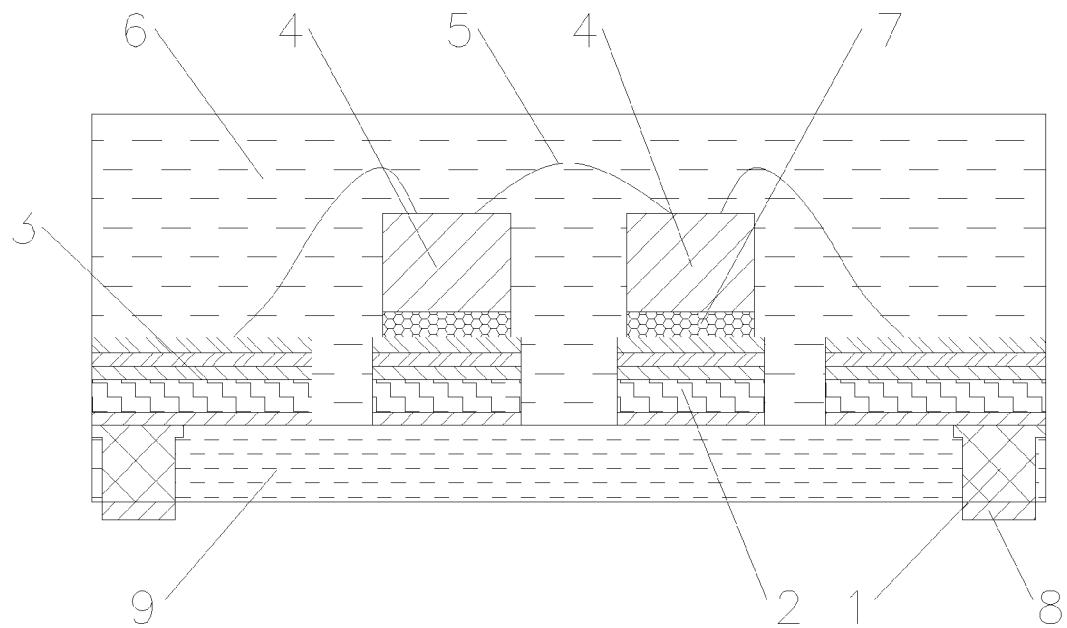
FIGS. 33A-33B illustrate another exemplary no-exposed-pad QFN packaging structure in accordance with one embodiment of the invention.
Figure 33B:
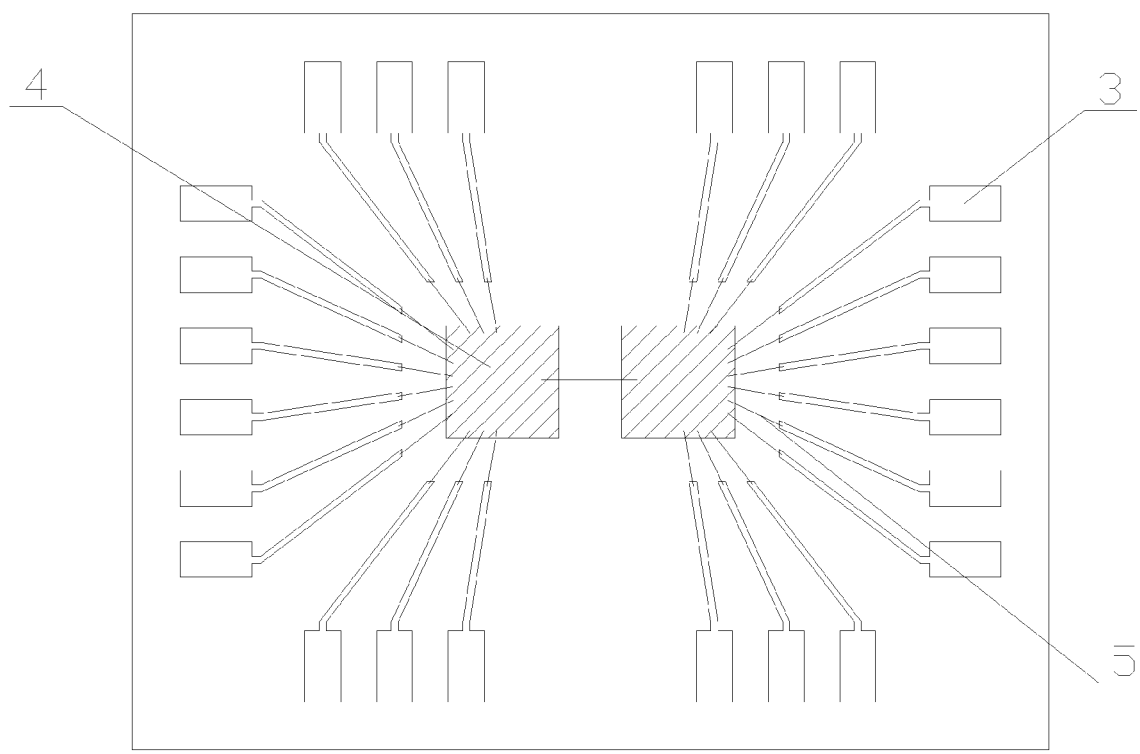

FIG. 33A and FIG. 33B illustrate another exemplary no-exposed-pad QFN packaging structure. FIG. 33A is a cross-section view of FIG. 33B.

As shown in FIG. 33A and FIG. 33B, the no-exposed-pad QFN packaging structure in FIG. 33A and FIG. 33B is similar to the no-exposed-pad QFN packaging structure in FIG. 32A and FIG. 32B. However, the no-exposed-pad QFN packaging structure in FIGS. 33A and 33B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, and a single lead ring is formed.

Figure 34A:
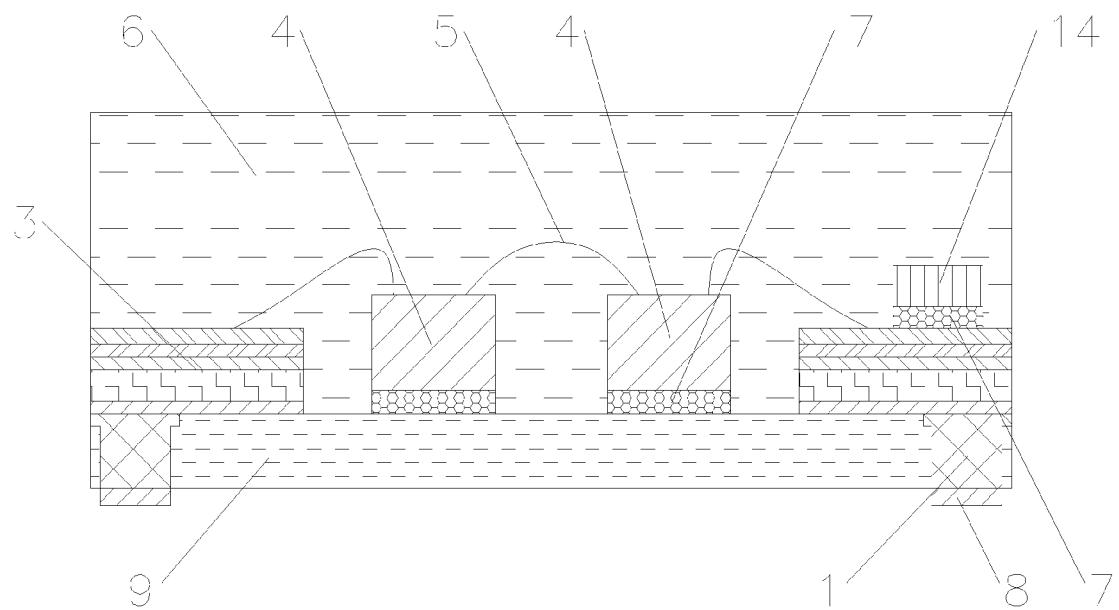
FIGS. 34A-34B illustrate another exemplary no-exposed-pad QFN packaging structure in accordance with one embodiment of the invention.
Figure 34B:
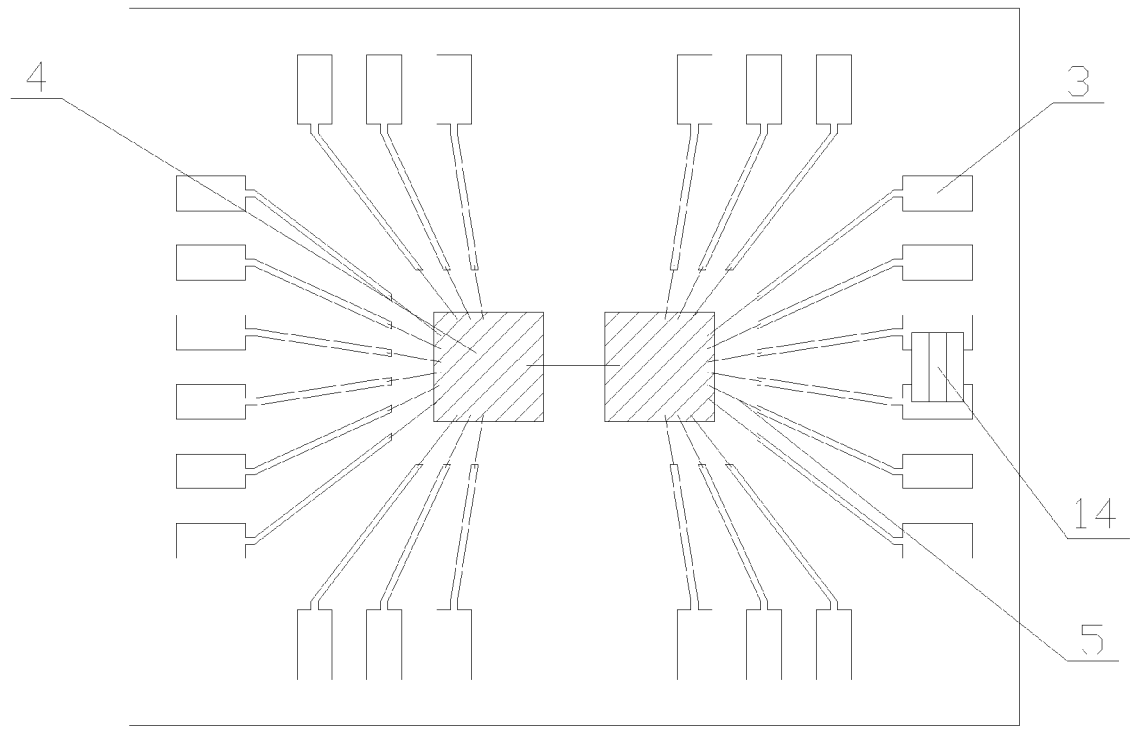

FIG. 34A and FIG. 34B illustrate another exemplary no-exposed-pad QFN packaging structure. FIG. 34A is a cross-section view of FIG. 34B.

As shown in FIG. 34A and FIG. 34B, the no-exposed-pad QFN packaging structure in FIG. 34A and FIG. 34B is similar to the no-exposed-pad QFN packaging structure in FIG. 18A and FIG. 18B. However, the no-exposed-pad QFN packaging structure in FIGS. 34A and 34B includes a plurality of dies 4. Each of the plurality of dies 4 is attached on predetermined areas on the substrate or other planar supporting structure or within the ring or rings of inner leads 3 by the conductive or non-conductive adhesive material 7. For example, a second die 4 is arranged in a side-by-side configuration with respect to the first die 4, and both dies 4 are arranged within the ring or rings of inner leads 3. Further, the top surface of each die 4 is connected by metal wires 5. Other configurations may also be used. Thus, a no-exposed-pad QFN packaging structure with multiple dies and a single lead ring coupled with a passive device is formed.

Figure 35A:
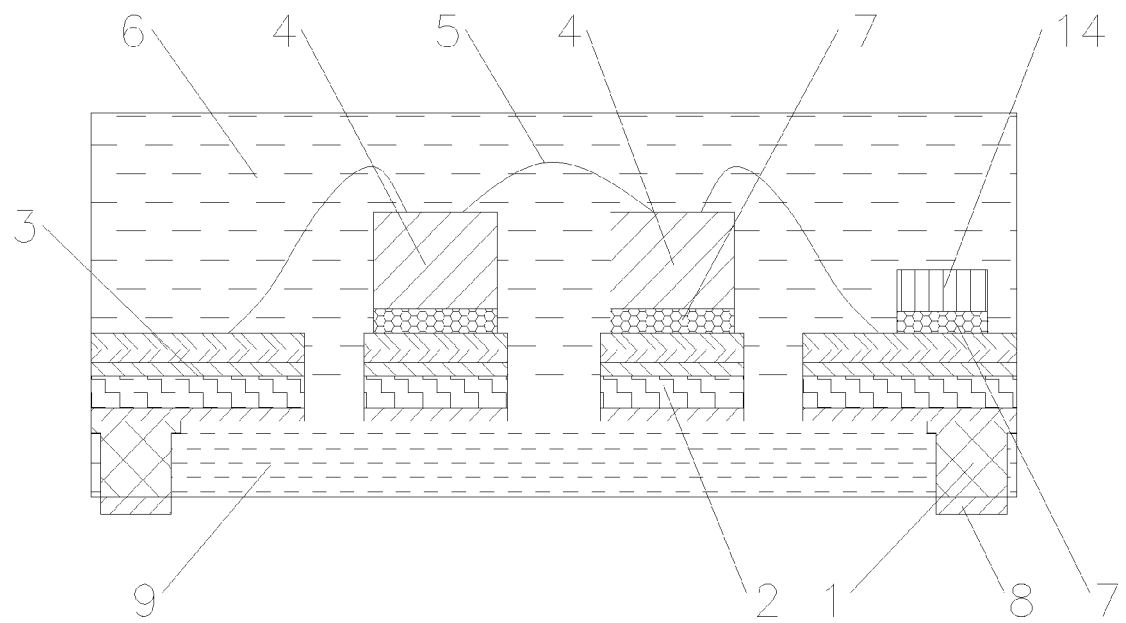
FIGS. 35A-35B illustrate another exemplary no-exposed-pad QFN packaging structure in accordance with one embodiment of the invention.
Figure 35B:
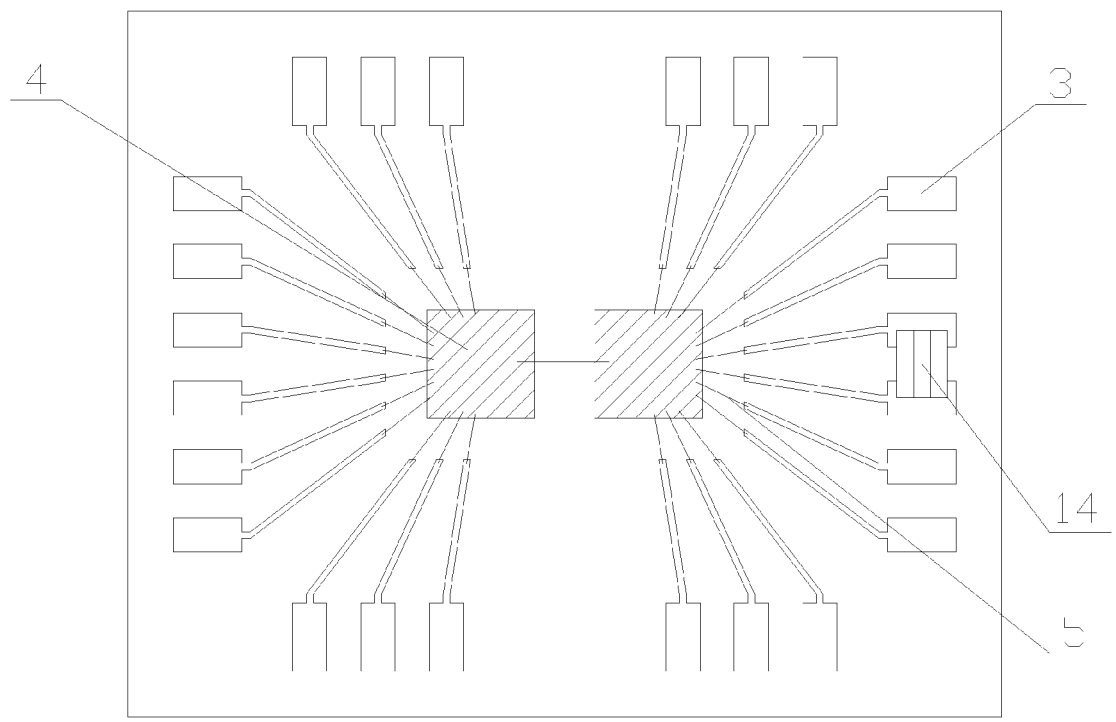

FIG. 35A and FIG. 35B illustrate another exemplary no-exposed-pad QFN packaging structure. FIG. 35A is a cross-section view of FIG. 35B.

As shown in FIG. 35A and FIG. 35B, the no-exposed-pad QFN packaging structure in FIG. 35A and FIG. 35B is similar to the no-exposed-pad QFN packaging structure in FIG. 34A and FIG. 34B. However, the no-exposed-pad QFN packaging structure in FIGS. 35A and 35B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, and a single lead ring coupled with a passive device is formed.

Figure 36A:
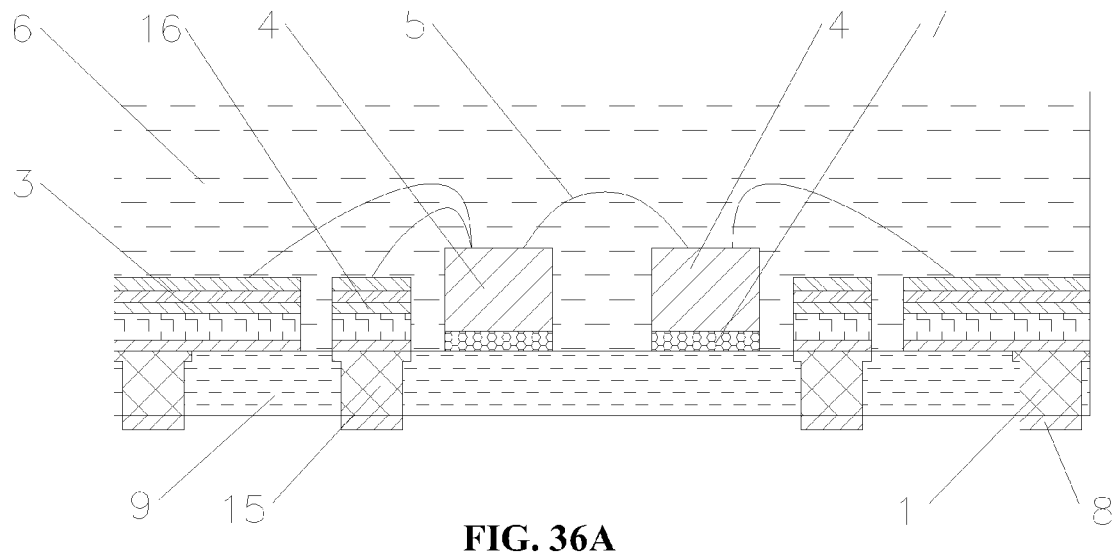
FIGS. 36A-36B illustrate another exemplary no-exposed-pad QFN packaging structure in accordance with one embodiment of the invention.
Figure 36B:
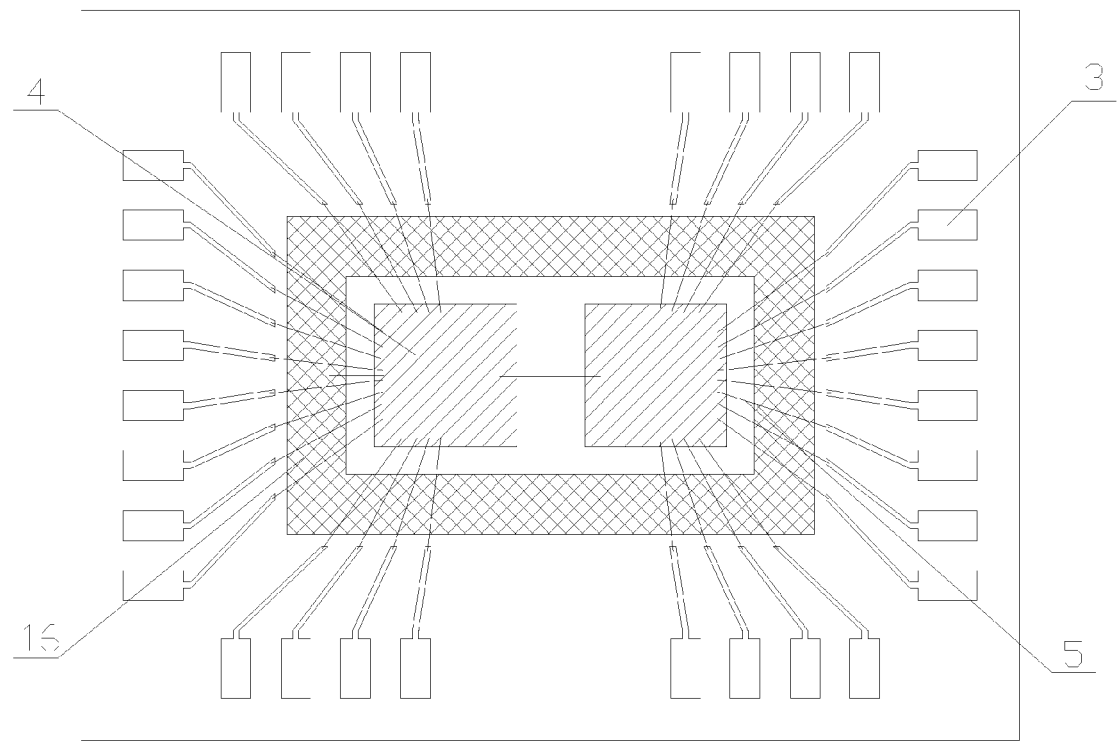

FIG. 36A and FIG. 36B illustrate another exemplary no-exposed-pad QFN packaging structure. FIG. 36A is a cross-section view of FIG. 36B.

As shown in FIG. 36A and FIG. 36B, the no-exposed-pad QFN packaging structure in FIG. 36A and FIG. 36B is similar to the no-exposed-pad QFN packaging structure in FIG. 20A and FIG. 20B. However, the no-exposed-pad QFN packaging structure in FIGS. 36A and 36B includes a plurality of dies 4. Each of the plurality of dies 4 is attached on predetermined areas on the substrate or other planar supporting structure or within the ring or rings of inner leads 3 by the conductive or non-conductive adhesive material 7. For example, a second die 4 is arranged in a side-by-side configuration with respect to the first die 4, and both dies 4 are arranged within the ring or rings of inner leads 3. Further, the top surface of each die 4 is connected by metal wires 5. Other configurations may also be used. Thus, a no-exposed-pad QFN packaging structure with multiple dies, a single lead ring, and an electrostatic discharge ring is formed.

Figure 37A:
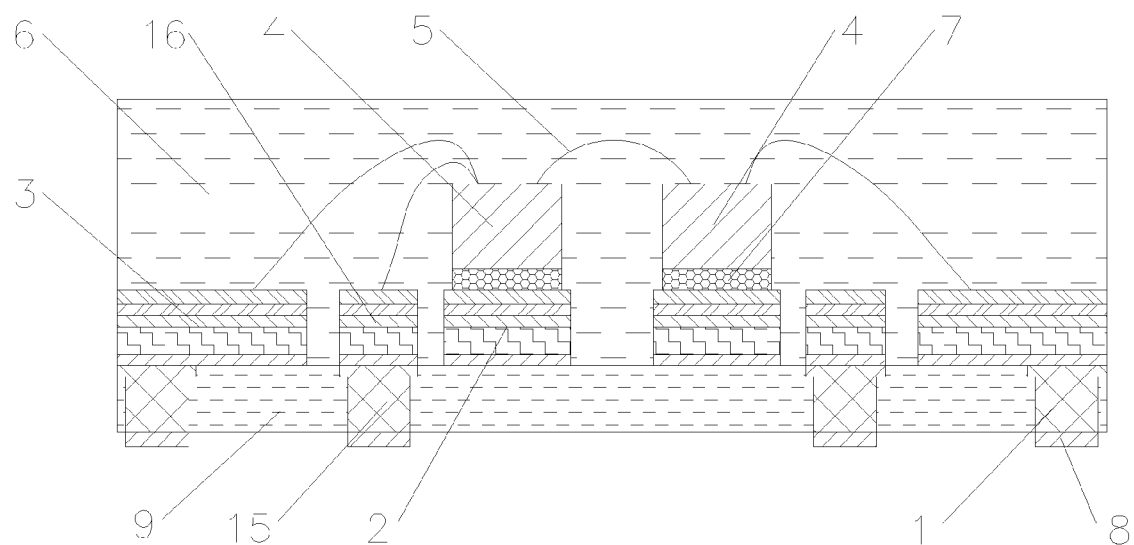
FIGS. 37A-37B illustrate another exemplary no-exposed-pad QFN packaging structure in accordance with one embodiment of the invention.
Figure 37B:
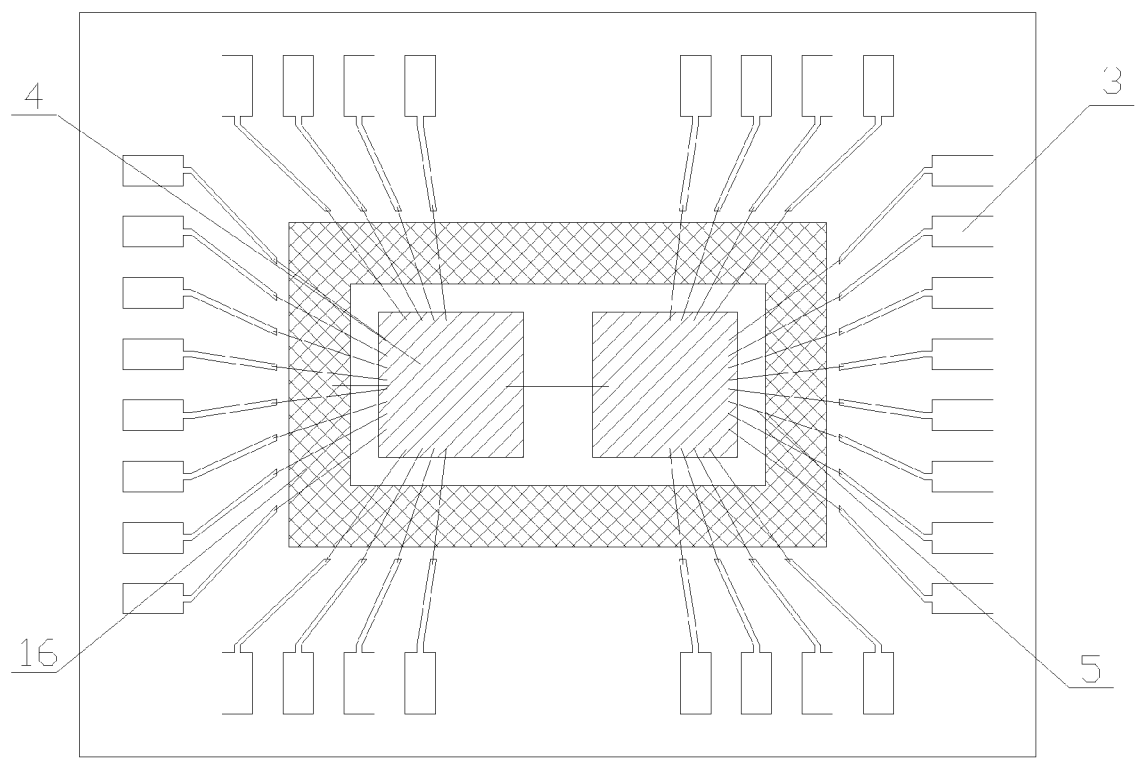

FIG. 37A and FIG. 37B illustrate another exemplary no-exposed-pad QFN packaging structure. FIG. 37A is a cross-section view of FIG. 37B.

As shown in FIG. 37A and FIG. 37B, the no-exposed-pad QFN packaging structure in FIG. 37A and FIG. 37B is similar to the no-exposed-pad QFN packaging structure in FIG. 36A and FIG. 36B. However, the no-exposed-pad QFN packaging structure in FIGS. 37A and 37B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, a single lead ring, and an electrostatic discharge ring may be formed.

Figure 38A:
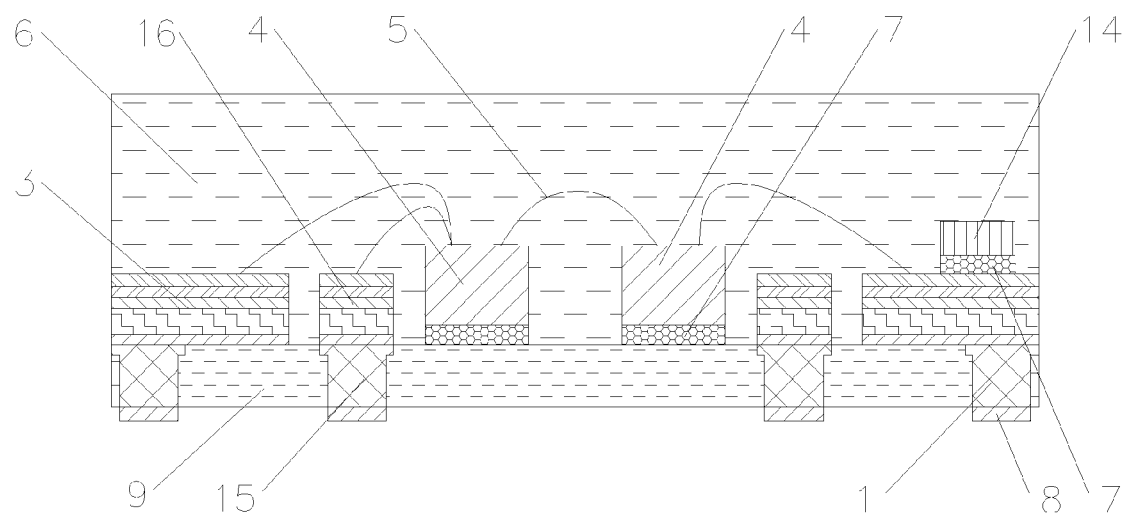
FIGS. 38A-38B illustrate another exemplary no-exposed-pad QFN packaging structure in accordance with one embodiment of the invention.
Figure 38B:
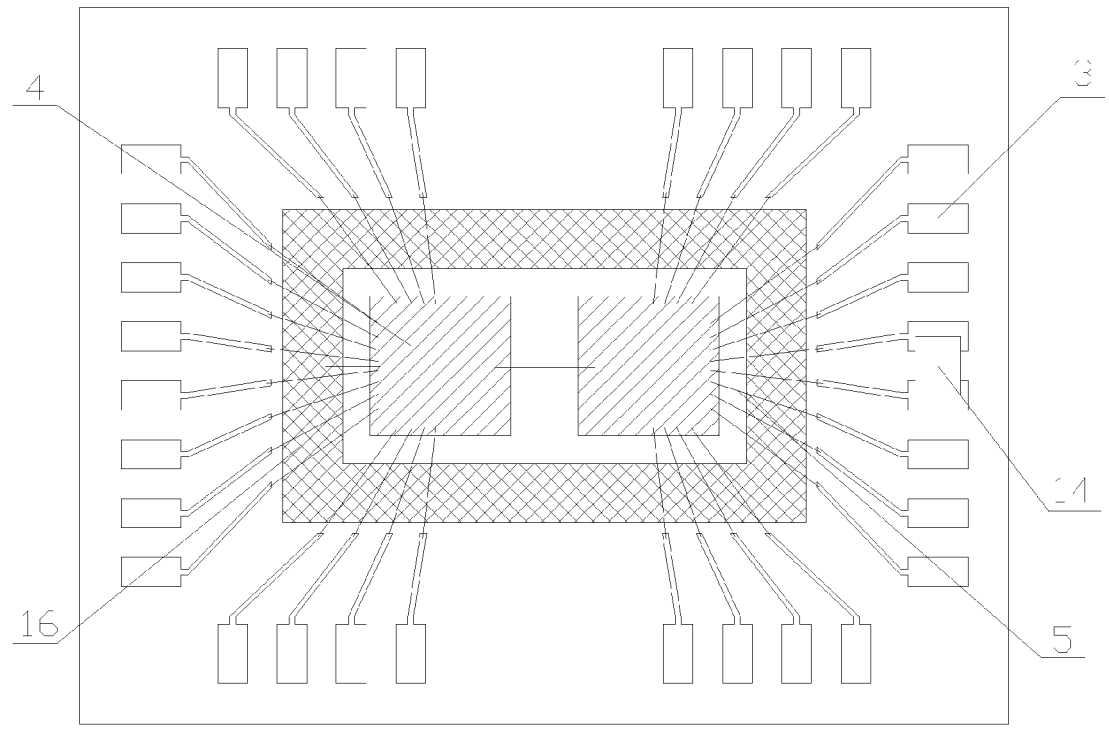

FIG. 38A and FIG. 38B illustrate another exemplary no-exposed-pad QFN packaging structure. FIG. 38A is a cross-section view of FIG. 38B.

As shown in FIG. 38A and FIG. 38B, the no-exposed-pad QFN packaging structure in FIG. 38A and FIG. 38B is similar to the no-exposed-pad QFN packaging structure in FIG. 22A and FIG. 22B. However, the no-exposed-pad QFN packaging structure in FIGS. 38A and 38B includes a plurality of dies 4. Each of the plurality of dies 4 is attached on predetermined areas on the substrate or other planar supporting structure or within the ring or rings of inner leads 3 by the conductive or non-conductive adhesive material 7. For example, a second die 4 is arranged in a side-by-side configuration with respect to the first die 4, and both dies 4 are arranged within the ring or rings of inner leads 3. Further, the top surface of each die 4 is connected by metal wires 5. Other configurations may also be used. Thus, a no-exposed-pad QFN packaging structure with multiple dies, a single lead ring coupled with a passive device, and an electrostatic discharge ring is formed.

Figure 39A:
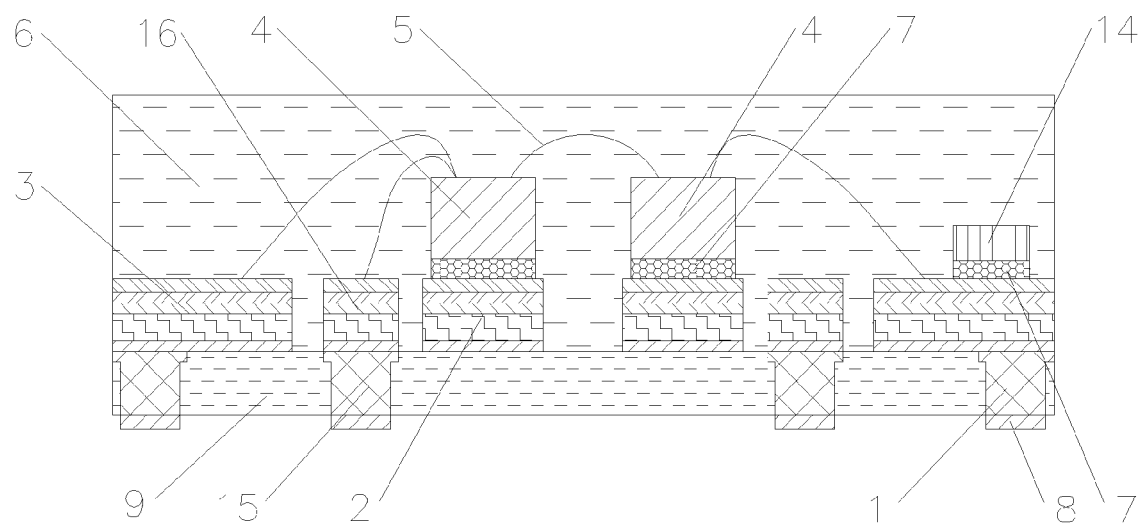
FIGS. 39A-39B illustrate another exemplary no-exposed-pad QFN packaging structure in accordance with one embodiment of the invention.
Figure 39B:
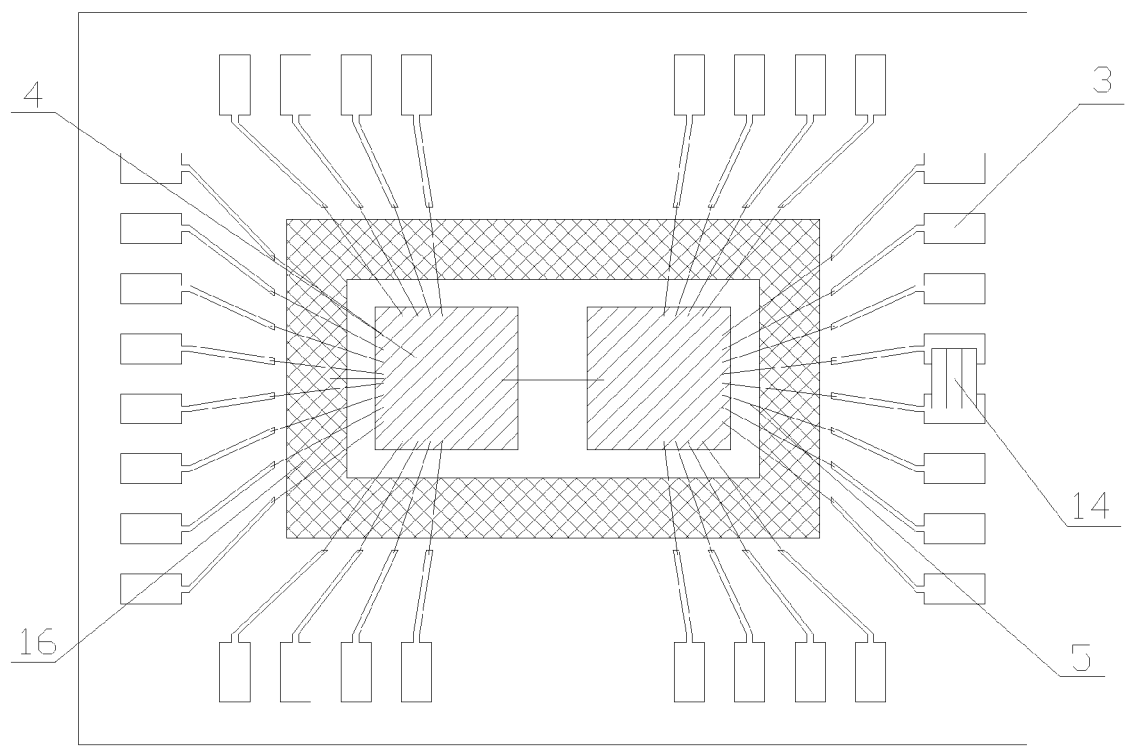

FIG. 39A and FIG. 39B illustrate another exemplary no-exposed-pad QFN packaging structure. FIG. 39A is a cross-section view of FIG. 39B.

As shown in FIG. 39A and FIG. 39B, the no-exposed-pad QFN packaging structure in FIG. 39A and FIG. 39B is similar to the no-exposed-pad QFN packaging structure in FIG. 38A and FIG. 38B. However, the no-exposed-pad QFN packaging structure in FIGS. 39A and 39B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad with multiple dies, multiple inner die pads, a single lead ring coupled with a passive device, and an electrostatic discharge ring is formed.

Figure 40A:
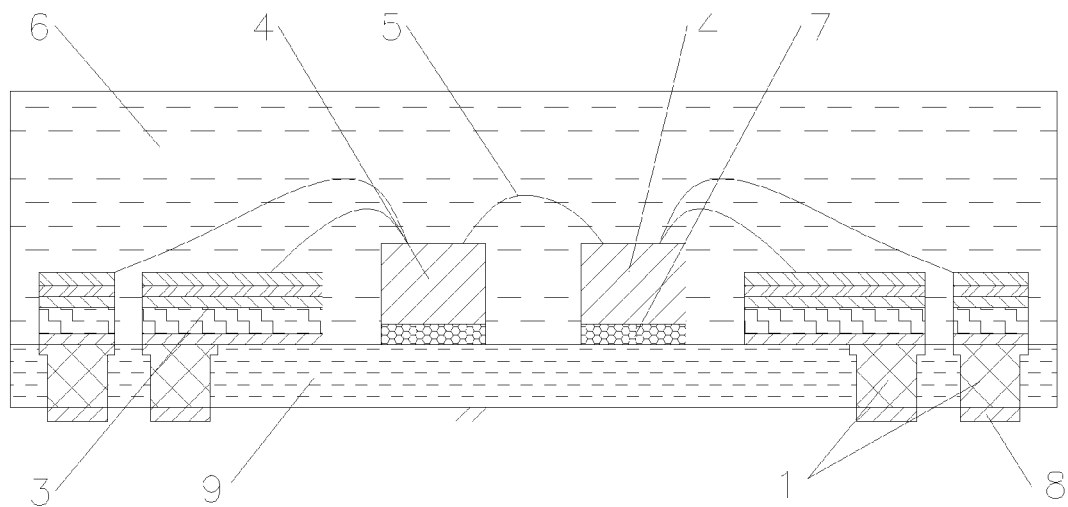
FIGS. 40A-40B illustrate another exemplary no-exposed-pad QFN packaging structure in accordance with one embodiment of the invention.
Figure 40B:
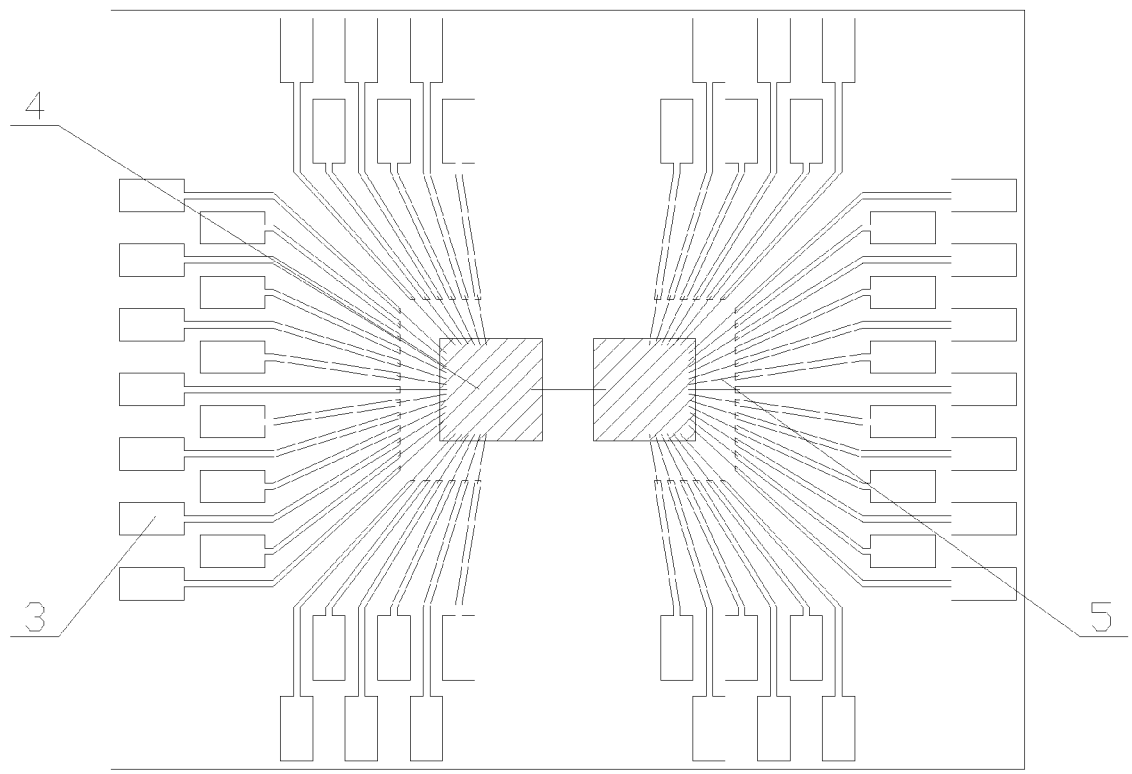

FIG. 40A and FIG. 40B illustrate another exemplary no-exposed-pad QFN packaging structure. FIG. 40A is a cross-section view of FIG. 40B.

As shown in FIG. 40A and FIG. 40B, the no-exposed-pad QFN packaging structure in FIG. 40A and FIG. 40B is similar to the no-exposed-pad QFN packaging structure in FIG. 32A and FIG. 32B. However, the no-exposed-pad QFN packaging structure in FIGS. 40A and 40B includes multiple rings of I/O pads 1. In other words, the I/O pads 1 are arranged in a multiple-ring configuration. Further, multiple rings of inner leads 3 is formed on the top surface of the I/O pads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings is significantly reduced. Thus, a no-exposed-pad QFN packaging structure with multiple dies and multiple lead rings is formed.

Figure 41A:
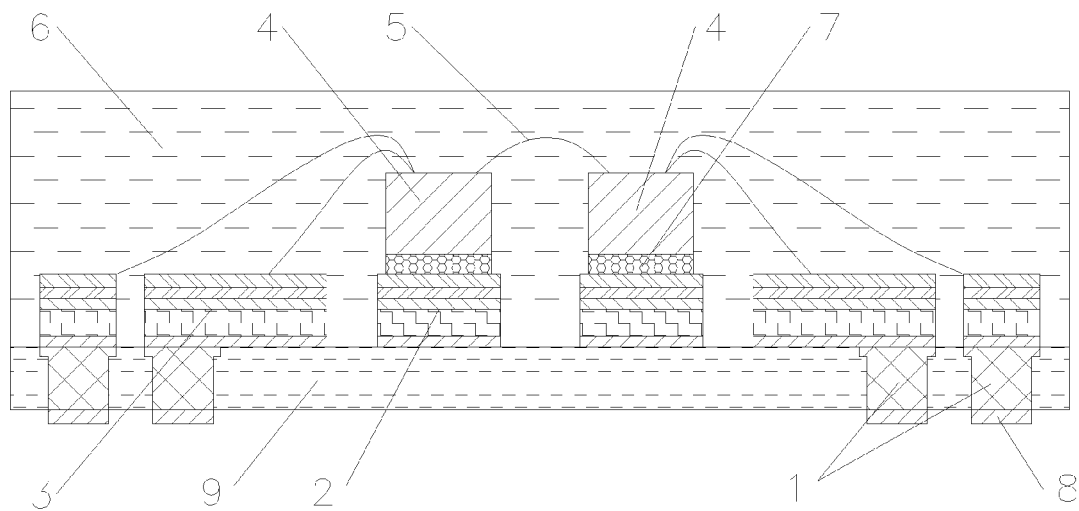
FIGS. 41A-41B illustrate another exemplary no-exposed-pad QFN packaging structure in accordance with one embodiment of the invention.
Figure 41B:
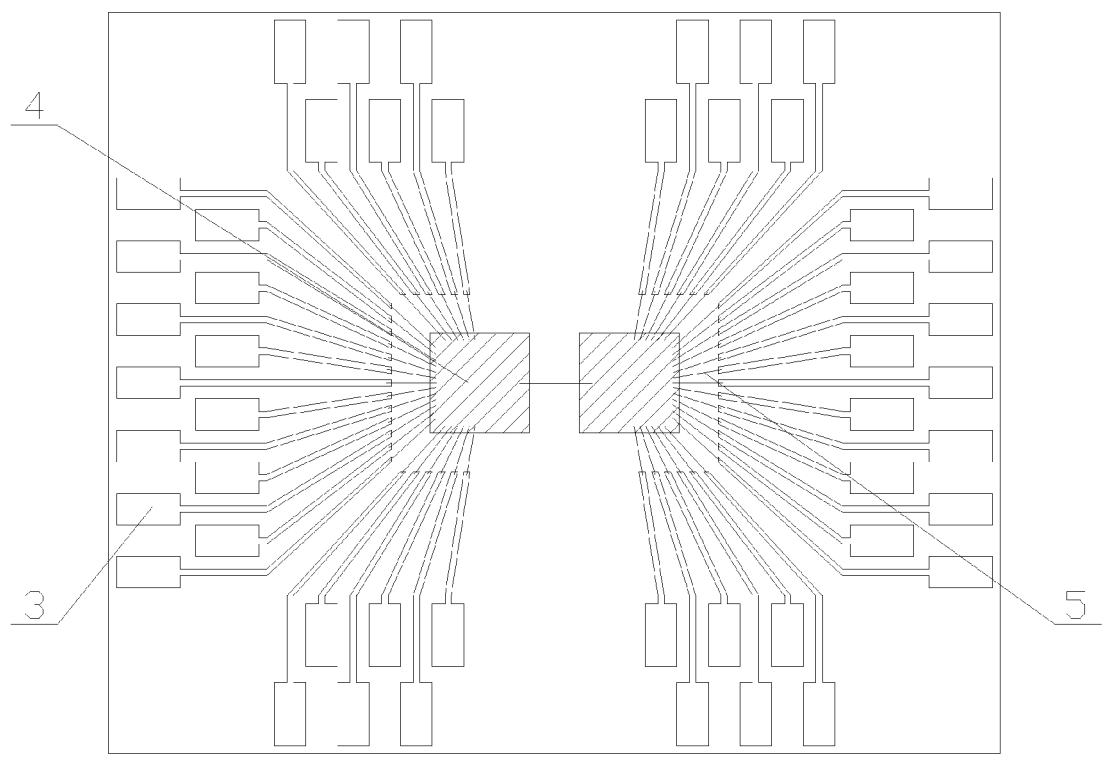

FIG. 41A and FIG. 41B illustrate another exemplary no-exposed-pad QFN packaging structure. FIG. 41A is a cross-section view of FIG. 41B.

As shown in FIG. 41A and FIG. 41B, the no-exposed-pad QFN packaging structure in FIG. 41A and FIG. 41B is similar to the no-exposed-pad QFN packaging structure in FIG. 40A and FIG. 40B. However, the no-exposed-pad QFN packaging structure in FIGS. 41A and 41B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, and multiple lead rings is formed.

Figure 42A:
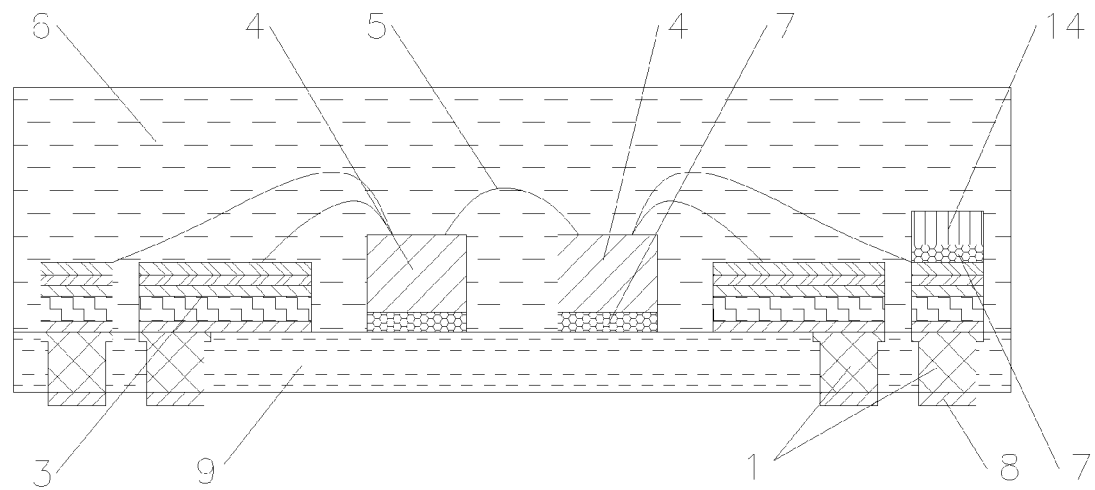
FIGS. 42A-42B illustrate another exemplary no-exposed-pad QFN packaging structure in accordance with one embodiment of the invention.
Figure 42B:
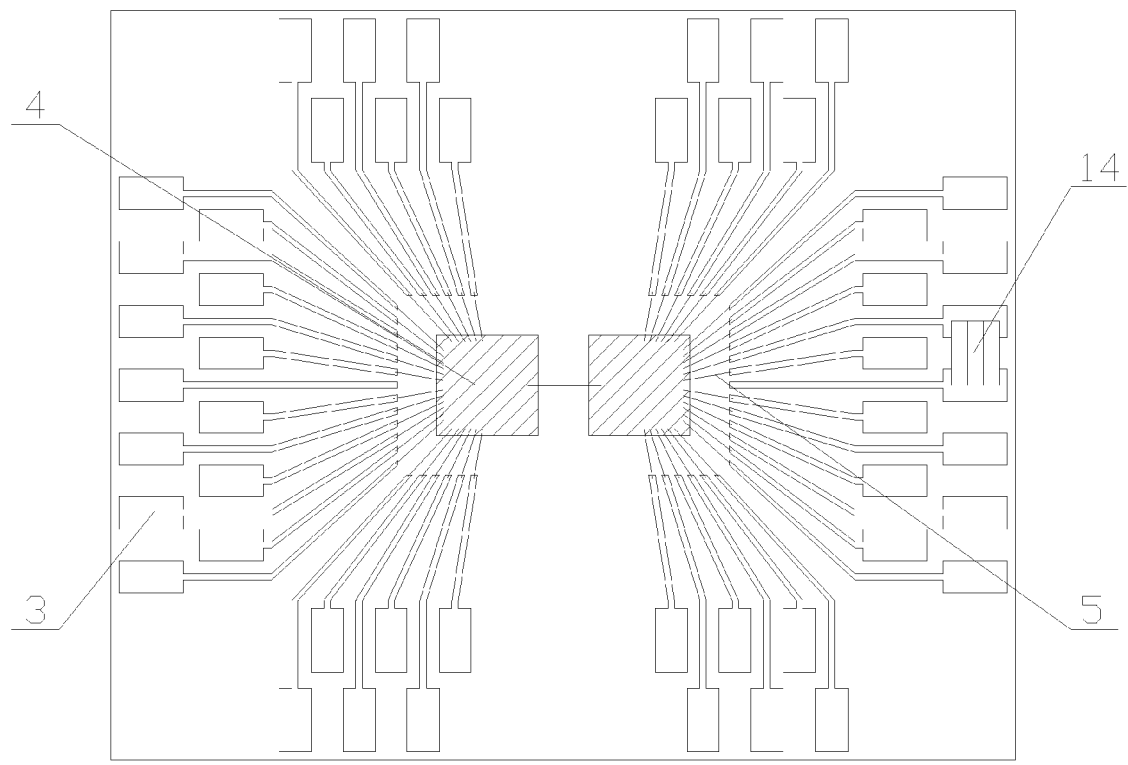

FIG. 42A and FIG. 42B illustrate another exemplary no-exposed-pad QFN packaging structure. FIG. 42A is a cross-section view of FIG. 42B.

As shown in FIG. 42A and FIG. 42B, the no-exposed-pad QFN packaging structure in FIG. 42A and FIG. 42B is similar to the no-exposed-pad QFN packaging structure in FIG. 34A and FIG. 34B. However, the no-exposed-pad QFN packaging structure in FIGS. 42A and 42B includes multiple rings of I/O pads 1. In other words, the I/O pads 1 are arranged in a multiple-ring configuration. Further, multiple rings of inner leads 3 is formed on the top surface of the I/O pads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings is significantly reduced. Thus, a no-exposed-pad QFN packaging structure with multiple dies and multiple lead rings coupled with a passive device are formed.

Figure 43A:
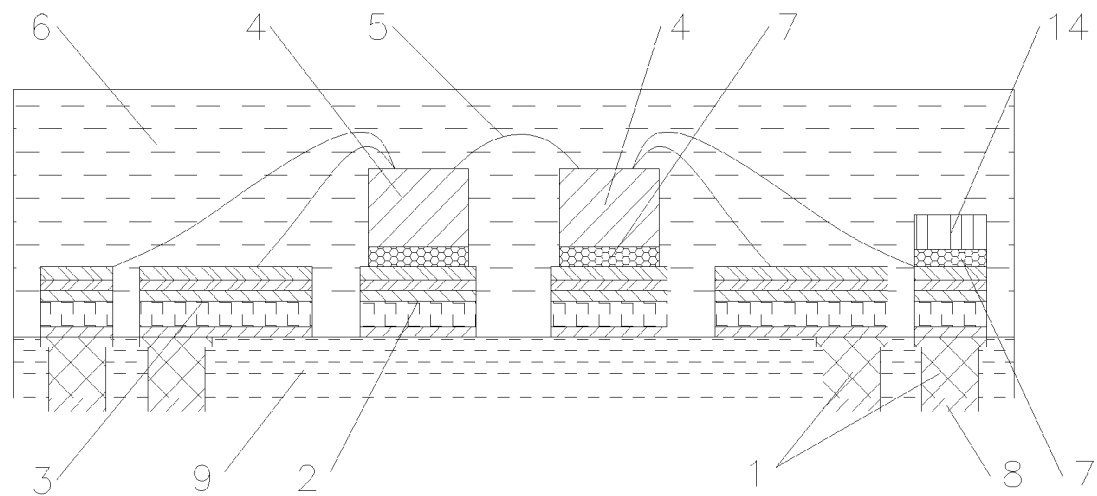
FIGS. 43A-43B illustrate another exemplary no-exposed-pad QFN packaging structure in accordance with one embodiment of the invention.
Figure 43B:
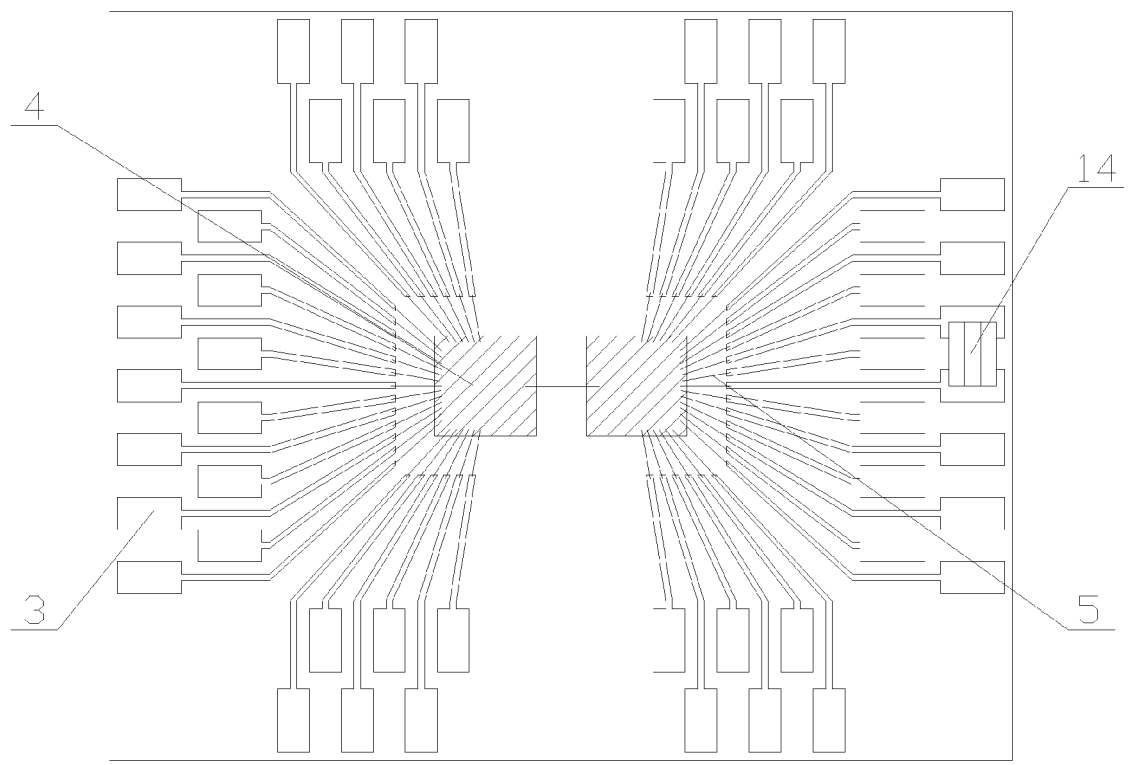

FIG. 43A and FIG. 43B illustrate another exemplary no-exposed-pad QFN packaging structure. FIG. 43A is a cross-section view of FIG. 43B.

As shown in FIG. 43A and FIG. 43B, the no-exposed-pad QFN packaging structure in FIG. 43A and FIG. 43B is similar to the no-exposed-pad QFN packaging structure in FIG. 42A and FIG. 42B. However, the no-exposed-pad QFN packaging structure in FIGS. 43A and 43B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, and multiple lead rings coupled with a passive device are formed.

Figure 44A:
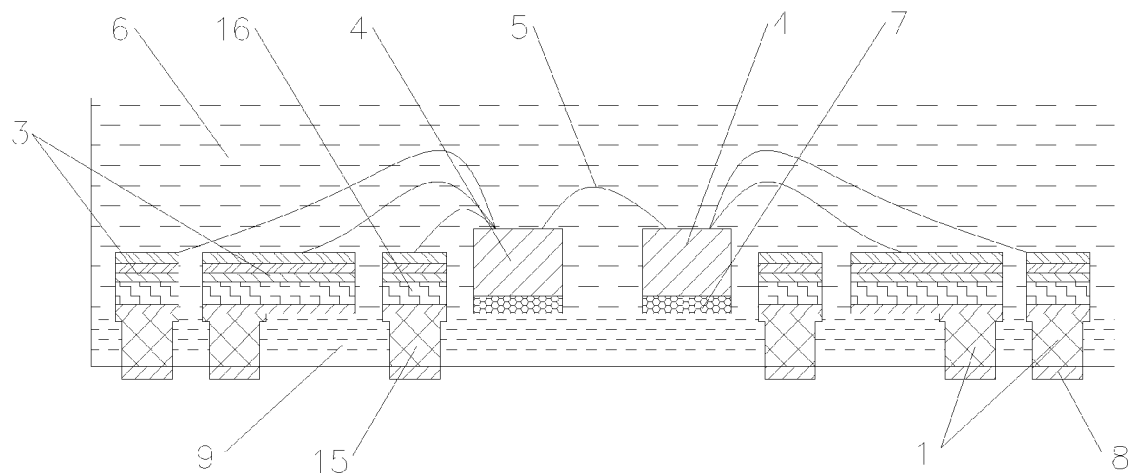
FIGS. 44A-44B illustrate another exemplary no-exposed-pad QFN packaging structure in accordance with one embodiment of the invention.
Figure 44B:
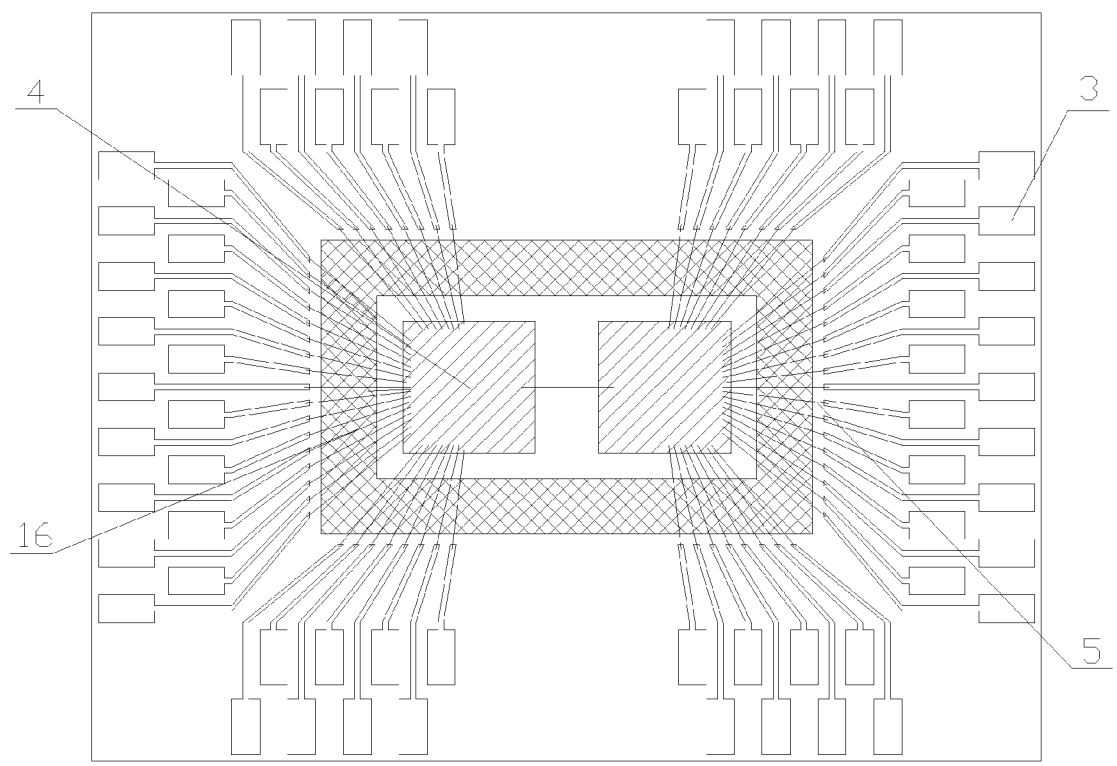

FIG. 44A and FIG. 44B illustrate another exemplary no-exposed-pad QFN packaging structure. FIG. 44A is a cross-section view of FIG. 44B.

As shown in FIG. 44A and FIG. 44B, the no-exposed-pad QFN packaging structure in FIG. 44A and FIG. 44B is similar to the no-exposed-pad QFN packaging structure in FIG. 36A and FIG. 36B. However, the no-exposed-pad QFN packaging structure in FIGS. 44A and 44B includes multiple rings of I/O pads 1. In other words, the I/O pads 1 are arranged in a multiple-ring configuration. Further, multiple rings of inner leads 3 is formed on the top surface of the I/O pads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings is significantly reduced. Thus, a no-exposed-pad QFN packaging structure with multiple dies, multiple lead rings, and an electrostatic discharge ring is formed.

Figure 45A:
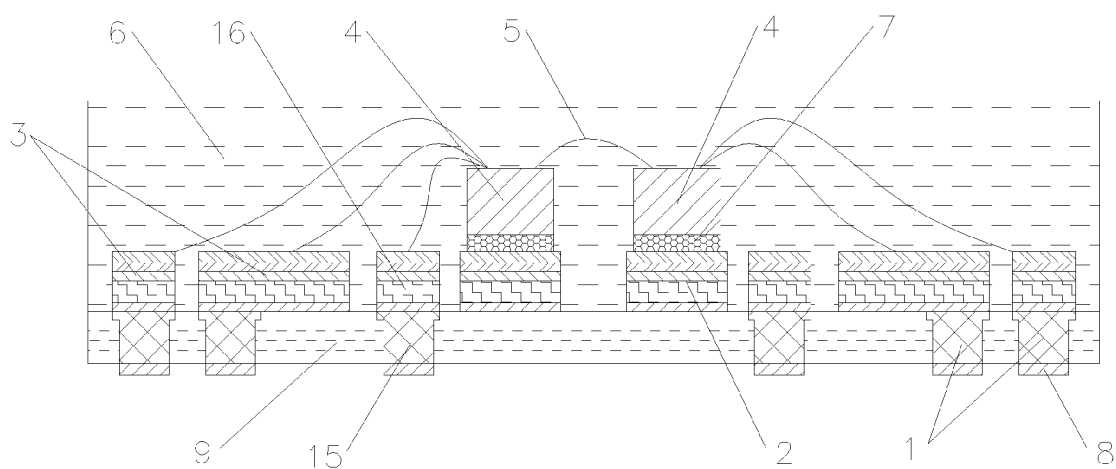
FIGS. 45A-45B illustrate another exemplary no-exposed-pad QFN packaging structure in accordance with one embodiment of the invention.
Figure 45B:
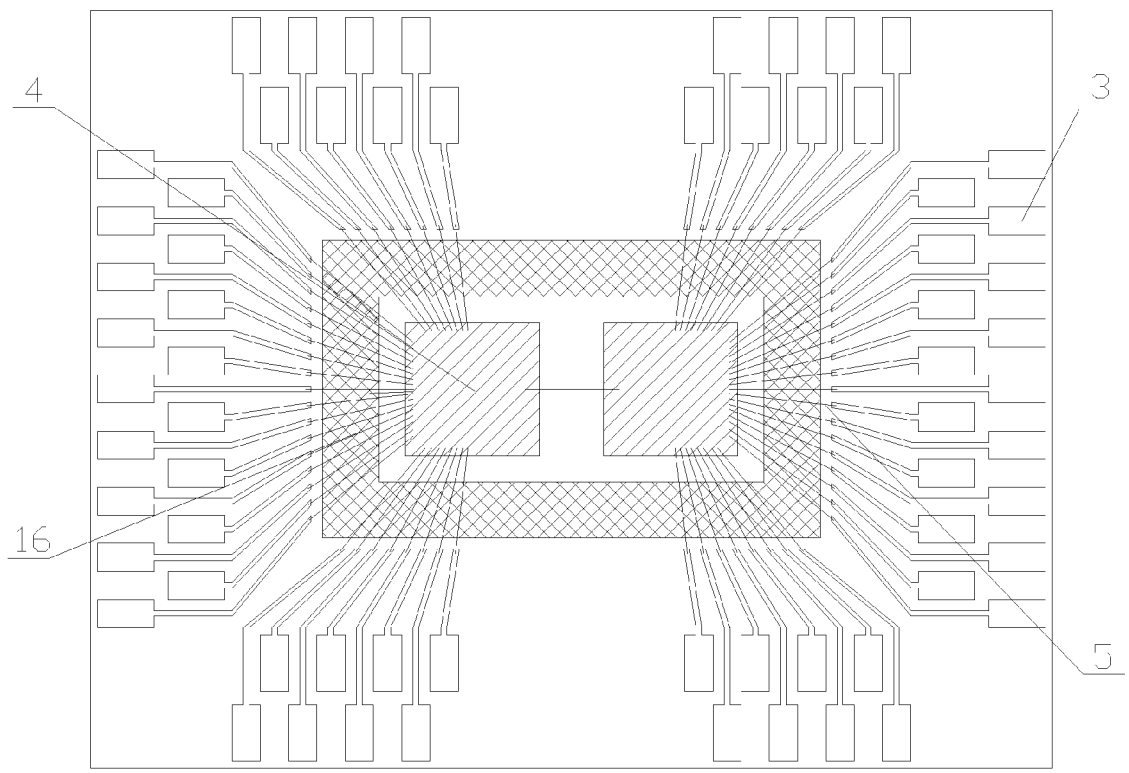

FIG. 45A and FIG. 45B illustrate another exemplary no-exposed-pad QFN packaging structure. FIG. 45A is a cross-section view of FIG. 45B.

As shown in FIG. 45A and FIG. 45B, the no-exposed-pad QFN packaging structure in FIG. 45A and FIG. 45B is similar to the no-exposed-pad QFN packaging structure in FIG. 44A and FIG. 44B. However, the no-exposed-pad QFN packaging structure in FIGS. 45A and 45B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, multiple lead rings, and an electrostatic discharge ring is formed.

Figure 46A:
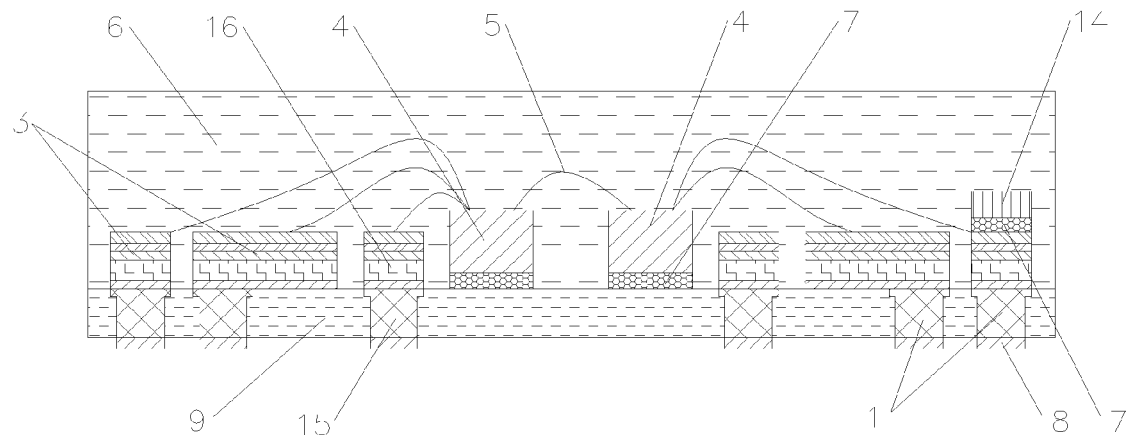
FIGS. 46A-46B illustrate another exemplary no-exposed-pad QFN packaging structure in accordance with one embodiment of the invention.
Figure 46B:
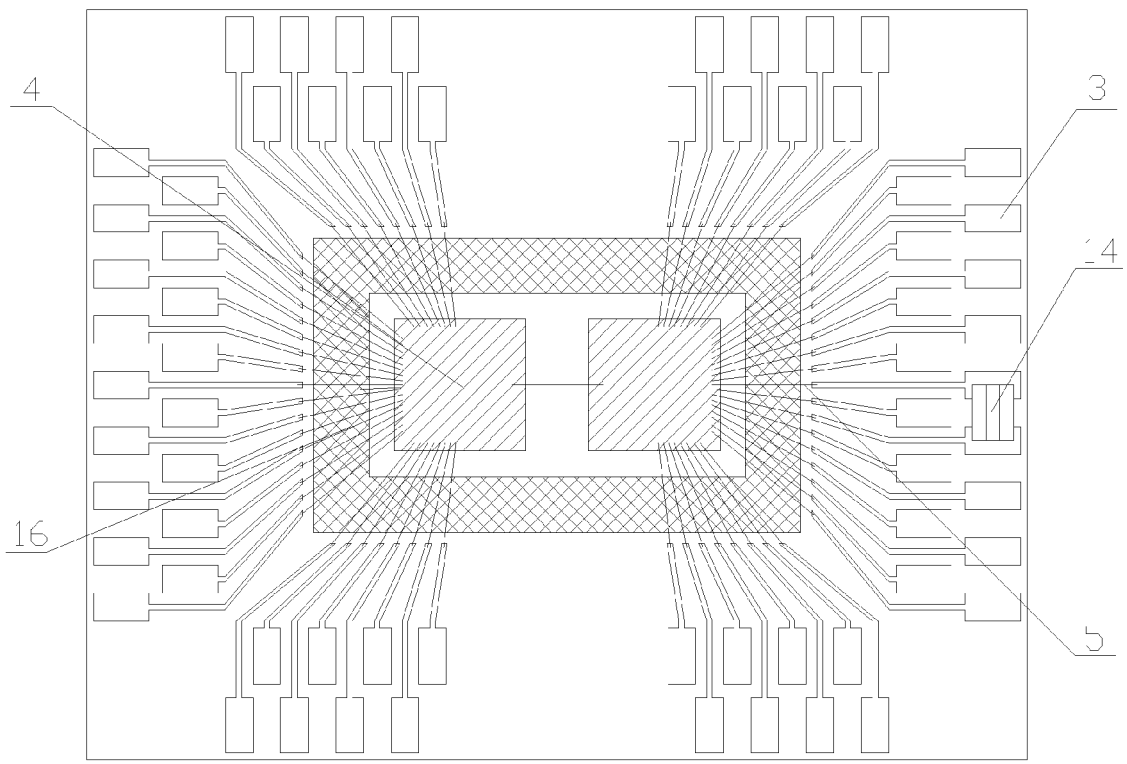

FIG. 46A and FIG. 46B illustrate another exemplary no-exposed-pad QFN packaging structure. FIG. 46A is a cross-section view of FIG. 46B.

As shown in FIG. 46A and FIG. 46B, the no-exposed-pad QFN packaging structure in FIG. 46A and FIG. 46B is similar to the no-exposed-pad QFN packaging structure in FIG. 38A and FIG. 38B. However, the no-exposed-pad QFN packaging structure in FIGS. 46A and 46B includes multiple rings of I/O pads 1. In other words, the I/O pads 1 are arranged in a multiple-ring configuration. Further, multiple rings of inner leads 3 is formed on the top surface of the I/O pads 1. That is, multiple rings of inner leads 3 may also be formed by the multi-layer plating process for forming the first metal layer 13. Because the multiple rings of inner leads 3 are formed by the multi-layer plating process, the lead pitch of inner leads from a same ring and the lead pitch of inner leads from different rings is significantly reduced. Thus, a no-exposed-pad QFN packaging structure with multiple dies, multiple lead rings coupled with a passive device, and an electrostatic discharge ring is formed.

Figure 47A:
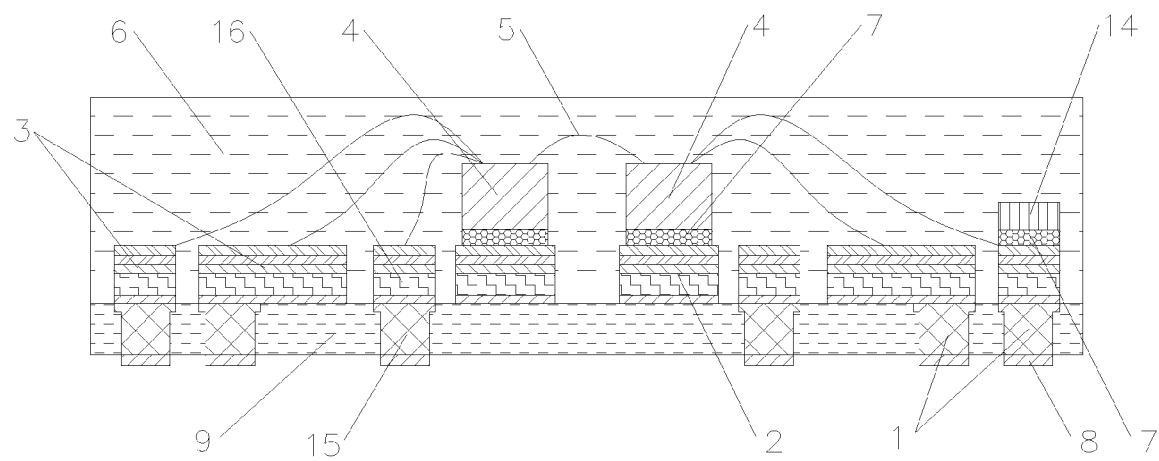
FIGS. 47A-47B illustrate another exemplary no-exposed-pad QFN packaging structure in accordance with one embodiment of the invention.
Figure 47B:
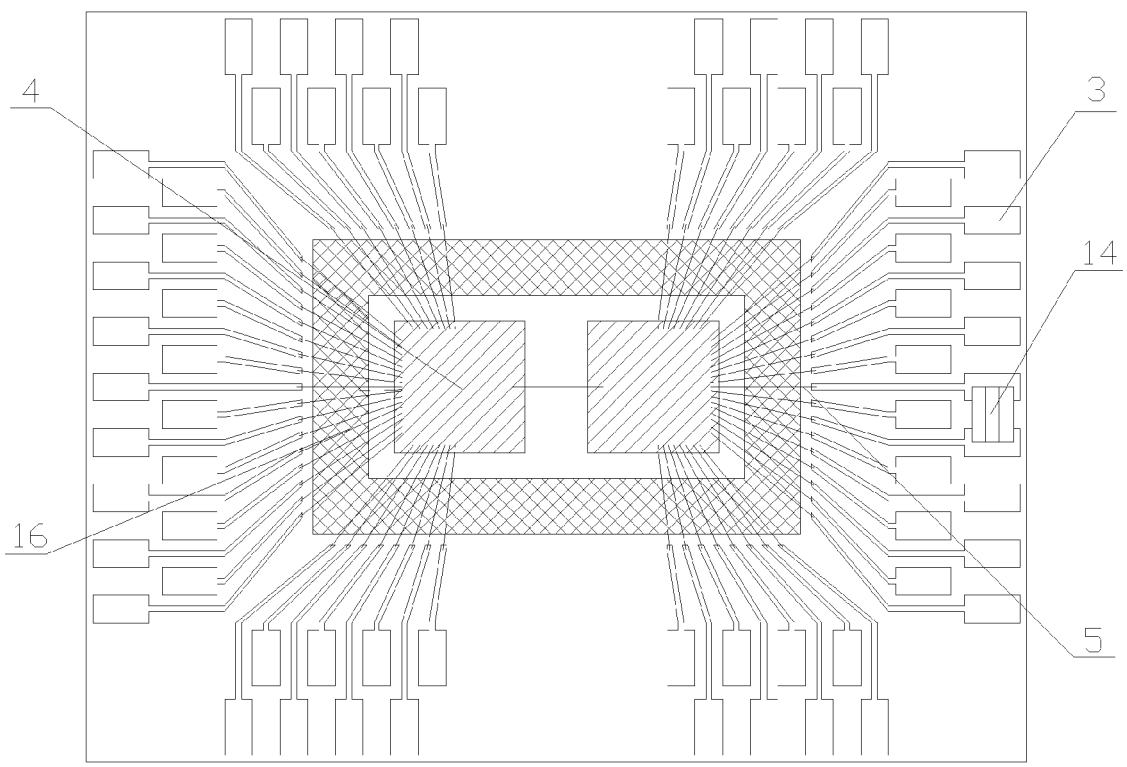
Figure 48:
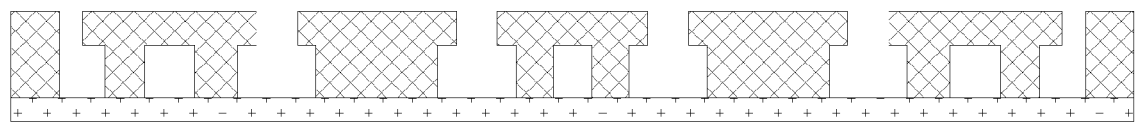
FIG. 48 shows a high-temperature resistant film affixed on a lead frame.
Figure 49:
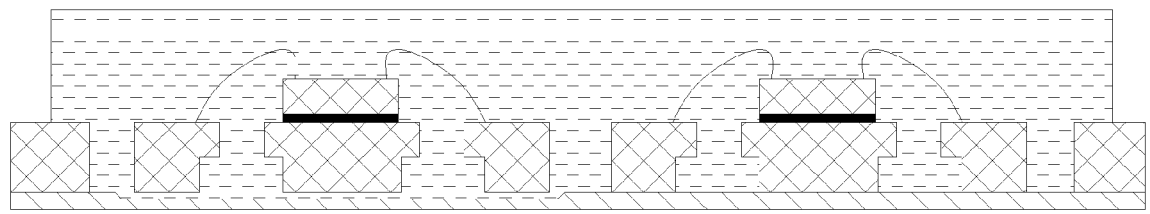
FIG. 49 shows mold bleeding between the lead frame and the high-temperature resistant film.
Figure 50:
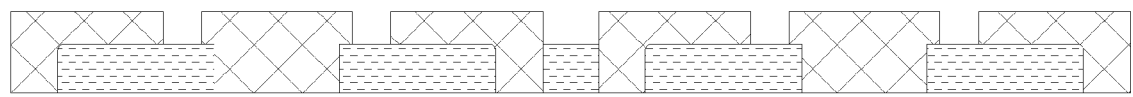
FIG. 50 shows a two-side etched lead frame.

FIG. 47A and FIG. 47B illustrate another exemplary no-exposed-pad QFN packaging structure. FIG. 47A is a cross-section view of FIG. 47B.

As shown in FIG. 47A and FIG. 47B, the no-exposed-pad QFN packaging structure in FIG. 47A and FIG. 47B is similar to the no-exposed-pad QFN packaging structure in FIG. 46A and FIG. 46B. However, the no-exposed-pad QFN packaging structure in FIGS. 47A and 47B includes a plurality of inner die pads 2 formed on the predetermined areas for attaching the dies 4 or within a ring or rings of inner leads 3. The plurality of inner die pads 2 may also be formed by the multi-layer plating process for forming the inner leads 3. Thus, the plurality of inner die pads 2 may also be included in the first metal layer 13. Further, the plurality of dies 4 are attached at the top surface of the corresponding plurality of inner die pads 2 via the conductive or non-conductive adhesive material 7. Thus, a no-exposed-pad QFN packaging structure with multiple dies, multiple inner die pads, multiple lead rings coupled with a passive device, and an electrostatic discharge ring is formed.

By using the disclosed methods, processes, and devices, various advantageous applications are implemented. For example, using the disclosed processes and devices, separate etching processes on both sides of the metal substrate can be avoided, and the process cost, time, personnel, power, and materials can be reduced. At the same time, the amount of potential environment-harmful substances generated in the etching processes can also be reduced. Further, because the use of the thin-line plating method on the top surface of the substrate, the minimum width of the inner leads is approximately 25 μm, and the lead pitch of the inner leads is as small as approximately 25 μm. Thus, the lead density in the lead frame can be significantly increased.

By using the disclosed processes and devices, only lead frame is involved in the die attaching process and wire bonding process. Thus, the lead frame is tolerant substantially high temperature, such as in a range of approximately 380-420 Celsius degrees, without warping.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

The invention claimed is:

1. A method for manufacturing a no-exposed-pad quad flat no-lead (QFN) packaging structure, comprising:
   a) providing a metal substrate;
   b) forming a first photoresist film on a top surface of the metal substrate;
   c) forming a plating pattern in the first photoresist film using photolithography;
   d) forming a first metal layer comprising a plurality of inner leads by a multi-layer electrical plating process using the plating pattern in the first photoresist film as a mask, wherein each of the plurality of inner leads comprises a bottom layer, at least one middle layer, and a top layer; the bottom layer is erosion resistant; and the bottom layer is connected to the metal substrate;

e) attaching at least one die in a predetermined region on the top surface of the metal substrate;
f) connecting the die and the top layers of the plurality of inner leads using metal wires;
g) sealing the die, the plurality of inner leads, and the metal wires with a molding compound;
h) etching the metal substrate from a back surface of the metal substrate to form a plurality of I/O pads corresponding to the plurality of inner leads; and
i) forming a second metal layer on a back surface of the plurality of I/O pads.

2. The method of claim 1, further comprises: forming a second photoresist film on the back surface of the metal substrate to protect the metal substrate.

3. The method of claim 2, wherein forming the first metal layer further comprises: removing the first photoresist film and the second photoresist film.

4. The method of claim 3, wherein etching the metal substrate further comprises:
forming a third photoresist film on the back surface of the metal substrate;
forming an etching pattern in the third photoresist film using photolithography; and
etching the metal substrate using the etching pattern in the third photoresist film on the back surface of the metal substrate.

5. The method of claim 4, wherein forming the third photoresist film further comprises forming a fourth photoresist film on top of the metal substrate comprising the encapsulation material to protect the metal substrate from being etched.

6. The method of claim 5, wherein etching the metal substrate further comprises: removing the third photoresist film and the fourth photoresist film after the metal substrate is etched.

7. The method of claim 1, further comprising: filling a sealant in peripheral areas of the I/O pads and in areas between the I/O pads on the back surface of the metal substrate.

8. The method of claim 1, wherein attaching the die further comprises:
attaching the die in the predetermined region on the top surface of the metal substrate using an adhesive material.

9. The method of claim 1, further comprising: forming an inner die pad, wherein the die is attached to the inner die pad by an adhesive material.

10. The method of claim 1, wherein:
the plurality of I/O pads is arranged in a single-ring configuration; and
the plurality of inner leads is also arranged in a corresponding single-ring configuration.

11. The method of claim 1, wherein:
the plurality I/O pads is arranged in a multi-ring configuration; and
the plurality of inner leads is also arranged in a corresponding multi-ring configuration.

12. The method of claim 1, further comprising: one or more passive devices coupled between the plurality of inner leads by an adhesive material.

13. The method of claim 1, further comprising:
forming an outer electrostatic discharge ring based on the metal substrate;
forming an inner electrostatic discharge ring at a top surface of the outer electrostatic discharge ring and between the die and the plurality of inner leads; and
connecting the inner electrostatic discharge ring and the die.

14. The method of claim 1, further comprising forming a plurality of inner die pads, wherein the at least one die includes a plurality of dies, and each of the at least one die is attached to a corresponding inner die pad of the plurality of inner die pads by an adhesive material.

15. The method of claim 1, wherein the bottom layer is nickel, the at least one middle layer comprises a copper layer, and the top layer is silver.

16. The method of claim 1, wherein the bottom layer is nickel; the at least one middle layer comprises from bottom to the top: a copper layer, a nickel layer, and a palladium layer; and the top layer is silver.

* * * * *